(12) United States Patent
Satoh et al.

(10) Patent No.: US 7,485,238 B2
(45) Date of Patent: Feb. 3, 2009

(54) ETCHING METHOD, ETCHED PRODUCT FORMED BY THE SAME, AND PIEZOELECTRIC VIBRATION DEVICE, METHOD FOR PRODUCING THE SAME

(75) Inventors: Syunsuke Satoh, Kakogawa (JP); Hozumi Nakata, Kakogawa (JP)

(73) Assignee: Daishinku Corporation, Hyogo (JP)

( * ) Notice: Subject to any disclaimer, the term of this patent is extended or adjusted under 35 U.S.C. 154(b) by 245 days.

(21) Appl. No.: 11/115,153

(22) Filed: Apr. 27, 2005

(65) Prior Publication Data
US 2005/0194352 A1     Sep. 8, 2005

Related U.S. Application Data

(62) Division of application No. 10/229,169, filed on Aug. 28, 2002, now Pat. No. 6,939,475.

(30) Foreign Application Priority Data

| Aug. 31, 2001 | (JP) | ............................ 2001-264698 |
| Sep. 19, 2001 | (JP) | ............................ 2001-285166 |
| Apr. 3, 2002 | (JP) | ............................ 2002-100887 |
| Jul. 2, 2002 | (JP) | ............................ 2002-193740 |
| Jul. 2, 2002 | (JP) | ............................ 2002-193741 |

(51) Int. Cl.
*B44C 1/22* (2006.01)
*C03C 15/00* (2006.01)
*C03C 25/68* (2006.01)
*C23F 1/00* (2006.01)

(52) U.S. Cl. .......................................... 216/41; 438/753
(58) Field of Classification Search .................. 216/41, 216/47; 438/753
See application file for complete search history.

(56) References Cited

U.S. PATENT DOCUMENTS

| 4,021,276 A | 5/1977 | Cho et al. |
| 4,473,434 A | 9/1984 | Poler |
| 4,981,552 A | 1/1991 | Mikkor |
| 5,420,067 A | 5/1995 | Hsu |

(Continued)

FOREIGN PATENT DOCUMENTS

JP           57095633 A   *   6/1982

(Continued)

*Primary Examiner*—Roberts Culbert
(74) *Attorney, Agent, or Firm*—Wenderoth, Lind & Ponack, L.L.P.

(57) ABSTRACT

In a state in which respective portions of a quartz wafer have been masked by a plurality of kinds of mask layers that have respectively different etching rates, the quartz wafer is subjected to an etching process. Since the etching operation is started earlier at a first portion which is masked by the mask layer having a high etching rate, the amount of etching is increased at the first portion. In contrast, the start of the etching operation is delayed at a second portion which is masked by the mask layer having a low etching rate, and the amount of etching is reduced at the second portion. Thus, it becomes possible to form the quartz wafer into a desired shape.

2 Claims, 42 Drawing Sheets

U.S. PATENT DOCUMENTS

| | | |
|---|---|---|
| 5,449,903 A | 9/1995 | Arney et al. |
| 5,738,757 A | 4/1998 | Burns et al. |
| 6,051,866 A | 4/2000 | Shaw et al. |
| 6,136,243 A | 10/2000 | Mehregany et al. |
| 6,458,494 B2 | 10/2002 | Song et al. |
| 6,534,225 B2 | 3/2003 | Flanders et al. |
| 6,636,386 B1 | 10/2003 | Boutaghou |
| 2004/0074301 A1 | 4/2004 | Kuisma et al. |

FOREIGN PATENT DOCUMENTS

| | | | |
|---|---|---|---|
| JP | 62-065333 | | 3/1987 |
| JP | 2057009 | | 2/1990 |
| JP | 04-354332 | | 12/1992 |
| JP | 05062964 A | * | 3/1993 |
| JP | 5-315881 | | 11/1993 |
| JP | 07-058345 | | 3/1995 |
| JP | 08186458 A | * | 7/1996 |
| JP | 08228122 A | * | 9/1996 |
| JP | 10-294631 | | 11/1998 |
| JP | 10-308645 | | 11/1998 |
| JP | 11134703 | * | 5/1999 |
| JP | 2000004138 A | * | 1/2000 |
| JP | 2000-341064 | | 12/2000 |
| JP | 2001-156584 | | 6/2001 |
| JP | 2002-76806 | | 3/2002 |
| WO | 98/38736 | | 9/1998 |

\* cited by examiner

Fig.35
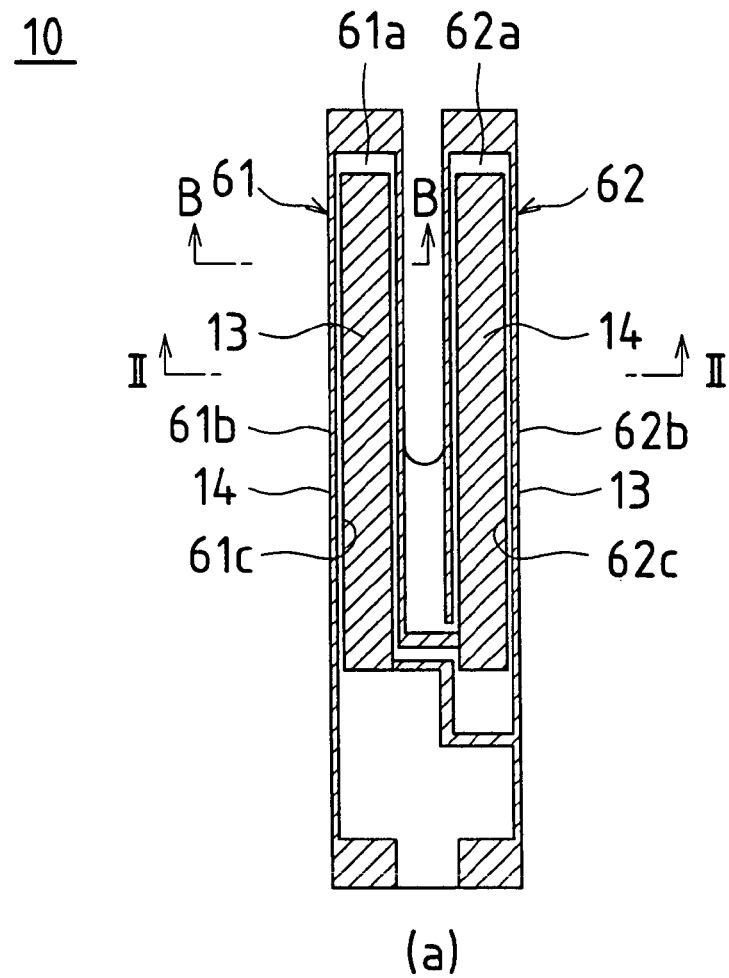
(a)
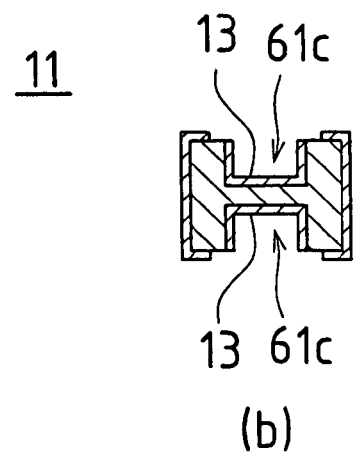
(b)

Fig.41
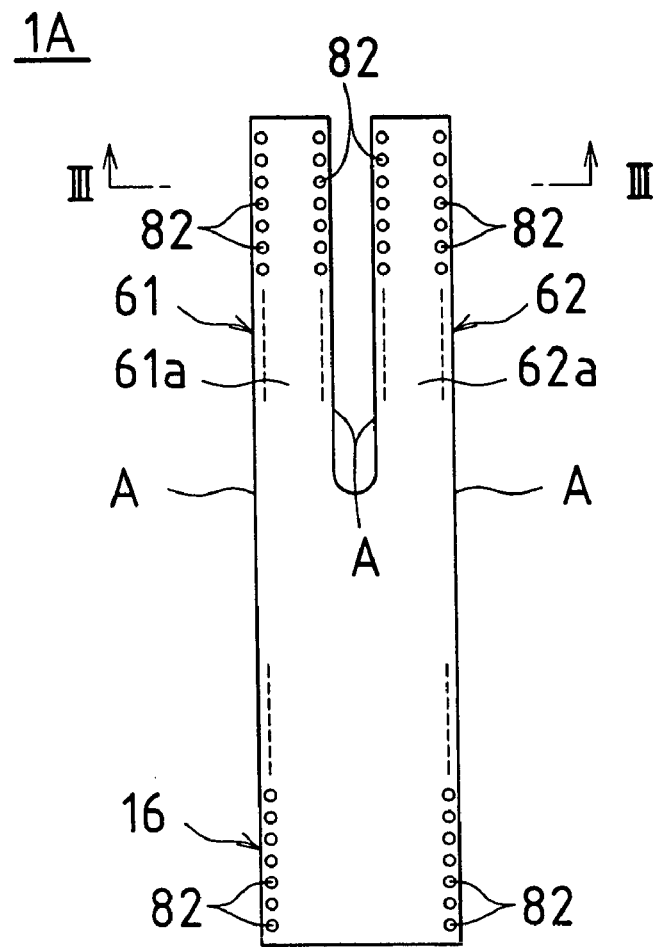
(a)
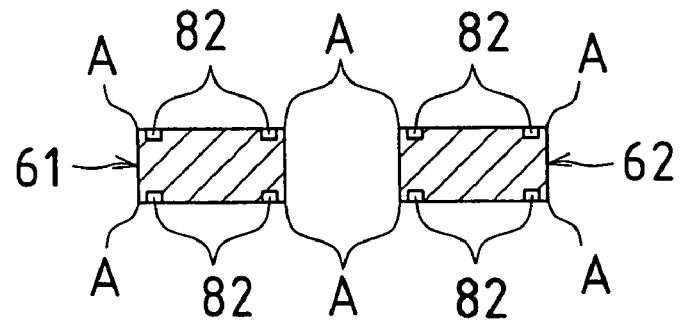
(b)

Fig.42
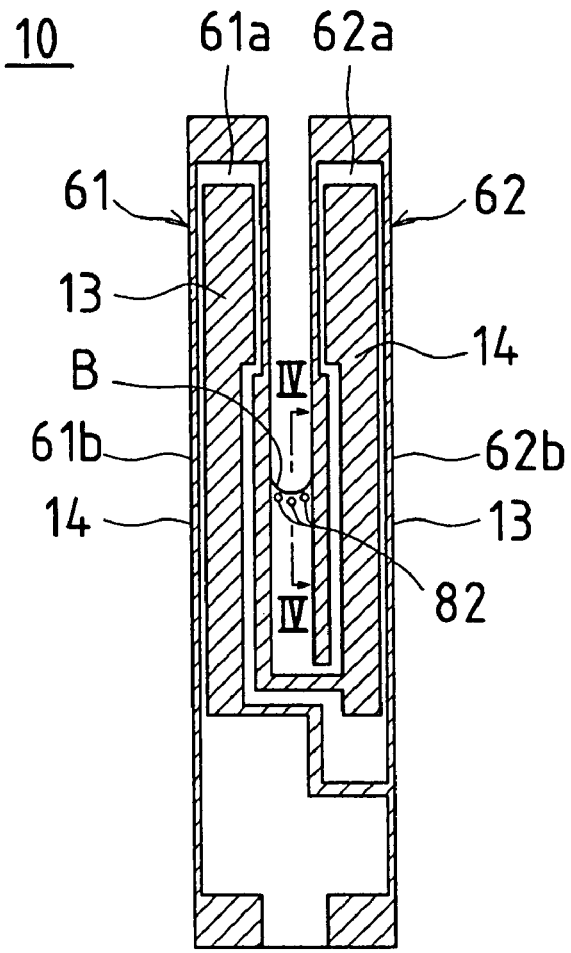
(a)
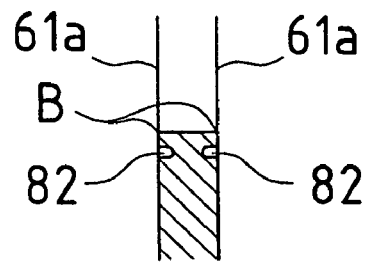
(b)

Fig.43
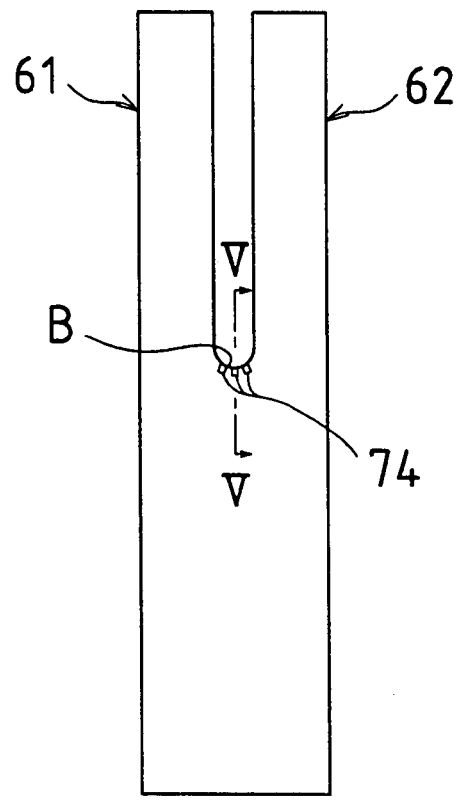
(a)
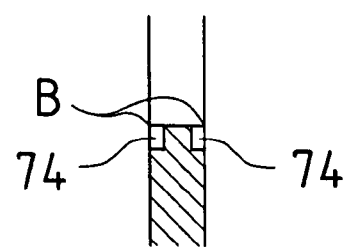
(b)

Fig.44    <u>1A</u>
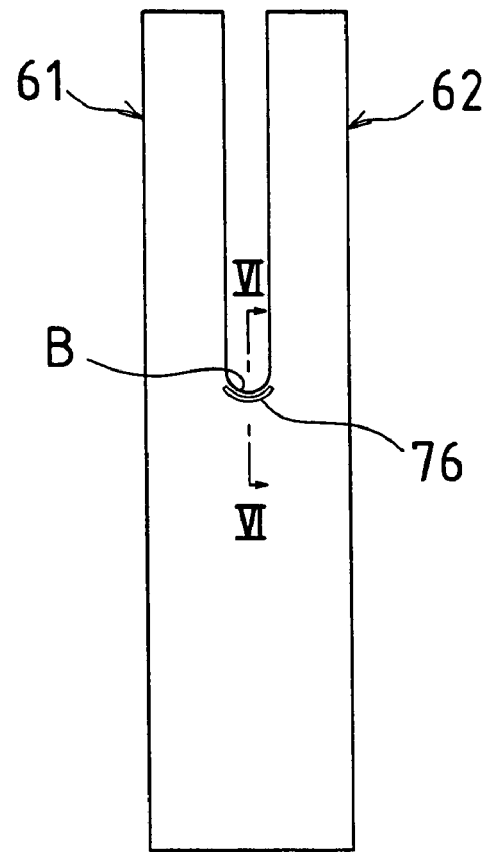
(a)
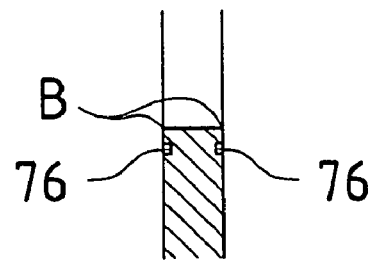
(b)

(a)  (b)

(a)  (b)

Prior Art

Fig.52
Prior Art
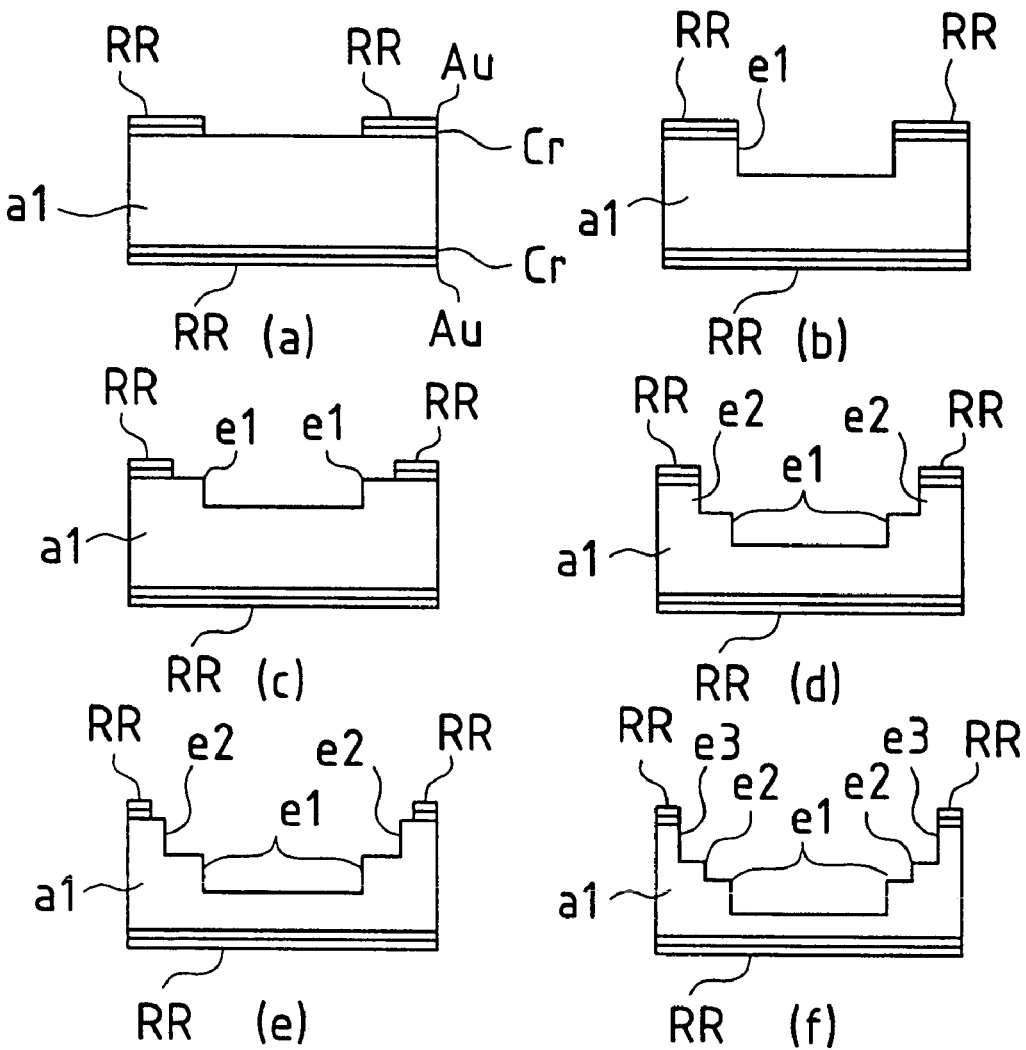
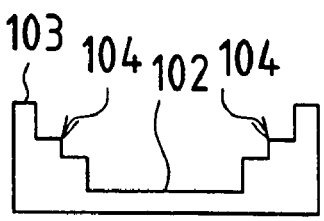

Fig.53
Prior Art
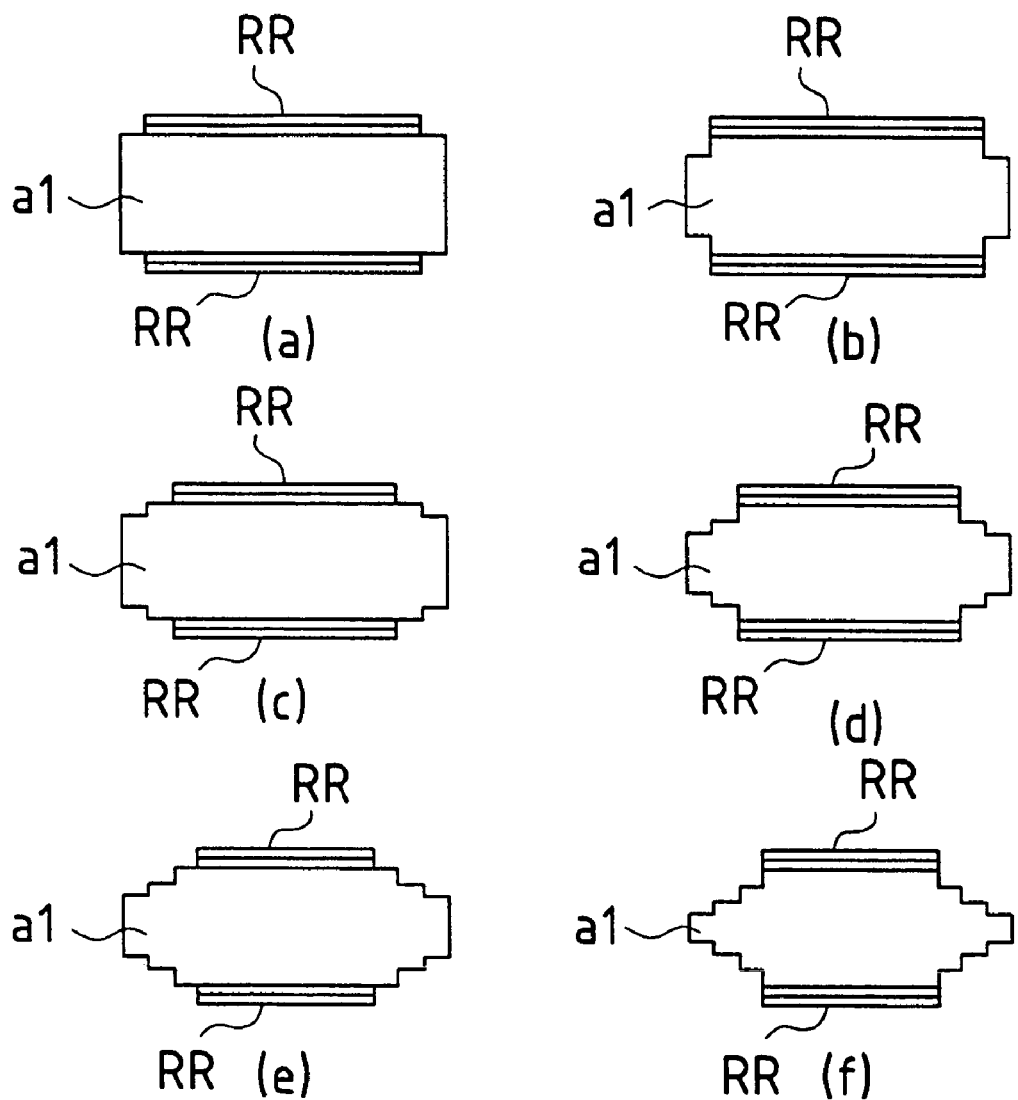
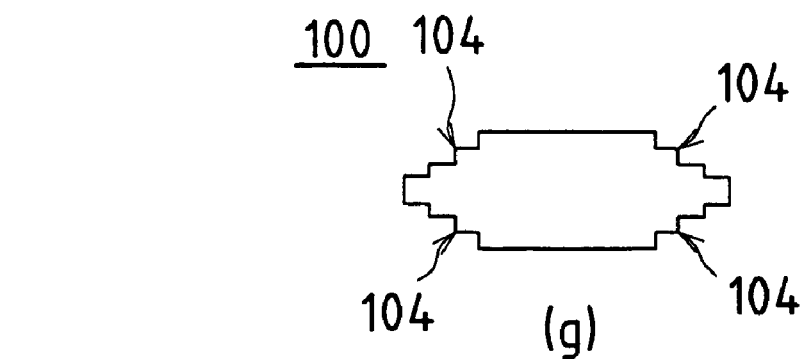

Fig.55
Prior Art
(a) 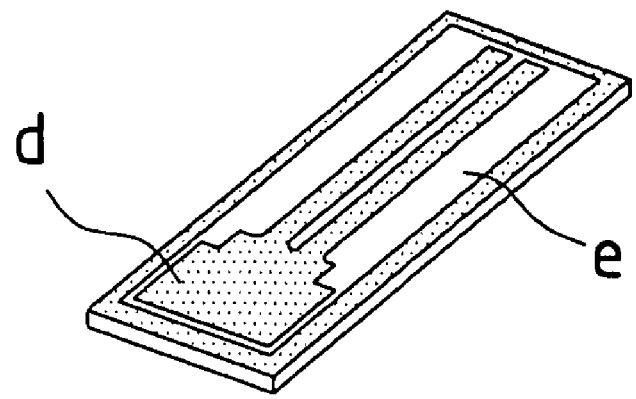
(b) 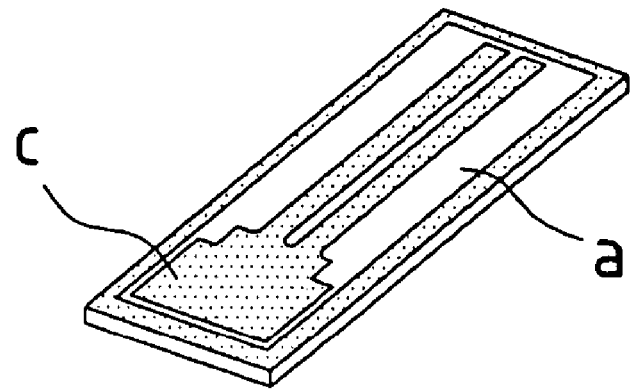

ETCHING METHOD, ETCHED PRODUCT FORMED BY THE SAME, AND PIEZOELECTRIC VIBRATION DEVICE, METHOD FOR PRODUCING THE SAME

This is a divisional application of U.S. application Ser. No. 10/229,169, filed Aug. 28, 2002, now U.S. Pat. No. 6,939,475, issued on Sep. 6, 2005.

BACKGROUND OF THE INVENTION

1. Field of the Invention

The present invention relates to an etching method and an etched product, such as a quartz wafer, that is formed by the etching method. More specifically, the present invention concerns a method for providing a highly efficient forming process and for producing a high-quality formed product.

2. Description of the Related Art

Along with the developments of communication apparatuses having higher frequencies and microcomputers having higher operation frequencies, there have been ever-increasing demands for piezoelectric vibration devices such as quartz resonators and quartz filters having high frequencies. In general, with respect to quartz wafers (quartz plates) that have achieved high frequencies, the thickness sliding vibration of an AT-cut quartz plate has been often utilized. Further, as is well-known, the frequency is determined by the thickness, and the frequency is inversely proportional to the thickness. For example, in an attempt to obtain 600 MHz as a basic vibration frequency, it is necessary to provide an ultra-thin piezoelectric vibration plate having a thickness of not more than 3 µm. With respect to a machining process of such an ultra-thin plate, a difficult polishing process is required, making it difficult to improve the production yield.

In order to solve these problems, a so-called reversed mesa structure has been proposed, in which, as shown in FIG. 51, a recessed section 101 is formed in the center portion of a quartz wafer 100, a vibration area 102 that has been machined into a thin shape is placed on the bottom of this recessed section 101, and the vibration area 102 is reinforced by a thick reinforcing portion 103 that is formed on the periphery thereof. The quartz vibration plate of this type has a structure in which the quartz wafer 100 having the thin vibration area 102 and the reinforcing portion 103 formed on the periphery thereof is provided with an exciter electrode and a drawing electrode (not shown). The application of this structure makes the vibration area 102 considerably thinner than that of a conventional vibration area, and also increases the yield. The quartz wafer of this type is disclosed in, for example, Japanese Patent Application Laid-open No. 2000-341064.

Moreover, with respect to one type of the quartz vibration plate 1 of this reversed mesa structure, another structure has been well-known, in which, as shown in a cross-sectional view of FIG. 52(g), a step portion 104 having a step shape is formed between the vibration area 102 and the reinforcing portion 103 so that the mechanical strength of the quartz wafer 100 is improved and it is possible to prevent an external force from transmitting to the vibration area 102. The following description will discuss forming operations of the reversed mesa type quartz vibration plate having this step portion 104.

As shown in FIG. 52(a) (a drawing that shows cross-sections of a quartz wafer and a mask layer), on a quartz wafer a1 having upper and lower faces that have been formed into mirror faces through a polishing process, mask layers (resist film) RR are formed over the entire lower face and over one portion of the upper face. These mask layers RR have a two-layer structure of, for example, chromium (Cr) and gold (Au). Moreover, the formation area of the mask layer RR on the upper face covers the entire area except for a portion in which the above-mentioned vibration area 102 is to be formed. More specifically, the mask layer RR is formed over the entire upper face of the quartz wafer a1, and the mask layer RR which is located on a position corresponding to the vibration area 102 is selectively removed through a photolithography technique, etc. Further, the quartz wafer a1 is immersed into an etching solution, such as hydrofluoric acid+ammonium fluoride, with the mask layer RR which is left on the quartz wafer a1 being used as a mask; thus, a first wet etching process is carried out. FIG. 52(b) shows a state in which this first wet etching process has been completed. Thus, the first step portion e1 is formed.

Next, one portion of the remaining mask layer RR is further removed selectively. As shown in FIG. 52(c), this removal area of the mask layer RR corresponds to an area on which a step portion e2 is to be formed as a second step. Thereafter, a second etching process is carried out by an etching solution in the same manner as described above. FIG. 52(d) shows a state in which the second wet etching process has been completed. Thus, the second step portion e2 is formed.

Moreover, one portion of the remaining mask layer RR is selectively removed. As shown in FIG. 52(e), this removal area of the mask layer RR corresponds to an area on which a step portion e3 is to be formed as a third step. Thereafter, a third etching process is carried out by an etching solution in the same manner as described above. FIG. 52(f) shows a state in which the third wet etching process has been completed. Thus, the third step portion e3 is formed.

In this manner, after having been subjected to a plurality of etching processes, all the mask layers RR on the upper and lower faces are removed so that, as shown in FIG. 52(g), a quartz wafer 100, which has a step portion 104 having a step shape between the vibration area 102 and the reinforcing portion 103, is formed. Then, predetermined electrodes are formed on the upper and lower faces of the vibration area 102 so that a quartz resonator is manufactured.

Moreover, as shown in FIG. 53(g), a quartz wafer of the so-called mesa type, which has a quartz wafer 100 having a thickness dimension in the center portion which is greater than the thickness dimension of the peripheral edge portion, is also formed through virtually the same etching method as described above. In other words, as shown in FIG. 53(a), on a quartz wafer a1 having upper and lower faces that have been formed into mirror faces through a polishing process, mask layers RR are formed over only the portions of upper and lower faces except for the peripheral edges thereof. Further, the quartz wafer a1 is immersed into an etching solution, such as hydrofluoric acid+ammonium fluoride, with the mask layer RR serving as a mask; thus, a first wet etching process is carried out. FIG. 53(b) shows a state in which this first wet etching process has been completed.

Next, as shown in FIG. 53(c), outer edge portions of the remaining mask layers RR are removed. Then, the second wet etching process is carried out in the same manner as described above by using an etching solution. FIG. 53(d) shows a state in which the second wet etching process has been completed.

Moreover, as shown in FIG. 53(e), the outer edge portions of the remaining mask layers RR are removed. Thereafter, a third etching process is carried out by an etching solution in the same manner as described above. FIG. 53(f) shows a state in which the third wet etching process has been completed.

In this manner, after having been subjected to a plurality of etching processes, all the mask layers on the upper and lower faces are removed so that, as shown in FIG. 53(g), a quartz wafer 100 is formed in which the thickness dimension of the center portion of the quartz wafer 100 is set to be greater than the thickness dimension of the outer edge portion thereof with a step portion 104 having a step shape being placed between the center portion and the outer edge portion.

However, in the above-mentioned quartz wafer forming operations, a plurality of etching processes are required, and an immersing process of the quartz wafer into the etching solution and a drying process of this quartz wafer need to be repeated a plurality of times. For this reason, complex jobs are required, while the working time is prolonged, and repeated immersing processes and drying processes might cause surface roughness on the quartz wafer.

One of the reasons for this surface roughness is that dust or the like adheres to the surface of the vibration area in the above-mentioned drying process and that the sequence proceeds to the immersing process with the dust or the like still adhering thereto. In the event of such surface roughness, adverse effects (such as deviations in the reference frequency) might be given to the performance of the quartz resonator, especially, to that of the reversed mesa type. Moreover, in the immersing process after the drying process, air might remain in the vicinity of the step portion that has been formed, and in such a case, the etching solution is not allowed to reach the vicinity of the step portion, thereby resulting in an etching failure and the subsequent failure of not forming a quartz wafer into a predetermined shape. Moreover, at the final stage of a plurality of immersing processes, the quartz wafer tends to have a portion whose thickness is considerably thin, where, as a result, damages such as cracking occur at this thin portion and the peripheral portion thereof in the immersing process and the drying process, thereby causing degradation in the yield.

Moreover, the above-mentioned problem of surface roughness and degradation in the yield might occur not only in quartz wafers, but also in glass, metal, semiconductors and the like when these materials are subjected to similar etching processes.

Furthermore, tuning-fork type quartz resonators, which can be easily miniaturized, have been conventionally known as one type of piezoelectric vibration device. For example, as has been disclosed in Japanese Patent Application Laid-open No. H10-294631, the resonator of this type is provided with a tuning-fork-type quartz vibration member having an arrangement in which a quartz wafer, which is formed into a tuning-fork shape through an etching process, is provided with predetermined electrodes that are formed on the surface thereof through a photolithographic technique.

Japanese Patent Application Laid-open No. 2002-76806 has disclosed an arrangement in which grooves are formed in center portions of the surface and rear surface (main faces) of each of the leg portions of the tuning-fork-type quartz vibration member. This structure having grooves on the surface and rear surface of each of the leg portions is effective since it is possible to reduce the vibration loss in each leg portion even when the vibration member is miniaturized, and to suppress the CI (crystal impedance) value to a low level. The tuning-fork-type quartz resonator of this type is well suited for use in precision instruments such as watches.

The following description will discuss processes which are disclosed in the above-mentioned official gazette as a method of forming a tuning-fork-type quartz wafer that is provided with grooves on the surface and rear surface of the above-mentioned leg portions.

First, as shown in FIG. 54(a), a quartz substrate a, which is a quartz plate, is machined into a plate shape. In this case, the surface and rear surface of the quartz substrate a are polished into mirror surfaces.

Next, as shown in FIG. 54(b), a Cr (chromium) film b1 is vapor-deposited on the surface and rear surface of the quartz plate a, and an Au (gold) film b2 is further vapor-deposited thereon by using a sputtering device (not shown). Further, as shown in FIG. 54(c), photoresist layers c are formed on the surfaces of the metal films b1, b2 thus formed.

The photoresist layer c is partially removed so that a vibration member forming area d that is coincident with a shape (tuning-fork shape) of a tuning-fork-shape quartz wafer to be formed and frame portions e that are outer edges of the quartz substrate a are formed; thus, an outer-shape patterning process is carried out. FIG. 54(d) shows a cross-section in this state, and FIG. 55(a) shows a perspective view thereof. As shown in FIG. 55(a), in this state, the photoresist layers c are formed in such a manner so that the predetermined shape of the tuning-fork-type quartz wafer appears thereon.

Thereafter, as shown in FIG. 54(e), respective metal films b1, b2, which correspond to portions at which no photoresist layer c is formed in FIG. 54(d), are removed by an Au etching solution and a Cr etching solution. Therefore, as shown in FIG. 55(b), the quartz substrate a is exposed to the portions from which the respective metal films b1, b2 have been removed.

Next, as shown in FIG. 54(f), all the photoresist layers c remaining as shown in FIG. 54(e) are removed.

Thereafter, as shown in FIG. 54(g), photoresist layers f are formed over the entire surface and rear surface of the quartz substrate a.

Further, as shown in FIG. 54(h), one portion of each photoresist layer f is removed. More specifically, a groove patterning process is carried out so that not only the photoresist layers f corresponding to portions other than the vibration member forming area d and the frame portion e, but also the portions of the photoresist layers f corresponding to grooves g (FIG. 54(l)), are removed.

Next, as shown in FIG. 54(i), an outer-shape etching process is carried out by using a quartz etching solution. In other words, the outer-shape etching process is carried out with only the vibration member forming area d and the frame portion e which are left.

Successively, as shown in FIG. 54(j), portions of the respective metal films b1, b2 that correspond to the grooves g to be formed on the leg portions of the tuning-fork-shape quartz wafer are removed by an Au etching solution and a Cr etching solution.

Moreover, as shown in FIG. 54(k), the quartz substrate a is etched to a predetermined depth by a quartz etching solution so that grooves g are formed on the respective faces of each leg portion with its cross-section having a virtually H-letter shape. Then, the photoresist layer f and the respective metal films b1, b2 are removed so that a tuning-fork-type quartz wafer h having leg portions is formed in which each of the leg portions has a cross-section having a virtually H-letter shape as shown in FIG. 54(l).

With respect to the tuning-fork-type quartz wafer h formed as described above, predetermined electrodes are formed on the upper and lower faces of the vibration area so that a tuning-fork-type quartz vibration member is manufactured, and this tuning-fork-type quartz vibration member is attached to a package so that a tuning-fork-type quartz resonator is completed.

In the forming method disclosed by the above-mentioned official gazette, after the outer-shape etching process (process of FIG. 54(*i*)) for removing an area which is located outside of the outer edge of a tuning-fork-type quartz wafer h to be formed has been first carried out, the groove etching process (process of FIG. 54(*k*)) for forming grooves g on the main faces of each leg portion is carried out. In other words, the outer-shape forming process and the groove forming process of the quartz wafer h are carried out through individually separated processes.

For this reason, this conventional technique requires an increased number of processing operations, which results in problems of complex processing operations and prolonged processing time. Moreover, etching processes using the quartz etching solution are carried out in the respective outer-shape forming process and groove forming process. Therefore, at least the quartz etching processes of two times need to be carried out, and as a result, that problems such as surface roughness of the quartz wafer might occur.

In the case when the grooves are formed on the surface and rear surface of each leg portion by using the method disclosed in the above-mentioned gazette, extremely high processing precision is required for these grooves. This is because the structure having the above-mentioned grooves tends to have greater deviations in the vibration frequency in comparison with those having no grooves. In order to reduce these deviations, one of the effective methods is to carry out the processing of these grooves with high precision.

Moreover, the structure in which these grooves are formed makes it possible to reduce the CI value to a low level, and in order to effectively reduce the CI value, it is necessary to carry out the processing of the grooves with high precision.

The present invention has been devised to solve the above-mentioned problems with the conventional technique, and its first objective is to provide an etching method which can form a quartz wafer having a predetermined shape (for example, a shape having the above-mentioned step portion) by using only one etching process so that it is possible to prevent surface roughness of the quartz wafer, etching failure and damages to a thin portion and the peripheral portion thereof, and also to improve the processing precision of the etched product, as well as forming such an etched product.

Moreover, the above-mentioned quartz wafer is housed in a package which is made from ceramics such as alumina, and is secured to the inside of the package by a bonding agent. In other words, drawing electrodes are bonded to terminals inside the package by a conductive bonding agent so that the quartz wafer is connected to the package electrically as well as mechanically. Thus, a quartz resonator of, for example, a surface packaging type is manufactured.

In this case, since the above-mentioned quartz wafer of the reversed mesa type or the flat-plate-shape quartz wafer of the thin-film type is secured into the package, the vibration area of the quartz wafer is subjected to the influences of stress which is exerted through curing shrinkage of the bonding agent. This causes variations in the resonance frequency of the quartz wafer, thereby resulting in a high possibility of failure in obtaining predetermined frequency characteristics. Moreover, there is a high possibility that an external force, which is applied from the outside of the package, is directly exerted on the vibration area of the quartz wafer, and this case also causes a high possibility of failure in obtaining predetermined frequency characteristics.

Moreover, when an attempt is made to secure the quartz wafer into the package in a manner so as to not receive the influences of curing shrinkage of the bonding agent, the bonding agent needs to be applied to a position that makes the quartz wafer less susceptible to the influences of curing shrinkage with high precision, and this requires a manufacturing device with high performances, which results in high costs and complex manufacturing processes and the subsequent degradation in the processing efficiency.

The present invention has been devised to solve these problems, and its second objective is to provide an etching method which makes it possible to prevent influences, etc. of curing shrinkage of a bonding agent at the time of securing the piezoelectric vibration device to the package through the bonding agent from reaching the vibration area, and consequently to obtain preferable frequency characteristics of the piezoelectric vibration device, and an etched product which is obtained through such a method.

Moreover, conventionally, a tuning-fork-type quartz resonator which can be easily miniaturized has been known as one type of a piezoelectric vibration device. For example, as disclosed in Japanese Patent Application Laid-open No. H10-294631, the resonator of this type is provided with a tuning-fork-type quartz vibration member having an arrangement in which a quartz wafer, which is formed into a tuning-fork shape through an etching process, is provided with predetermined electrodes that are formed on the surface thereof through a photolithographic technique. The following description will discuss the forming processes of these electrodes.

FIG. 39 is a front view that shows a generally-used tuning-fork-type quartz vibration member 10, and electrode-forming portions are indicated by slanting lines. FIG. 40 is a drawing that shows processes in which electrodes 73, 74 are formed on the surface of a quartz wafer 1A through the photolithographic technique, and is a cross-sectional view taken along line II-II of FIG. 39.

In the processes of forming the electrodes 73, 74, first, with respect to a quartz wafer 1A (FIG. 40(*a*)) which is formed into the above-mentioned tuning-fork shape, an electrode film 15, which is made of a material such as chromium or gold, is formed on the entire surface of the quartz wafer 1A through a vacuum vapor deposition method or the like (FIG. 40(*b*)). Then, the entire surface of the quartz wafer 1A is coated with a resist film 31 which is made from a positive-working-type photoresist solution (FIG. 40(*c*)). This resist film 31 is subjected to predetermined exposing and developing processes so that opening sections 75 are formed on the resist film 31 at areas to be etched to form electrode films 15 (FIG. 40(*d*)). The electrode films 15 which are exposed to these opening sections 75 are etched so that the electrode film 15 (FIG. 40(*e*)) is partially removed, and the above-mentioned resist film 31 is then removed (FIG. 40(*f*)). Thus, electrodes 73, 74 are formed on only predetermined areas on the quartz wafer 1A so that a tuning-fork-type quartz vibration member 10 is obtained.

With respect to the electrode forming areas of the tuning-fork-type liquid crystal vibration member 10 thus formed, as shown in FIG. 39 and FIG. 40(*f*), a continuous area, which is formed over the two faces that are adjacent to (orthogonal) each other through respective edge portions of the quartz wafer 1A, is prepared. This arrangement is made so that an electrode 73 (74) of the main face 61*a* (62*a*) in one of the leg portions 61 (62) is connected to an electrode 73 (74) of the side face 62*b* (61*b*) in the other leg portion 62 (61) so as to conduct to each other. For this reason, with respect to the piezoelectric vibration device of this type, it is very important to ensure the continuity of electrodes 73, 73 (74, 74) of the respective edge portions.

However, the above-mentioned processes of forming the electrodes have the following problem. FIG. 56, which corresponds to FIG. 40, is a drawing that explains the problem. In general, in the case when the entire surface of the quartz wafer 1A is coated with a resist film 31 as shown in FIG. 56(c), the quartz wafer 1A is immersed into a resist solution vessel, or the resist solution is applied onto the quartz wafer 1A by using a spray. In this case, surface tension is exerted on the resist solution which is applied on each of the faces of the quartz wafer 1A so that the resist solution is drawn in directions that are indicated by arrows of broken lines as shown in FIG. 56(c). In other words, the resist solution is allowed to easily flow in directions departing from the edge portions. For this reason, the amount of application of the resist solution becomes insufficient at the edge portions, and in some cases, no resist solution exists on the periphery of an edge portion. FIG. 57 shows a front view of the quartz wafer 1A in a state where no resist solution (indicated by an imaginary line in the drawing) exists at an edge portion due to the influences of the surface tension.

In the case when the above-mentioned exposing and developing processes and etching processes of the electrode film 15 are carried out in the state in which no resist solution is located on the periphery of an edge portion, as shown in FIGS. 56(e) and 56(f), not only is the electrode film 15 that is exposed to the opening sections 75 removed, but the electrode film 15 on the periphery of the edge is also removed, with the result being that it is not possible to ensure the continuity of the electrodes 73, 74 at the edge portion, and consequently, a defective quartz vibration member 1 is produced.

In order to solve this problem, a method has been proposed in which the amount of application of the resist solution to the quartz wafer 1A is increased.

However, even with this method, it is not possible to avoid the generation of the above-mentioned surface tension. For this reason, although the resist film 31 having a certain degree of film thickness is allowed to exist on the periphery of the edge, the film thickness of the resist film 31 becomes unnecessarily great in the other portions. This causes an insufficient amount of exposing energy to these portions having the great film thickness, which results in a failure to sufficiently carry out exposing and developing processes on these portions. Consequently, the resist film 31 partially remains at areas (areas in which the above-mentioned opening sections 75 are to be formed) from which the resist film 31 needs to be removed, which results in a possibility that etching is not carried out at necessary portions of the electrode film 15.

Moreover, another method has been proposed in which the amount of exposure to the portions of the resist film 31 having a great film thickness is set to a greater value so as to not leave unnecessary resist film 31. However, this method causes degradation in the patterning precision, which results in a failure to miniaturize the resonator.

The present invention has been devised to solve this problem, and its third objective is to solve the problem caused by the surface tension which is exerted in the resist solution that is applied to the respective surfaces of the quartz wafer (piezoelectric vibration substrate), to reduce the rate of generation of defective products and, consequently, to improve the productivity of the piezoelectric vibration device.

SUMMARY OF THE INVENTION

In order to achieve the above-mentioned objectives, the present invention relates to a method of forming a work piece such as a quartz wafer into a predetermined shape through etching, and the present invention provides an arrangement in which a plurality of mask layers having respectively different etching rates are used so that the amounts of etching are made different depending on the respective portions.

More specifically, the present invention relates to an etching method for etching a work piece into a predetermined shape. In this etching method, in a state in which respective portions of the work piece have been masked by a plurality of kinds of mask layers having mutually different etching rates, the work piece is etched so that the work piece is etched to a predetermined shape with etching amounts of respective portions of the work piece being made to be mutually different depending on the degrees of the etching rates of the respective mask layers.

With respect to the plurality of kinds of mask layers having mutually different etching rates, those mask layers which are made of different materials, those mask layers having different thicknesses, those mask layers having different surface treatments and those mask layers having different film-forming operations are adopted. In accordance with the present invention, a first portion which is masked by a mask layer having a high etching rate (a mask layer that is easily dissolved in etching solution) is subjected to an etching process that is started earlier so that the etching amount becomes greater, while a second portion which is masked by a mask layer having a low etching rate (a mask layer that is hardly soluble in etching solution) is delayed in the start of the etching process so that the etching amount becomes smaller. In this manner, by utilizing the difference in etching amount caused by the difference in mask layers, the work piece is formed into a desired shape so that the forming process of the above-mentioned step portion can be carried out efficiently with high precision.

In other words, the method of the present invention makes it possible to provide an etched product having a predetermined shape by using an etching process of one time, i.e., etching processes not performed a plurality of times. Therefore, it is possible to avoid the conventional problem of surface roughness due to the necessity of immersing processes to etching solution and drying processes that are repeated a plurality of times. Moreover, it is possible to prevent insufficient etching solution to reach necessary portions due to the existence of air in the vicinity of the above-mentioned step portion caused by these repeated processes, and consequently, it is possible to eliminate one of the causes of etching failure. Moreover, since it is not necessary to repeat immersing processes and drying processes with the etched product being made thinner by the etching process, it is possible to prevent damages to the etched product, and consequently, it is possible to improve the yield of the product.

With respect to examples of specific applications of the mask layers, the following applications are proposed. First, mask layers which are made of a material having a high etching rate are applied to portions of a work piece requiring a high etching amount, and, in contrast, mask layers which are made of a material having a low etching rate are applied to portions of the work piece only requiring a low etching amount. Here, the material having a high etching rate refers to a material that is easily dissolved in an etching solution. In contrast, the material having a low etching rate refers to a material that is hardly soluble in an etching solution. Although it depends on the kind of etching solutions, for example, when a solution of hydrofluoric acid+ammonium fluoride or the like is used as the etching solution and when Cr and Ni having electroless plating are used as mask layers, Cr forms a material having a lower etching rate than Ni.

Moreover, mask layers that mask respective portions of the work piece may be made from the same material, and the thickness dimension of the mask layers which are placed at portions of the work piece requiring a greater etching amount may be set to be smaller than the thickness dimension of the mask layers which are placed at portions of the work piece requiring only a smaller etching amount.

Furthermore, in the case when mask layers that mask respective portions of the work piece are made from the same material, the constituent material of the mask layers which are placed at portions of the work piece requiring only a smaller etching amount may be subjected to an etching rate reducing process. With respect to the process in this case, for example, an oxidizing process is carried out, or after the entire surface of the mask layer has been subjected to an oxidizing process, the constituent material of the mask layer at portions of the work piece requiring a greater etching amount is subjected to a reducing process so that the etching rate at these portions is increased.

In the case when the thickness dimension of the mask layers is made to be different or when the mask layers are subjected to respective treatments, for example, even if a mask layer having an extremely low etching rate is required, no limitation is imposed on the selection of materials constituting the mask layers. For example, Au has been known as a constituent material for a mask layer (resist film) having an extremely low etching rate, and in accordance with the present invention, it is possible to obtain a mask layer having an extremely low etching rate without using expensive Au by increasing the thickness dimension of mask layers or carrying out a process for decreasing the etching rate. Thus, it becomes possible to cut the manufacturing costs of the etched product.

Moreover, after having carried out etching processes on respective portions of the work piece by respectively different etching amounts depending on the respective degrees of the etching rate of the mask layers, virtually the entire portion of the work piece is uniformly etched without the mask layers so as to carry out a thinning process so that the work piece is made increasingly thinner. In particular, when this method is applied to a piezoelectric vibration device such as a quartz resonator and a quartz filter, it becomes possible to provide higher frequencies.

Moreover, with the surface and rear surface of a work piece being masked with mask layers having respectively different etching rates, this work piece is subjected to an etching process so that the etching amount on the surface side of the work piece is made to be mutually different from the etching amount on the rear surface side in accordance with the degrees of the etching rates of the respective mask layers. For example, when the work piece prior to an etching process has been subjected to a polishing process, process distortion layers having a certain degree of thickness exist on its surface and rear surface. In the case when the process distortion layer on one of the upper (front) surface and rear surface sides is thicker, even if the same etching process is carried out on both of the surface and rear surface, there is a possibility that the process distortion layer on this side can not be completely removed. In contrast, in accordance with the present invention, the etching amount on the side having a thicker process distortion layer is set to be particularly greater. Thus, it becomes possible to completely remove the process distortion layers on the respective surface and rear surface layers while limiting the etching amount of the entire work piece to the minimum value which is required.

Furthermore, with respect to methods for forming the etched product into a desired shape, the following method is proposed. Prior to an etching operation for forming the work piece into a predetermined shape, a process for thinning one portion of the work piece is carried out, and the above-mentioned etching operation is carried out without masking this thinned portion by a mask layer so that this thinned portion is formed as a through hole.

In accordance with this arrangement, a desired irregular shape is formed on the surface of the work piece by utilizing differences in the etching rate of the mask layer, and a forming process, which forms a through hole in a specific portion as a result of the progress of the etching operation, is also available.

With respect to the shape of an etched product which is formed by each of the etching methods, a reversed mesa type in which the thickness dimension in the center portion is set to a value which is smaller than the thickness dimension of the outer circumferential edge, a mesa type in which the thickness dimension in the center portion is set to a value which is greater than the thickness dimension of the outer circumferential edge and another type in which a step portion having a step shape is formed between the center portion and the outer circumferential edge in these reversed mesa type and mesa type are proposed. In particular, in the case when a step portion having a step shape is formed between the center portion and the outer circumferential edge in an etched product of the reversed mesa type, it is possible to improve the mechanical strength of the etched product and it is also possible to alleviate an external force that is transmitted to the center portion. Further, this arrangement is particularly suitable for a piezoelectric vibration device such as a quartz resonator and a quartz filter. Moreover, in the case when a step portion having a step shape is formed between the center portion and the outer circumferential edge in an etched product of the mesa type, it is possible to minimize the bonding between a thickness sliding mode and a thickness bending mode, and consequently, it is possible to improve the regulating effect on the bonding between the modes. Moreover, in this case, it is possible to desirably set the dimension of a side ratio of the vibration area and the dimension of the step difference, and consequently, it is possible to easily carry out the design for improving electric characteristics of the piezoelectric vibration device.

When these etched products are applied as a quartz wafer which is used for a piezoelectric vibration device, it becomes possible to manufacture an ultra-thin quartz wafer effectively with high precision, to further provide high frequencies, and, consequently, to provide a piezoelectric vibration device with high performances.

With respect to such a piezoelectric vibration device, an outer frame member having a frame shape is formed on the periphery of a center portion that forms a vibration area of the piezoelectric vibration device, and a structure for suppressing a stress transmission between this outer frame member and the vibration area is adopted so that it is possible to reduce the influence of the stress to the vibration area. Moreover, a structure for providing a high mechanical strength to the center portion forming the vibration area is also adopted.

More specifically, the center portion which is provided with the main vibration unit, the outer frame member having a frame shape, which is formed in a manner so as to surround the center portion with a predetermined distance to the outer edge of the center portion, and a connecting portion for partially connecting the center portion and the outer frame member are integrally formed by a piezoelectric material so as to constitute a piezoelectric vibration device. Here, the center portion of the piezoelectric vibration device is formed so as to have a mesa structure or a reversed mesa structure.

Since the center portion is formed so as to have the mesa structure or the reversed mesa structure with a consequently high mechanical strength, it is possible to reduce the influence of an external force or the like to the main vibration unit. Moreover, the outer frame member is connected to the peripheral portion of the center portion through the connecting portion. For this reason, it is possible to provide a bonding position to which a bonding agent is applied as the outer frame member of the piezoelectric vibration device. Thus, even when a stress occurs due to curing shrinkage of the bonding agent, the influence of this stress is stopped by the outer frame member and hardly reaches the main vibration unit in the center portion. Moreover, even when an external force is exerted on the outer frame member, this external force is hardly transmitted to the main vibration unit in the center portion. Consequently, it becomes possible to avoid a situation in which the resonance frequency of the piezoelectric vibration device is varied by the influence of the stress or the like, and consequently, it is possible to ensure desired frequency characteristics.

With respect to the detailed specific structures of the piezoelectric vibration device, the center portion is provided with a main vibration unit that is thin in thickness and formed in the center of the center portion, and an outer edge portion is formed on the periphery of this main vibration unit and is thicker than the main vibration unit. This arrangement makes it possible to provide double frame members, that is, an outer edge portion and an outer frame, on the periphery of the main vibration unit, and consequently, it is possible to obtain an extremely high mechanical strength. Moreover, a step portion having a step shape is formed between the main vibration unit and the outer circumferential portion. Therefore, even when a stress is exerted on the outer circumferential portion, it is possible to easily alleviate this stress by the step portion, and consequently, it is possible to avoid a local stress concentration. Furthermore, in this arrangement, when this step difference of the step portion is set to be a small value, it is possible to make the electrode film thinner while avoiding a disconnection (cut of the electrode film) of the drawing electrode in an arrangement in which a drawing electrode is formed along the surface of this step portion.

With respect to specific structures of the center portion, first, the thickness dimension of the center portion is set to be smaller than the thickness dimension of the outer frame member, and the respective upper and lower faces of the center portion are placed on the center side in the thickness direction from the respective upper and lower faces of the outer frame member. Alternatively, the thickness dimension of the center portion is set to be greater than the thickness dimension of the outer frame member, and the respective upper and lower faces of the center portion are placed outside of the respective upper and lower faces of the outer frame member in the thickness direction. In accordance with the former structure, when the piezoelectric vibration device is placed inside the package, only the outer frame member is made to be in contact with the inner face of the package with the center portion being in a floating state. Thus, it becomes possible to appropriately carry out the vibration of the main vibration unit. On the other hand, in accordance with the latter structure, for example, when a plurality of piezoelectric vibration devices are mutually superposed and installed in a package, the adjacent outer frames are mutually bonded to each other, and in such a case, by properly adjusting the height of this bonded area, it becomes possible to reduce the height dimension of the entire piezoelectric vibration devices to a minimum value required (minimize the height dimension to be as small as possible without the center portions being in contact with each other), and consequently, it becomes possible to miniaturize the package.

Moreover, an arrangement is made so that the connecting portion connects the center portion and the outer frame member at a position of "0" in the stress sensitivity in the center portion, and with this arrangement, even if an external force is exerted on the outer frame member and this force is transmitted to the center portion, it is possible to prevent the force from giving any adverse effects to the vibration characteristics of the main vibration unit.

With respect to the arrangement for preventing vibration wave transmission from the outer frame member to the center portion, for example, the following arrangements are proposed. First, in one of these methods, a discontinuous portion is interpolated at least between the surface of the outer frame member and the surface of the connecting portion or between the surface of the center portion and the surface of the connecting portion. Moreover, in another one of these methods, the thickness dimension of the connecting portion is set to be smaller than the thickness dimension of the outer frame member. In accordance with the former arrangement, it is possible to block surface waves that are transmitted from the surface of the outer frame member to the surface of the connecting portion or from the surface of the connecting portion to the surface of the center portion. In other words, it is possible to avoid a situation in which these surface waves are transmitted to the main vibration unit through the outer frame member and the connecting portion to give adverse effects to the vibration of the main vibration unit. On the other hand, in accordance with the latter arrangement, since the transmission passage of bulk waves that are transmitted from the outer frame member to the center portion through the connecting portion is narrowed so that the transmission of the bulk waves is suppressed, it is possible to eliminate one of the factors that give adverse effects to the vibration of the main vibration unit.

Moreover, in the case when the center portion is allowed to have the reversed mesa structure and when the main vibration unit is formed at virtually the center portion in the thickness direction of the outer edge portion, since the piezoelectric vibration device is formed into a symmetrical shape in its surface and rear surface shapes, it is possible to eliminate the necessity of having to carry out operations while recognizing the upper and rear surfaces of the piezoelectric vibration device upon placing the device in the package, and consequently, it is possible to improve the assembling workability to the package.

In the case when a buffering portion, which has a thickness dimension virtually corresponding to the thickness dimension of the main vibration unit and which connects the main vibration unit and the outer edge, is formed between the main vibration unit in the center portion and the outer edge, the main vibration unit is allowed to vibrate without receiving a regulating force from the outer edge. For this reason, in the case when an attempt is made to miniaturize the piezoelectric vibration device, even if the distance between the main vibration unit and the outer edge is not maintained sufficiently, it is possible to avoid a problem in which the main vibration unit is subjected to a regulating force from the outer edge to cause degradation in the resonance characteristics.

Moreover, in the case when the portion between the main vibration unit of the center portion and the outer edge is partially cut and separated, the main vibration unit is allowed to vibrate without receiving the regulating force from the outer edge, thereby making it possible to prevent degradation in the resonance characteristics.

With respect to applied techniques of the above-mentioned etching methods, the following techniques are proposed. In an etching method in which, when a work piece having a predetermined shape is drawn from a work-piece base plate through an etching process, the work piece is shaped with one portion of the outer edge of the work piece being connected to the work-piece base plate through a connecting member, a mask layer, which has an etching rate which is higher than other mask layers which are applied to other portions, is applied to a portion on the work-piece base plate which is used for forming the connecting member, and an etching process is carried out by utilizing the above-mentioned etching method so that this connecting member is formed to have a shape that is thinner than the other portions.

This technique is applicable to a case in which a number of quartz wafers for a tuning-fork-type quartz resonator are simultaneously formed (so-called multiple-pieces obtaining process) from one quartz base plate. In other words, this technique is applied to a case in which quartz wafers, each having been formed into a predetermined shape, are prepared while being connected to a quartz base plate through connecting members, and these connecting members are then cut off to separate the quartz wafers from the quartz base plate. In this case, since each of the connecting members is formed to have a thickness which is thinner than the other portions, each of the connecting members is easily cut off without a possibility of being cut off at portions other than the connecting member. Thus, it is possible to easily obtain a quartz wafer having a desired shape. Moreover, it is possible to reduce the occurrence of damages to the quartz upon separation, and it is also possible to avoid adverse effects which are caused on the vibration characteristics by the existence of the broken quartz pieces.

Moreover, in the present invention, the outer-shape etching process and the groove etching process with respect to the work piece such as a quartz substrate may be carried out in parallel with each other so that only one etching process makes it possible to form both of the outer shape and the grooves. In this case, the amount of etching which is required for the outer shape etching and the amount of etching which is required for the groove etching are different from each other. In other words, the amount of etching which is required for forming the grooves is smaller than the amount of etching which is required for forming the outer shape. For this reason, an etching delay film is preliminarily formed on the surface of the groove formation area so that the start of the groove etching process is delayed from the start of the outer-shape etching process.

More specifically, in order to form an etched product having a predetermined outer shape and grooves by carrying out an etching process on a work piece, this etching method has the following etching processes as its premise: "an outer-shape etching process" for removing an area that is located outside of the outer edge of the etched product to be formed; and "a groove etching process" for allowing a groove-forming area on the work piece to form a recessed section through the etching. With respect to this etching method, the etching delay film is preliminarily formed on only the surface of the groove-forming area. In this state, the etching process is executed on the work piece so that, after the start of "the outer-shape etching process", the etching delay film is dissolved during the outer-shape etching and after the etching delay film has been dissolved and removed, the above-mentioned "groove etching process" is started. In this case, the etching delay film may be formed (with respect to the setting of the material and film thickness) so that at the start of "the groove etching process", "the outer-shape etching process" may be executed in parallel with each other, or so that at the start of "the groove etching process", "the outer-shape etching process" has been completed.

With respect to specific techniques for allowing the above-mentioned etching delay film to exist on the surface of the groove-forming area, the following techniques are proposed. First, a coat layer, which has a material with a higher etching rate (a material that is easily dissolved by etching solution) as a lower layer and a material with a lower etching rate (material that is not easily dissolved) as an upper layer, is formed in an area which is inside of the outer edge of the etched product to be formed. Then, in the groove-forming area, by utilizing the lower layer that is exposed by removing only the upper layer as an etching delay film, an etching process is executed on the work piece.

Moreover, another method is proposed in which, with respect to the material of the etching delay film, a material, which has a higher etching rate than the material of a film that is formed on areas that are located inside the outer edge of an etched product to be formed and also corresponds to areas other than the groove forming area, is used.

These specific techniques allow an etching operation to be immediately started (start of the outer-shape etching process) at an area having no etching delay film on the work piece, that is, at an area outside the outer edge of the etched product to be formed, at the time when an etching process is started on the work piece. In contrast, only the fusing process of the etching delay film is started at an area having the etching delay film on the work piece, that is, at the groove forming area, and at this portion, the etching process has not started on the work piece.

Then, this state is maintained for a predetermined period of time, and after the etching delay film, which is located on the groove forming area, has been completely dissolved and removed, the etching process is started on the work piece also in this groove forming area (start of the groove etching process). In other words, the groove etching process is carried out in parallel with the outer shape etching process. Moreover, in another case, at the time of the start of the groove etching process, the outer shape etching process has already been completed. Then, at the time when the etching amount has reached a predetermined amount at the groove forming area, the etching process is completed.

With this arrangement, a groove having a predetermined depth is formed at the groove forming area, and at areas outside the outer edge of the etched product in which the etching process has been started prior to the groove etching process, it is possible to obtain a sufficient etching amount, and consequently, it is possible to form the outer shape of the etched product into a desired shape.

Here, in the case when materials of two types having different etching rates are used as described above, for example, Cr is used as the material having a high etching rate, and Au is used as the material having a low etching rate. In other words, in the case when the above-mentioned two coat layers are used, the area inside the outer edge of the etched product to be formed (the portion to form the etched product) is allowed to have a two-layer structure of Cr and Au, while the groove forming area has a single-layer structure of Cr. Consequently, no etching process is carried out in this two-layer structure portion, and in the single-layer structure portion, after Cr has been dissolved, the groove etching process is carried out to a predetermined etching amount (corresponding to the depth of the groove). Additionally, usable materials are not intended to be limited by these materials.

With respect to the etched product which is formed through the above-mentioned etching method, one of the specific examples is a tuning-fork-type quartz wafer. In this case, the groove is formed in the center portion of its main face.

In the case when the groove is formed on the main face of the tuning-fork-type quartz wafer in this manner, even if the tuning-fork-type quartz vibration member to be formed by using this tuning-fork-type quartz wafer is miniaturized, the vibration loss in the leg portions is suppressed, and the CI value is effectively reduced to a low level.

Moreover, an etched product that is formed by using any one of the etching methods of the above-mentioned means to solve the problems is included within the scope of the technical idea of the present invention.

Furthermore, the present invention has an arrangement in which, upon carrying out an etching process on a work piece such as a quartz substrate, at least two stages of etching processes are carried out on an area to be subjected to the etching treatment. After an etching process has been carried out on one portion of the outer edge of an area to be subjected to the etching treatment (for example, both of the side portions of the area to be subjected to the etching treatment), or in delayed timing from the treatment, an etching process is executed on the rest of the portions. In other words, the shape, the etching depth and the like of the etching area are preliminarily determined by the former etching process, and another etching process is then carried out on the entire portion of the etching area.

More specifically, the present invention is provided with an etching method for etching a predetermined etching area on the surface of a work piece as its premise. This etching method includes an outer-edge etching process and a center etching process that is started with a delayed timing with respect to the former etching process. In the outer-edge etching process, with respect to the above-mentioned etching area, at least only one portion of the outer edge of the area is subjected to an etching process. In the center etching process, with respect to the above-mentioned etching area, areas other than the portion that has been etched in the outer-edge etching process are subjected to an etching process.

In this specific technique, first, one portion of the etching area (at least one portion of the outer edge of the etching area) is subjected to an etching process by a predetermined etching amount through the outer-edge etching process. Then, the entire etching area is subjected to an etching process through the center etching process so that a desired etching process is completed. In other words, the outer-edge etching process preliminarily carries out an etching process on a comparatively narrow area by an appropriate etching amount, and in the center etching process, the entire etching area is subjected to an etching process by a predetermined amount in accordance with the etching amount which is obtained appropriately through the outer-edge etching process. Thus, the etching amount with respect to the etching area, which is finally obtained, is appropriately set over the entire area so that it is possible to improve the processing precision in the etched product.

Moreover, with respect to the start timing of the center etching process, the center etching process may be started after the start of the outer-edge etching process and before the completion of the process.

With an etching delay film being preliminarily placed on only the surface of the etching area relating to the center etching process of the etching area, an etching process is carried out on the work piece, and after the etching delay film has been dissolved and removed after the start of the outer-edge etching process, the above-mentioned center etching process is started. In the case of this forming method, it is possible to reduce the number of etching processes with respect to the quartz substrate, and it is also possible to avoid problems such as surface roughness and the like on the surface of the quartz wafer.

Moreover, in this forming method, the process for forming the quartz substrate into a tuning-fork shape, the outer-edge etching process and the center etching process may be carried out simultaneously. In this case, the outer shape of the tuning-fork-type quartz wafer is formed into a predetermined shape (a tuning-fork shape) by carrying out the etching process on the quartz substrate only once, with a groove being formed on its main face. Thus, it is possible to prevent the occurrence of surface roughness on the surface of the quartz wafer and it is also possible to simplify the forming processes.

Moreover, with respect to the etched products which are formed by this etching method, those having a crystal face appearing on the etched surface in the etching area are also included within the technical idea of the present invention. In other words, judging from a state that a crystal surface appears on the etched surface of an etching product, it is possible to confirm that the etched product is manufactured by the above-mentioned manufacturing method.

Furthermore, the main face of the piezoelectric vibration substrate surface and the periphery of the edge are formed as discontinuous faces so that the surface tension which is exerted on this portion is reduced, thereby making it possible to maintain a sufficient amount of application in the resist solution at the edge.

More specifically, the present invention relates to a manufacturing method of a piezoelectric vibration device in which a continuous electrode, which is placed over faces that are adjacent to each other through the edge portion on the piezoelectric vibration substrate, is formed by a photolithography technique. With respect to this manufacturing method, prior to the application process of a resist solution onto the piezoelectric vibration substrate, a pre-treatment process of the substrate surface, which forms a tension-reducing means for reducing the surface tension that is generated in the resist solution, is carried out on a position in the vicinity of the edge of at least one of the above-mentioned adjacent faces.

With respect to the tension-reducing means formed by the pre-treatment process of the substrate surface, more specifically, the following arrangements are proposed: a first arrangement in which the surface of the piezoelectric vibration substrate is partially formed into a discontinuous face as a recessed section at the position in the vicinity of the edge, or a second arrangement in which the surface of the piezoelectric vibration substrate is partially formed into a discontinuous face as a recessed section with one portion thereof being opened along the edge line of the edge at the position in the vicinity of the edge.

With these specific techniques, the continuity of the face on the periphery of the edge on the piezoelectric vibration substrate is eliminated so that the surface tension which is generated in the resist solution that is applied to the piezoelectric vibration substrate is reduced. Thus, it becomes possible to maintain a sufficient amount of application in the resist solution at the edge, and consequently, it is possible to greatly reduce the rate of occurrence of defective products.

With respect to the execution timing of the pre-treatment process of the substrate surface, the following methods are proposed. In other words, a portion which is allowed to form an electrode on the piezoelectric vibration substrate after the piezoelectric vibration substrate has been formed into a predetermined shape through the etching process is subjected to the above-mentioned pre-treatment process of the substrate surface simultaneously with the etching process of the piezoelectric vibration substrate so as to form a tension-reducing means. For example, in the case when a metal pattern having a predetermined shape (for example, a tuning-fork shape in a tuning-fork-type quartz vibration member) is formed on a piezoelectric vibration base plate, resist is not applied to a position on which the tension-reducing means is formed so that, upon an etching process of the piezoelectric vibration base plate, at the same time as when a piezoelectric vibration substrate having a predetermined shape is formed, a tension-reducing means is formed at a predetermined area on this piezoelectric vibration substrate. Therefore, no specific processes for forming the tension-reducing means are required so that it is possible to improve the work efficiency.

Moreover, the formation position of the tension-reducing means in the pre-treatment process of the substrate surface is selected based upon types of photoresist solution to be used in the photolithographic technique. More specifically, when the electrode is formed by a photolithographic technique using a resist film that is made from photoresist solution of a negative working type, the tension-reducing means is formed at a position corresponding to an electrode non-formation portion on the piezoelectric vibration substrate.

In other words, in the case when a resist film which is made from a photoresist solution of a negative-working type is used, the resist film is applied to the surface of the piezoelectric vibration substrate prior to the vapor deposition of the electrode material, and with the resist film being left on only predetermined exposed portions, the electrode material is vapor-deposited on the other portions. For this reason, the tension-reducing means is formed at the position corresponding to the electrode non-formation portion on the piezoelectric vibration substrate, while the resist film is sufficiently maintained at portions requiring no deposition of the electrode material. Thus, it is possible to prevent the electrode material from being vapor-deposited on unnecessary potions. This method is particularly effective in the case when an unnecessary electrode material is removed by a lift-off method, and makes it possible to positively prevent problems such as short-circuiting between electrodes that is caused by residual electrode material at unnecessary portions (in particular, short-circuiting at the base-end connection portion of each leg portion in the case of the tuning-fork-type quartz vibration member).

Moreover, piezoelectric vibration devices which are manufactured through the above-mentioned manufacturing methods of piezoelectric vibration devices are also included in the scope of the technical idea of the present invention.

BRIEF DESCRIPTION OF THE DRAWINGS

FIG. 35(a) is a drawing that shows a tuning-fork-type quartz vibration member in accordance with a thirteenth embodiment of the present invention, and FIG. 35(b) is a cross-sectional view taken along line B-B of FIG. 35(a).

FIG. 41(a) is a drawing that shows a quartz wafer in accordance with a fifteenth embodiment of the present invention, and FIG. 41(b) is a cross-sectional view taken along line III-III of FIG. 41(a).

FIG. 42(a) is a drawing that shows a tuning-fork-type quartz vibration member in accordance with a sixteenth embodiment of the present invention, and FIG. 42(b) is a cross-sectional view taken along line IV-IV of FIG. 42(a).

FIG. 43(a) is a plan view that shows a quartz wafer in accordance with a first modified embodiment of the sixteenth embodiment, and FIG. 43(b) is a cross-sectional view taken along line V-V of FIG. 43(a).

FIG. 44 is a plan view that shows a quartz wafer in accordance with a second modified embodiment of the sixteenth embodiment, and FIG. 44(b) is a cross-sectional view taken along line VI-VI of FIG. 44(a).

FIGS. 52(a) to 52(g) are drawings that show forming processes of a conventional reversed mesa type quartz wafer.

FIGS. 53(a) to 53(g) are drawings that show forming processes of a conventional mesa type quartz wafer.

FIGS. 55(a) and 55(b) are perspective views that show quartz substrates in the middle of the forming processes of a tuning-fork-type quartz wafer in accordance with the conventional technique.

DETAILED DESCRIPTION OF THE INVENTION

The following description will discuss embodiments of the present invention with reference to the drawings. The following description will exemplify a case in which the present invention is applied to a quartz wafer that constitutes an AT-cut quartz resonator as an etched product.

First Embodiment

Figure 1:
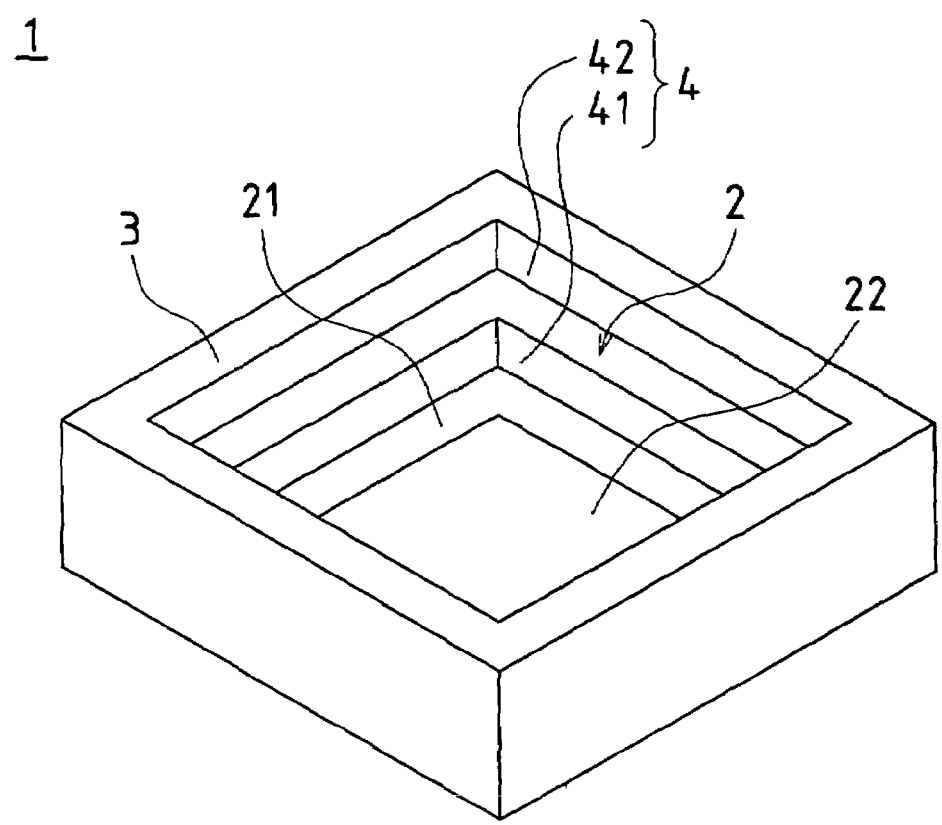
FIG. 1 is a perspective view that shows a quartz wafer in accordance with embodiments of the present invention.
Figure 2:
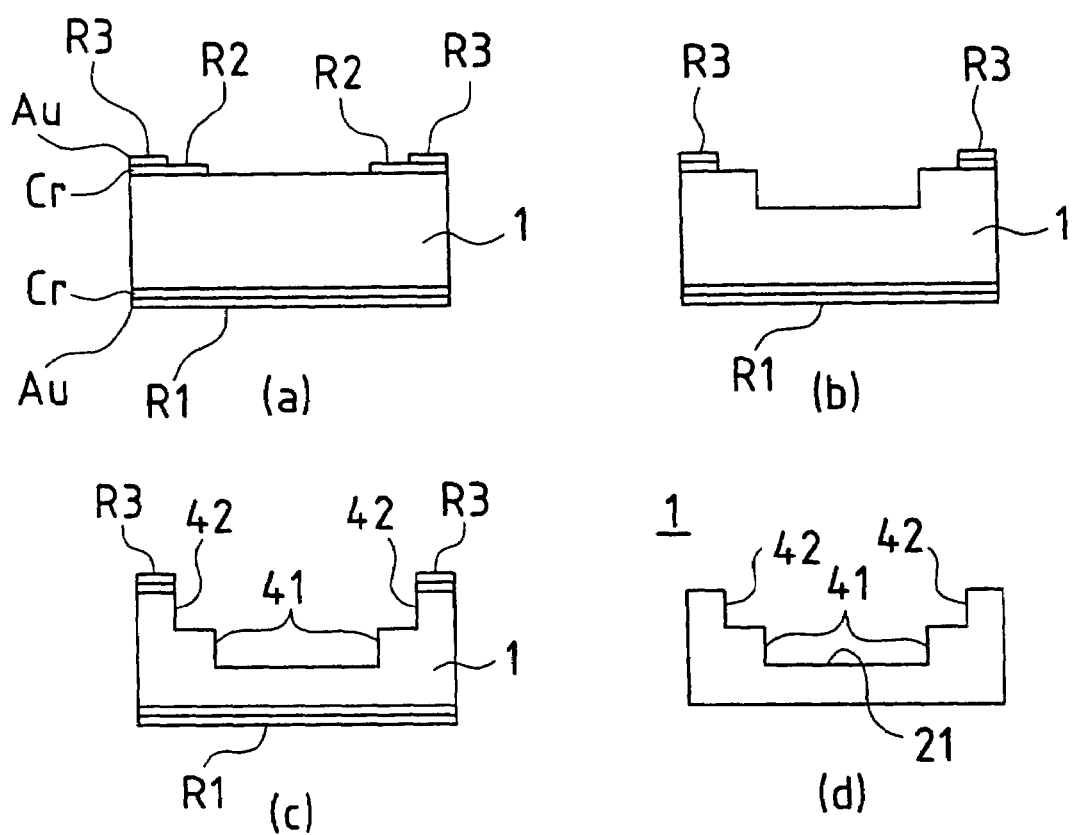
FIGS. 2(a) to 2(d) are drawings that show etching formation processes of a quartz wafer in accordance with a first embodiment of the present invention.

The first embodiment of the present invention will now be described. FIG. 1 is a perspective view of a quartz wafer 1 that is formed in accordance with the first embodiment. FIG. 2 is a drawing that shows etching formation processes of the quartz wafer 1.

As shown in FIG. 1, a recessed section 2 to be used for forming an electrode 22 is formed in the center portion of the quartz wafer 1. The center of this recessed section 2 forms a piezoelectric vibration area 21 having an extremely thin thickness, and an exciter electrode 22 is formed on each of the surface and rear surface of the quartz wafer 1 (one on the rear surface, not shown), with this exciter electrode 22 being externally connected by a drawing electrode. Moreover, the outer edge of the quartz wafer 1 is formed as a reinforcing portion 3 that has a thickness dimension which is several times greater than the thickness dimension of the piezoelectric vibration area 21. Moreover, a step portion 4 having a step shape (two step portions 41, 42 on the inside and outside are placed in the first embodiment) is formed between the piezoelectric vibration area 21 and the reinforcing portion 3. This step portion 4 is formed so as to maintain a sufficient mechanical strength of the piezoelectric vibration area 21 and also to alleviate influences from externally-applied force.

For example, in an attempt to obtain a basic vibration frequency of 600 MHz with respect to the thickness of each portion, a fine structure, which has a thickness of the piezoelectric vibration area 21 of approximately 3 μm, a thickness of the reinforcing portion 3 of approximately 10 μm, an area of the piezoelectric vibration area 21 of approximately 0.5 mm$^2$, and an area of the exciter electrode 22 of approximately 0.2 mm$^2$, is required. The formation of such a piezoelectric vibration area 21 in the recessed section 2 is carried out by a wet etching method, which will be described later. Moreover, the formation of the exciter electrode 22 is carried out by a vacuum vapor deposition method or the like, and aluminum, silver or the like is used as each of the electrode materials.

Here, although not shown in the drawings, such a piezoelectric vibration device is housed in a package which is made of ceramics such as alumina, with each drawing electrode being electrically connected so as to be directed externally, and is joined to the upper face of the package in an air-tight manner by a lid plate so that a quartz resonator of a surface packaging type is obtained.

Next, the following description will discuss the forming processes of the quartz wafer 1 according to the first embodiment. As shown in FIG. 2(a), the quartz wafer 1 prior to processing, which is used as a work piece, has its upper and lower faces as being mirror faces through polishing processes, and mask layers R1, R2, R3 having predetermined shapes, which feature the first embodiment, are formed on the upper and lower faces of the quartz wafer 1. The processes for forming these mask layers R1, R2, R3 will be described later. Then, the quartz wafer 1 is immersed into an etching solution, such as a solution of hydrofluoric acid+ammonium fluoride, by using the mask layers R1, R2, R3 which are formed on the upper and lower faces of this quartz wafer 1 as masks. Thus, a wet etching process is carried out. The following description will discuss these wet etching processes in detail.

First, an explanation will be given of the quartz wafer 1 prior to the wet etching process. The entire lower surface of the quartz wafer 1 is covered with a lower face mask layer R1 which is composed of a two-layer structure of a lower Cr layer and an upper Au layer. Here, the upper face of the quartz wafer 1 has no mask layer formed thereon at a portion in which the above-mentioned piezoelectric vibration area 21 is formed, and an inside mask layer R2, which is composed of only one layer of a Cr layer, is formed on a portion corresponding to the upper face of the inside step portion 41 on the outer circumferential side thereof. Moreover, an outside mask layer R3, which is composed of a two-layer structure having a Cr layer as its lower layer and an Au layer as its upper layer, is formed at a portion corresponding to the upper face (the upper face of the outer edge of the quartz wafer 1) of the outside step portion 42 on the outside of this Cr layer. Here, the respective Cr layers of the inside mask layer R2 and the outside mask layer R3 are formed as a continuous layer. In this manner, a Cr layer having an etching rate is formed on the portion corresponding to the upper face of the inside step portion 41, and an Au layer (having a Cr layer as a lower layer) having no etching rate is formed on the portion corresponding to the upper face of the outside step portion 42 so that respective portions having mutually different etching amounts are placed on the upper face of the quartz wafer 1.

With the mask layers R1, R2, R3 being formed on the quartz wafer 1 in this manner, the quartz wafer 1 is immersed into an etching solution such as a solution of hydrofluoric acid+ammonium fluoride. Thus, at the area (the portion at which the piezoelectric vibration area 21 is formed) having no mask formed thereon, an etching process is started on the quartz wafer 1 at once. In contrast, at the inside mask layer R2 on the outer circumferential side, fusing is started on the Cr layer so that, after the inside mask layer R2 has been completely dissolved, an etching process is started on the quartz wafer 1. In other words, at the portion corresponding to the upper face of this inside step portion 41, the etching start time is delayed by the time which is required for the fusing of the Cr layer in comparison with the portion in which the piezoelectric vibration area 21 is formed. FIG. 2(b) shows a cross-sectional shape of the quartz wafer 1 at the time when the Cr layer of the inside mask layer R2 has been completely dissolved. At this time, the etching process on the upper surface of the inside step portion 41 is started. Moreover, the Au layer exists on the upper layer of the Cr layer in the outside mask layer R3, and since the Au layer has no etching rate, no etching is carried out on this portion.

The etching process of this type is continuously carried out until the piezoelectric vibration area 21 has come to have a predetermined thickness dimension. FIG. 2(c) shows a cross-sectional view of the quartz wafer 1 at the time when the piezoelectric vibration area 21 is set to have the predetermined thickness dimension. After the portion at which the piezoelectric vibration area 21 is formed has been set to the predetermined thickness dimension as described above, the quartz wafer 1 is taken out of the etching solution, and the quartz wafer 1 is washed and dried so that the residual mask layers R1, R3 on the upper and lower surfaces of the liquid crystal wafer 1 are removed. Thus, as shown in the cross-sectional view of FIG. 2(d), the quartz wafer 1 is formed in which step portions 41, 42 having a step shape are formed between the piezoelectric vibration area 21 and the reinforcing portion 3.

Here, with respect to the adjusting operation of the basic frequency of the quartz wafer 1 which is formed into a predetermined shape as described above, the adjusting operation is carried out by a dry etching process or the like after completion of the above-mentioned etching processes. In the case when the adjusting operation of the basic frequency is available by carrying out only the above-mentioned etching processes, the quartz wafer 1 is completed simultaneously with the completion of the etching processes.

In this manner, in accordance with the etching method of the first embodiment, by allowing the mask layers which are formed on the respective portions of the surface of the quartz wafer 1 to have different etching rates, the quartz wafer 1 having the step portion 4 can be formed through an etching process of one time. Thus, it is possible to prevent surface roughness on the quartz wafer 1, a failure in etching and damages to the thin portion and the peripheral portion thereof, and, as a result, it is possible to provide a high-quality quartz wafer 1 with stable functions. Moreover, it is possible to form a quartz wafer 1 having a desired shape by properly placing respective mask layers and properly setting the etching rates thereof.

Here, in the first embodiment, the outside mask layer R3 is set to have a two-layer structure with a Cr layer and an Au layer. However, a single-layer structure having only the Au layer may be adopted.

Second Embodiment

Figure 3:
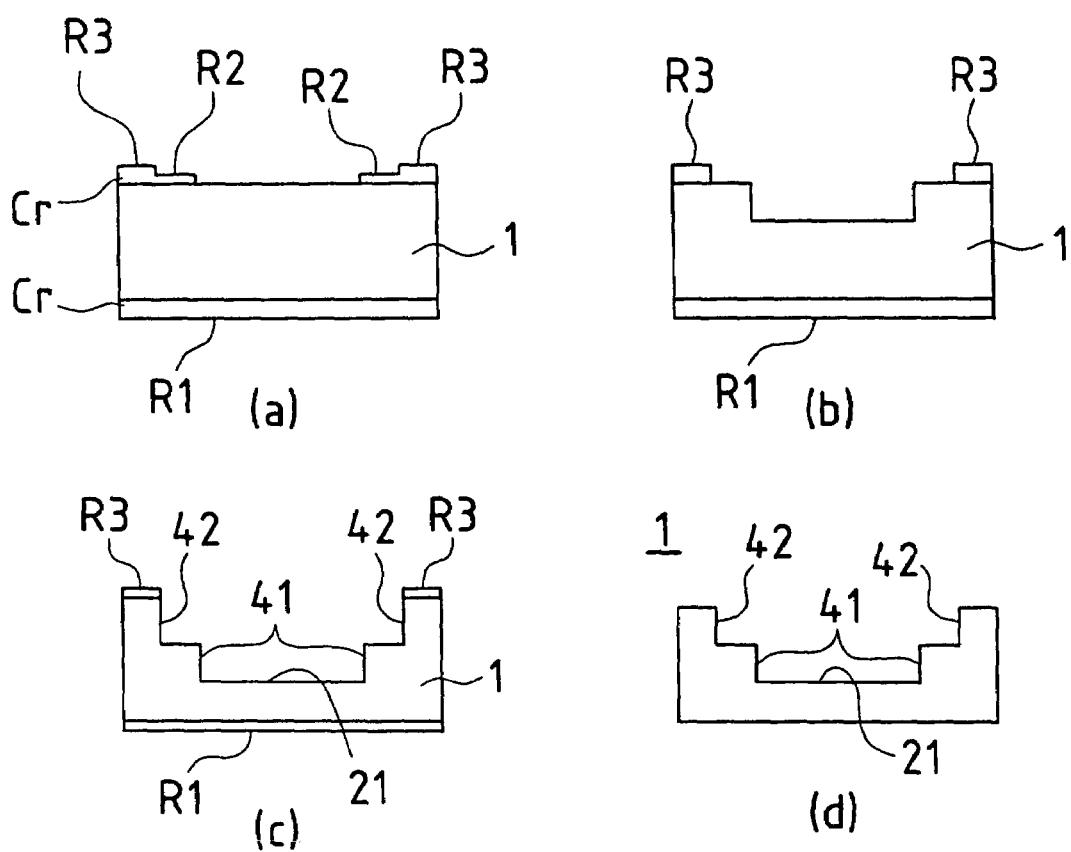
FIGS. 3(a) to 3(d) are drawings that show etching formation processes of a quartz wafer in accordance with a second embodiment of the present invention.

The following description will discuss the second embodiment of the present invention. In the above-mentioned first embodiment, a Cr layer and an Au layer are utilized as mask layers. However, in the second embodiment, as shown in FIG. 3(a), the mask layer is formed by using only the Cr layer, and the quartz wafer 1 with the step portion 4 as described above is still formed through an etching process of one time.

An explanation will first be given of the quartz wafer 1 prior to the wet etching process. The entire lower surface of the quartz wafer 1 is covered with a lower face mask layer R1 which is composed of a comparatively thick layer of Cr (a layer having a thickness that cannot be completely dissolved by a period of time which is required for forming the piezoelectric vibration area 21 of the quartz wafer 1). Here, the upper face of the quartz wafer 1 has no mask layer formed thereon at a portion in which the above-mentioned piezoelectric vibration area 21 is formed, and an inside mask layer R2, which is composed of a comparatively thin layer of Cr, is formed on a portion corresponding to the upper face of the inside step portion 41 on the outer circumferential side thereof. Moreover, an outside mask layer R3, which is composed of a comparatively thick Cr layer in the same manner as the lower face side of the quartz wafer 1, is formed at a portion corresponding to the upper face of the outside step portion 42 on the outside of this inner-side mask layer R2. Here, the inside mask layer R2 and the outside mask layer R3 are formed as integrated layers. In this manner, the thin Cr layer is formed on the portion corresponding to the upper face of the inside step portion 41, and the thick Cr layer is formed on the portion corresponding to the upper face of the outside step portion 42 so that the respective portions, which have mutually different etching start timing, are provided on the upper face of the quartz wafer 1.

With the mask layers R1, R2, R3 being formed on the quartz wafer 1 in this manner, the quartz wafer 1 is immersed into an etching solution. Thus, at the area (the portion at which the piezoelectric vibration area 21 is formed) having no mask formed thereon, an etching process is started on the quartz wafer 1 at once. In contrast, at both of the inside mask layer R2 on the outer circumferential side and the outside mask layer R3, fusing of the Cr layer is started. In this case, since the inside mask layer R2 is thinner than the outside mask layer R3, the Cr layer of the inside mask layer R2 is first completely dissolved, and after the Cr layer at this portion has been completely dissolved, the etching of the quartz wafer 1 is started. In other words, at the portion corresponding to this inside step portion 41, the etching start time is delayed by the time which is required for the fusing of this thin Cr layer in comparison with the portion in which the piezoelectric vibration area 21 is formed. At this time, since the outside mask layer R3 still remains, no etching is carried out at this portion. FIG. 3(b) shows a cross-sectional shape of the quartz wafer 1 at the time when the Cr layer of the inside mask layer R2 has been completely dissolved. In other words, at this time, etching is started with respect to the upper face of the inside step portion 41.

The etching process of this type is continuously carried out until the piezoelectric vibration area 21 has been formed into a predetermined thickness dimension. FIG. 3(c) shows a cross-sectional shape of the quartz wafer 1 when the piezoelectric vibration area 21 has been formed into the predetermined thickness dimension. At the time when a portion forming the piezoelectric vibration area 21 has come to have the predetermined thickness dimension, the quartz wafer 1 is taken out, and the quartz safer 1 is washed and dried so that the mask layers R1, R3 remaining on the upper and lower faces of the quartz wafer 1 are removed. Thus, as shown in FIG. 3(d), the quartz wafer 1, which has step portions 41, 42 with a step shape that is formed between the piezoelectric vibration area 21 and the reinforcing portion 3, is formed.

In this manner, in accordance with the etching method of the second embodiment, although mask layers on the respective surface portions of the quartz wafer 1 are formed by the same material (Cr), the thicknesses of the mask layers are made mutually different so that the etching rates are changed. Thus, the quartz wafer 1 having the step portion 4 is formed by an etching process of one time. This method also makes it possible to prevent surface roughness of the quartz wafer 1, etching failure and damages to a thin portion and the peripheral portion thereof.

Here, in the second embodiment, the thickness dimensions of the respective mask layers R1, R3 are set so that the mask layers R1, R3 are allowed to still remain even when the piezoelectric vibration area 21 has come to have a predetermined thickness dimension, that is, so that the etching is not carried out on the quartz on the upper face outer edge and the lower face of the quartz wafer 1. The present invention is not intended to be limited to this arrangement, and the thickness dimensions of the respective mask layers R1, R2, R3 are set so that the point of time when the piezoelectric vibration area 21 has come to have a predetermined thickness dimension and the point of time when the mask layers R1, R3 have been completely dissolved are made to be virtually coincident to each other; thus, it becomes possible to eliminate jobs for removing the residual mask layers.

Moreover, the thickness dimensions of the respective mask layers R1, R3 may be set so that the mask layers R1, R3 are completely dissolved before the piezoelectric vibration area 21 has come to have the predetermined thickness dimension. Thus, the etching process is carried out on the upper face outer edge and the lower face of the quartz wafer 1 to a certain extent so that it becomes possible to make the entire quartz wafer 1 thinner. In accordance with this arrangement, the thinning process is carried out beyond the limited dimension which is obtained when the thinning process of the entire quartz wafer 1 is carried out by the polishing process.

Third Embodiment

The following description will discuss a third embodiment of the present invention. The third embodiment relates to a case in which a quartz wafer 1 having a plate shape is formed into a predetermined thickness through etching, while the etching process is being carried out from the upper and lower face sides of the quartz wafer 1.

For example, in the case when the quartz wafer 1 prior to the etching process is subjected to a polishing process, process distortion layers are located on the upper and lower faces thereof to a certain extent. Here, in the case when one of the upper and lower faces has a thicker process distortion layer, even if the same etching processes are carried out on both of the upper and lower face sides, there is a possibility that the process distortion layer on this one of the layers is not completely removed. The third embodiment has been devised to solve this problem. The following description will discuss the third embodiment in detail.

Figure 4:
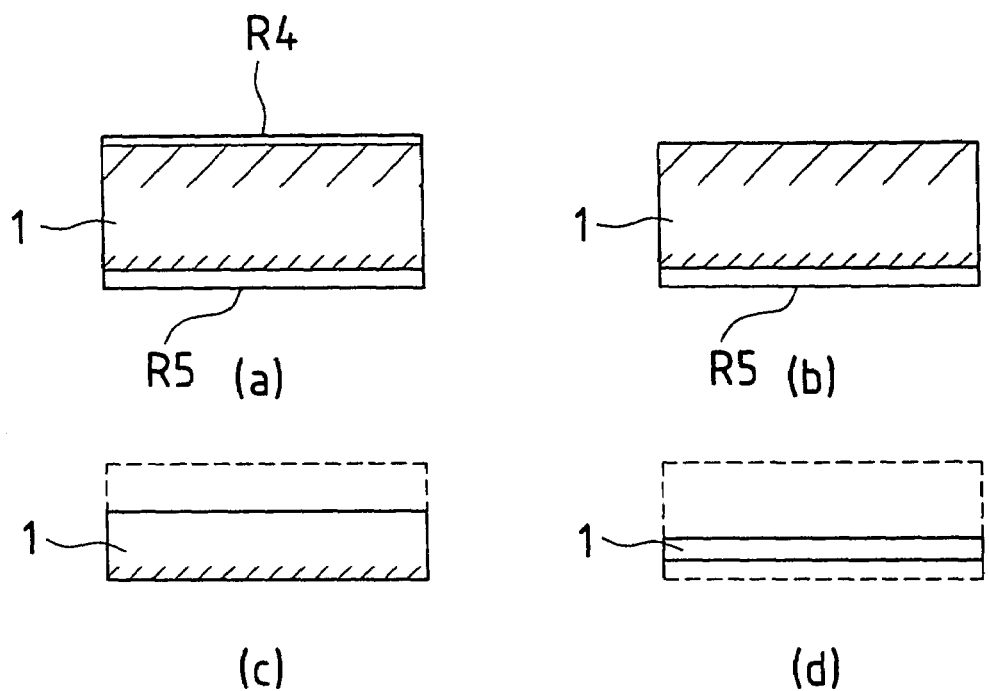
FIGS. 4(a) to 4(d) are drawings that show etching formation processes of a quartz wafer in accordance with a third embodiment of the present invention.

Here, the following description exemplifies a case in which of the upper and lower surfaces of the polished quartz wafer 1, the process distortion layer on the upper face is thicker than the process distortion layer on the lower face. In FIG. 4, the portion of the process distortion layer is indicated by slanting lines. In this case, it is preferable to make the etching amount of the upper face greater than the etching amount of the lower face so that the process distortion layer on the upper face is completely removed.

As shown in FIG. 4(a), in the third embodiment, the mask layers R4, R5 that are subjected to the etching process are formed by only Cr layers with the mask layer R4 on one surface (upper face) being set to have a greater etching amount is made thinner than the mask layer R5 on the other surface (lower face).

With the mask layers R4, R5 being formed on the quartz wafer 1 in this manner, the quartz wafer 1 is immersed into an etching solution. Thus, as shown in FIG. 4(b), the mask layer R4 is completely dissolved on the upper face side on which the mask layer R4 is thinner, prior to the mask layer R5 being completely dissolved on the lower face so that on this upper face, after the Cr layer has been completely dissolved, the etching process is started on the quartz wafer 1.

Further, at the point of time when, after the etching process on the upper face of the quartz wafer 1 and the etching process of the Cr layer on the lower face have been executed in parallel with each other, the Cr layer on the lower face has been completely dissolved, an etching process is started on the quartz wafer 1 on this lower face (FIG. 4(c)).

The etching process of this type is continuously carried out for a predetermined time, and, as shown in FIG. 4(d), at the time when the quartz wafer 1 has been formed into a predetermined thickness dimension, the quartz wafer 1 is taken out, and the quartz wafer 1 is washed and dried so that a quartz wafer 1 having a predetermined shape is obtained. Consequently, the process distortion layer on the upper face side, which is comparatively thicker, is removed by a greater amount than the process distortion layer on the lower face side. Thus, it is possible to obtain a quartz wafer 1 from which the respective process distortion layers have been completely removed.

With respect to the functions and effects of the etching processes which are carried out on the upper and lower faces, since the respective etching depths are minimized, this arrangement is less susceptible to the generation of residual etching portions (slanting engraved portions) due to anisotropy of the quartz, and consequently, the effective vibration area (flat face) is less susceptible to reduction.

Figure 5:
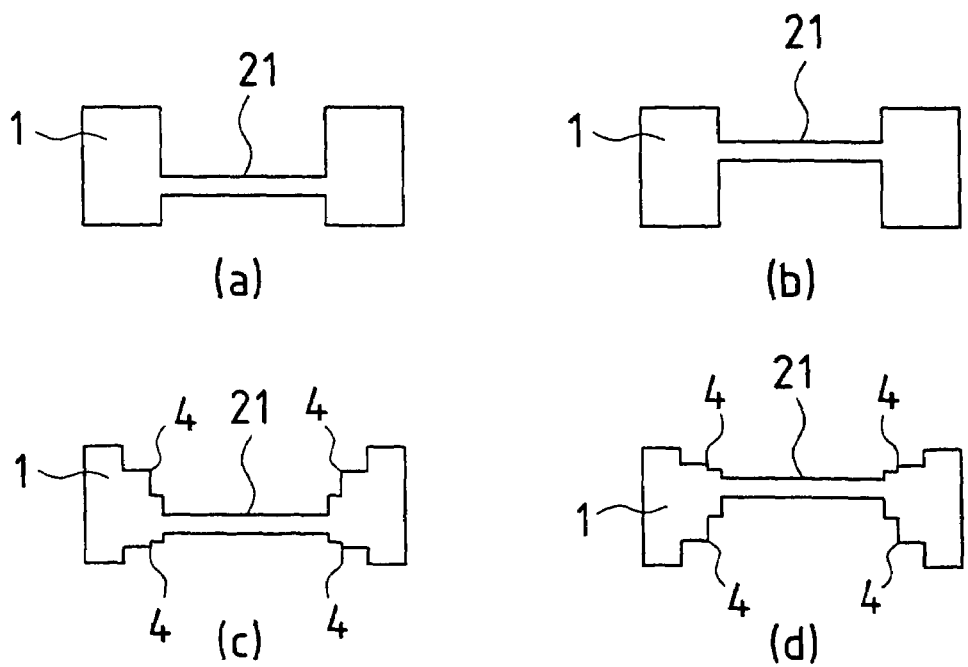
FIGS. 5(a) to 5(d) are drawings that show a modified example of the third embodiment.

Additionally, when the method for making the thicknesses of the mask layers on the upper and lower faces different from each other is adopted as described in the third embodiment, even each of quartz wafers 1 having complex shapes as shown in FIGS. 5(a) to 5(d) can be formed by an etching process of one time. FIGS. 5(a) and 5(b) show cases in which the piezoelectric vibration area 21 is formed without placing a step portion in the center of the quartz wafer 1, and FIGS. 5(c) and 5(d) show cases in which a step portion 4 is formed on each of the upper and lower faces in the center of the quartz wafer 1 with the piezoelectric vibration area 21 being formed inside the step portion 4.

Moreover, in the third embodiment, the mask layers R4, R5 are formed on the upper and lower faces. However, the surface to which a greater amount of etching is applied (the upper face in the above-mentioned case) does not necessarily need a mask layer. Furthermore, the third embodiment is also applicable to a quartz wafer 1 in which only one surface is subjected to the polishing process.

Fourth Embodiment

The following description will discuss a fourth embodiment of the present invention. In the fourth embodiment, a Cr layer and an oxidized Cr layer (hereinafter, referred to as CrO layer) are used as mask layers. In general, the CrO layer has a lower etching rate (which is hardly dissolved in etching solution) in comparison with the Cr layer, and by utilizing this difference in the etching rates, a quartz wafer 1 having a predetermined shape is obtained. The following description will discuss processes of forming the respective layers in detail.

Figure 6:
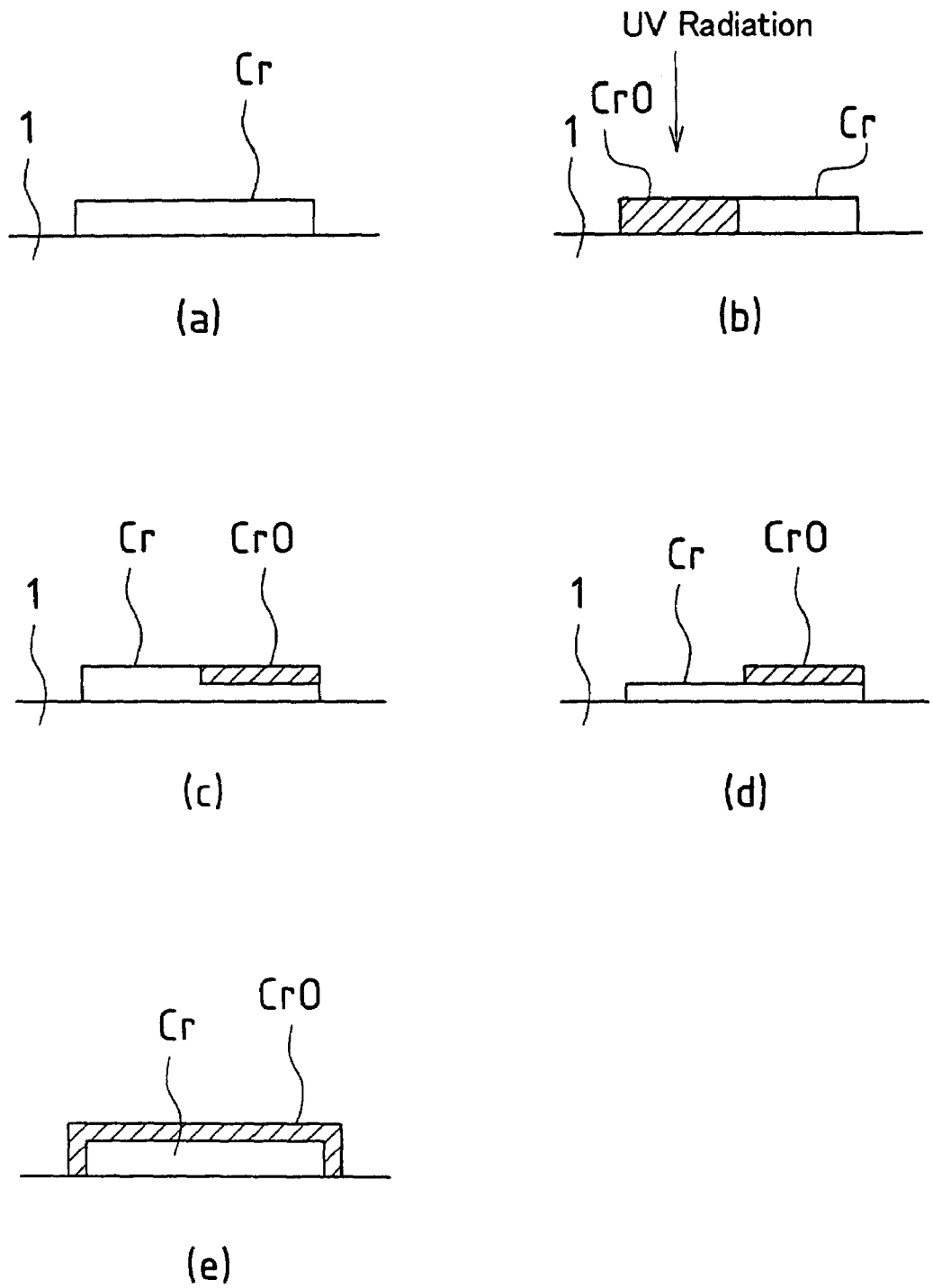
FIGS. 6(a) to 6(e) are drawings that explain formation processes of a CrO layer in accordance with a fourth embodiment of the present invention.

FIGS. 6(a) and 6(b) show process examples in the case when a Cr layer and a CrO layer are formed on the quartz wafer 1 in an adjacent manner with each other. First, as shown in FIG. 6(a), Cr is vapor-deposited to form a Cr layer on a predetermined area on the quartz wafer 1. Then, excimer UV irradiation is applied to only an area at which the etching rate should be reduced so that Cr at this portion is subjected to an oxidizing process so as to be formed into a CrO layer (FIG. 6(b)). Thus, the etching rate is reduced at only this portion so that this portion is allowed to function as a layer in place of the Au layer in the first embodiment. In other words, the portion, which is covered with this CrO layer, is not subjected to the etching process of the quartz wafer 1, or has delayed timing in the start of etching of the quartz wafer 1.

Here, with respect to the means for changing the Cr layer to the CrO layer, means such as a UV-$O_3$ drying washer and an $O_2$ plasma device may be adopted. Alternatively, after the entire CrO layer has been subjected to an oxidizing process to change the entire mask layer to the CrO layer, only the area at which the etching rate should be increased is partially subjected to a reduction process so as to be returned to the Cr layer. Moreover, at the time when Cr is vapor-deposited through sputtering on the quartz wafer 1 to form a Cr layer, oxygen is supplied to the chamber so that Cr is vapor-deposited on the quartz wafer 1 with Cr being oxidized. Thus, this method also makes it possible to form a CrO layer. More specifically, this method is achieved by introducing Ar—$O_2$ gas into the chamber during a vapor-depositing process through sputtering.

In this manner, the fourth embodiment makes it possible to form two kinds of mask layers having different etching rates by utilizing only Cr, i.e., without using Au. For this reason, it is possible to eliminate the necessity of Au as the film-forming material, and it is also possible to eliminate the Au removing process after the etching process. Thus, it becomes possible to reduce the manufacturing costs of the quartz wafer 1 and the number of film-forming processes. In particular, in an attempt to form a mask layer that is equivalent to the Au layer by using only the Cr layer, a film thickness of several thousands Å (for example, 4000 Å) is required. In contrast, in accordance with the fourth embodiment, even the application of the film thickness that is approximately equal to the film thickness of the Au layer (several hundreds Å: for example 300 Å) makes it possible to ensure sufficient performances of the mask layer having a low etching rate. Thus, it becomes possible to reduce the amounts of the film-forming materials. Along with the thinning process of this mask layer, the dimension precision in the shape-forming process of the mask layer is improved so that, when the outer shape of the quartz wafer 1 is formed through etching, it becomes possible to improve the outer-shape precision.

Moreover, in the case when a CrO layer is formed so as to delay the etching start timing of the corresponding portion, the thickness dimensions of the respective mask layers may be set so that the point of time when this CrO layer has been completely dissolved and the point of time when the above-mentioned piezoelectric vibration area 21 has been set to a predetermined thickness dimension are made to be coincident with each other. Thus, it becomes possible to eliminate a job for removing the residual mask layers.

Additionally, the fourth embodiment has exemplified a case in which the Cr layer and CrO layer are formed in an adjacent manner with each other. However, as shown in FIGS. 6(c), 6(d) and 6(e), one portion of the mask layer may be formed into a two-layer structure of a Cr layer and a CrO layer.

Moreover, in the same manner, the fourth embodiment may be applied to a case in which, not limited to Cr, any other material such as Ni or the like may be used for forming a mask layer, as long as the etching rate thereof is changed through an oxidizing process.

With respect to the process for changing the etching rate, not limited to the above-mentioned oxidizing process, means in which one portion of the mask layer (a portion at which the etching rate should be changed) is formed by an alloy layer being composed of a plurality of metals may be adopted.

Fifth Embodiment

The following description will discuss a fifth embodiment of the present invention. In the arrangement of the fourth embodiment, the mask layers are allowed to have differences in the etching rate by using a Cr layer and a CrO layer that is formed by subjecting the Cr layer to an oxidizing process, without the necessity of an Au layer. In the fifth embodiment, materials having different etching rates are used as mask layers, thereby eliminating the necessity of the Au layer.

With respect to a specific combination of the materials, Cr and Ni (nickel) are proposed. When a Ni layer is formed on the surface of a quartz wafer 1, the etching rate of the Ni layer is lower than the etching rate of the Cr layer. In other words, the Ni layer is hardly dissolved in an etching solution. With this arrangement, the mask layers are allowed to have differences in the etching rate while mutually different materials other than Au are used. Moreover, materials of not less than three kinds may be combined. For example, Cr, CrO and Ni are proposed.

Here, with respect to the film-forming materials of the mask layers, not limited to the above-mentioned materials, various materials may be applied.

Moreover, even in the case when mutually different materials are used to form the mask layers, the method of the fourth embodiment may be applied thereto. In other words, treatments such as oxidation are selectively applied to mask layers which are made from mutually different materials so that the etching rates are changed.

The following description will now discuss specific examples of the method of forming mask layers R that are prepared as described in the above-mentioned embodiments. The following methods are proposed as film-forming methods that are applicable to the present invention. Here, the following description will exemplify a case in which mask layers are formed by using only Cr layers. However, it is to be understood that these methods are also applicable to cases in which other materials or a plurality of materials are used for forming the mask layers.

Laser Irradiation

Figure 7:
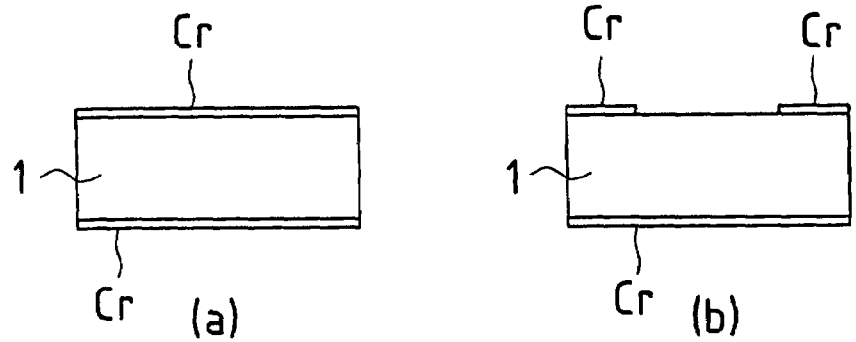
FIGS. 7(a) and 7(b) are drawings that show processes in which a mask layer is formed through laser irradiation.

One of the forming methods of the mask layers R is a method in which each mask layer is selectively removed through laser irradiation so that the mask layer is allowed to remain on only a predetermined area. For example, as shown in FIG. 7(a), in a state where Cr has been vapor-deposited over the entire upper and lower faces of a quartz wafer 1, a laser light beam is directed to a predetermined area (an area of the quartz wafer 1 at which etching should be carried out) so that only the Cr on this area is selectively removed. With this method, as shown in FIG. 7(b), it is possible to easily form a portion from which the Cr layer is removed or the Cr layer is made thinner at one portion of the area.

Milling

Figure 8:
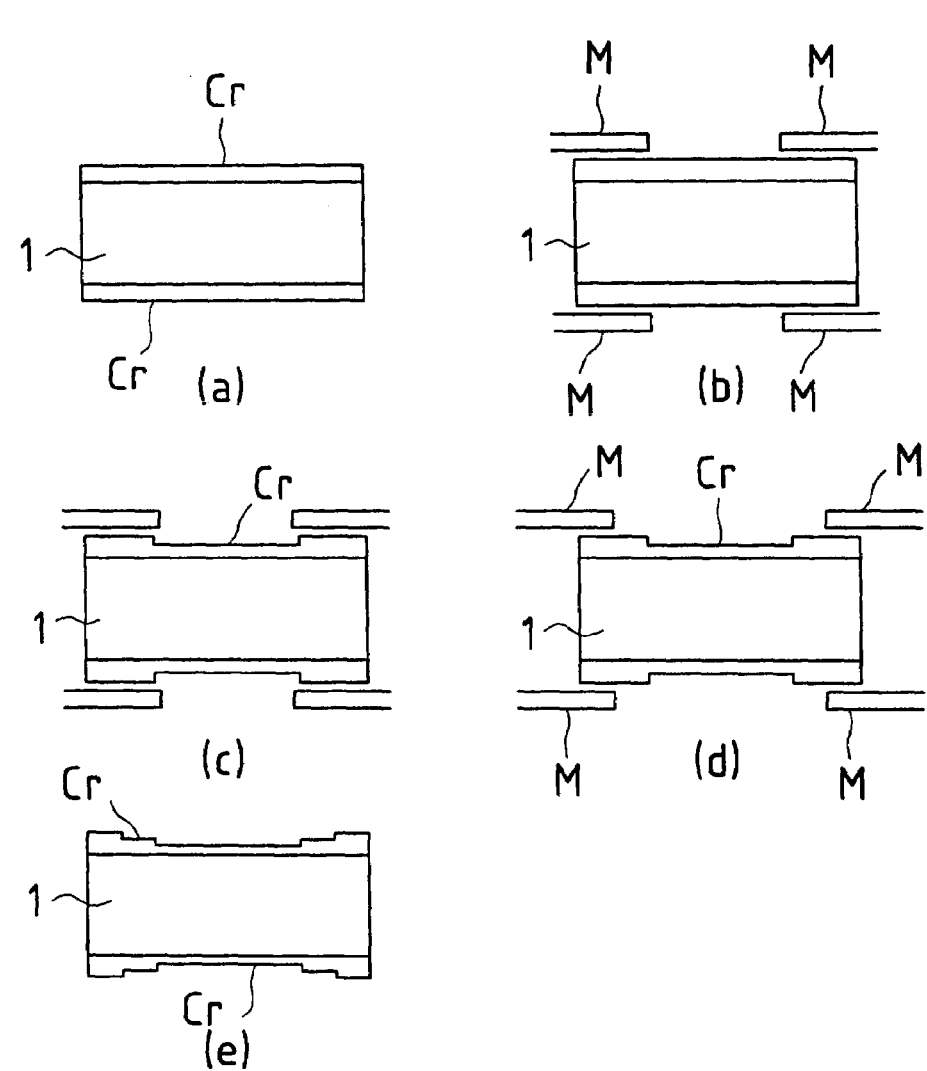
FIGS. 8(a) to 8(e) are drawings that show processes in which a mask layer is formed through milling.

Moreover, with respect to the forming method of the mask layers R, a milling method is proposed. For example, as shown in FIG. 8, a movable mask M is placed in a milling device, and, as shown in FIG. 8(a), in a state where Cr is vapor-deposited over the entire upper and lower surfaces of the quartz wafer 1, a milling process is carried out on the Cr layer while this movable mask M is being intermittently shifted outward so that only the predetermined area (the area of the quartz wafer 1 at which etching should be carried out) is selectively removed. Processes which are indicated by FIGS. 8(b) to 8(e) show a case in which a step-shaped Cr layer (FIG. 8(e)) is formed by carrying out a milling process while a pair of movable masks M, placed on each of the upper and lower portions, is being intermittently shifted outward.

Vapor Deposition

Figure 9:
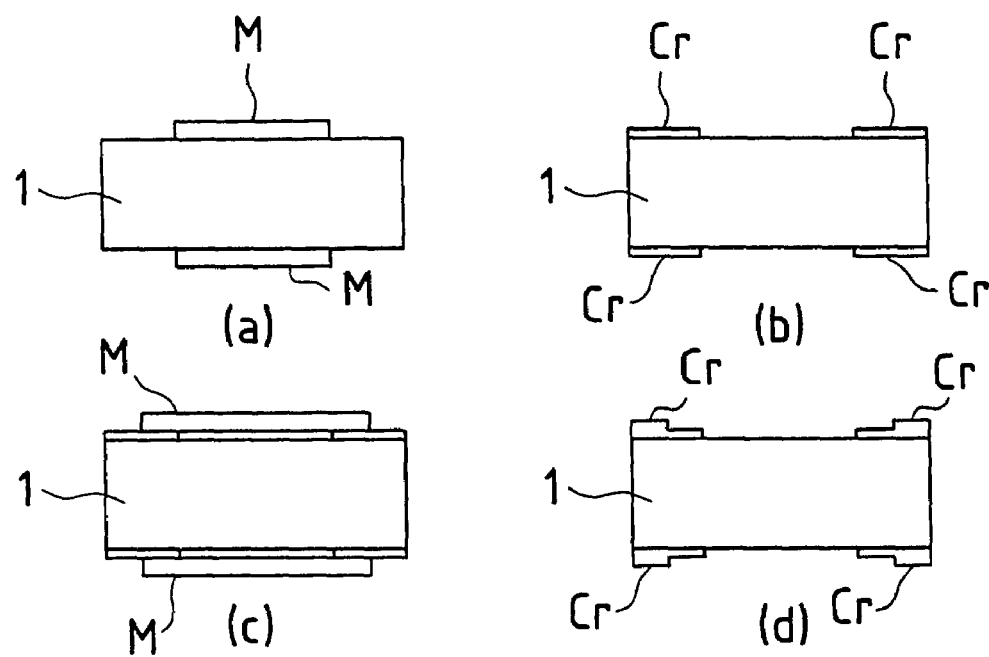
FIGS. 9(a) to 9(d) are drawings that show processes in which a mask layer is formed through Cr vapor deposition.

The following description will discuss a case in which mask layers are formed through a vapor deposition method. As shown in FIG. 9(a), with a masking material M being placed at a predetermined area of the quartz wafer 1, Cr is vapor-deposited in this state. Thus, a first Cr layer having a predetermined thickness is formed (FIG. 9(b)). Thereafter, as shown in FIG. 9(c), with a masking material M being placed on one portion of the first Cr layer, Cr is further vapor-deposited in this state. Thus, a second Cr layer is film-formed only on portions that have not been masked. In other words, only this portion is formed as a Cr layer having a greater thickness dimension. Thereafter, by removing the masking material M, a step-shaped Cr layer, which is constituted by a layer that is made of only the first Cr layer and a layer that is made of the first and second Cr layers, is formed (FIG. 9(d)).

Metal Etching

Figure 10:
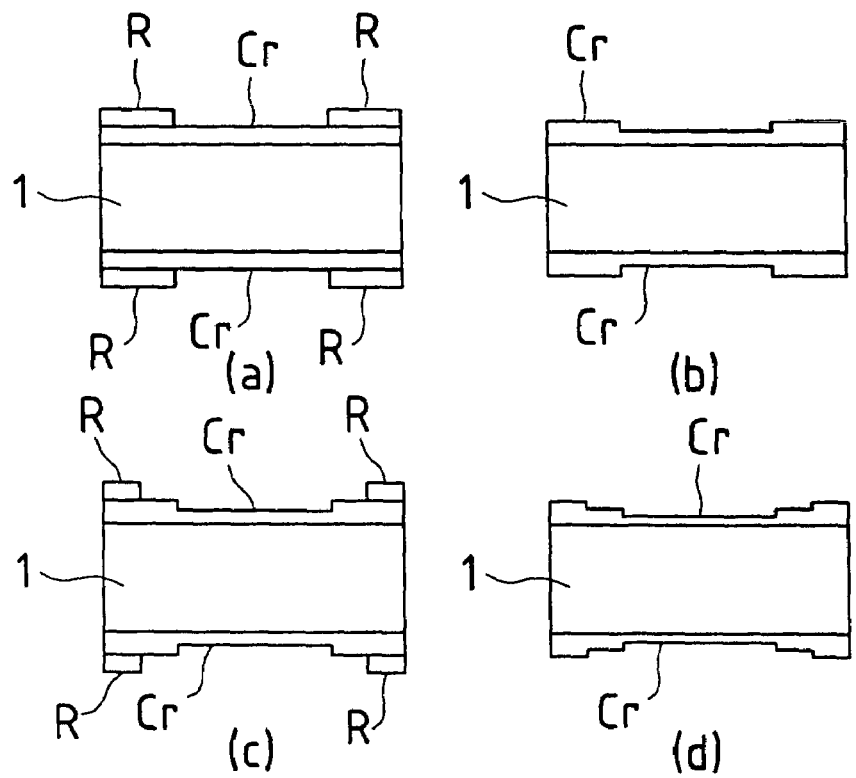
FIGS. 10(a) to 10(d) are drawings that show processes in which a mask layer is formed through metal etching.

With respect to a forming method of mask layers by using metal etching, for example, as shown in FIG. 10(a), with Cr being vapor-deposited over the entire upper and lower faces of the quartz wafer 1, a resist member R is placed at one portion of this Cr layer, and a metal etching process is carried out in this state. Thus, one portion of the Cr layer (a center portion in FIG. 10(a)) is removed by a predetermined thickness (FIG. 10(b)). Thereafter, a resist member R is placed on another one portion of the Cr layer, and a metal etching process is carried out in this state. Consequently, one portion of the Cr layer is further removed by a predetermined thickness. Then, by removing the resist member R, a plurality of layers, each having a different removed thickness, are allowed to form a step-shaped Cr layer.

Lift-Off

Figure 11:
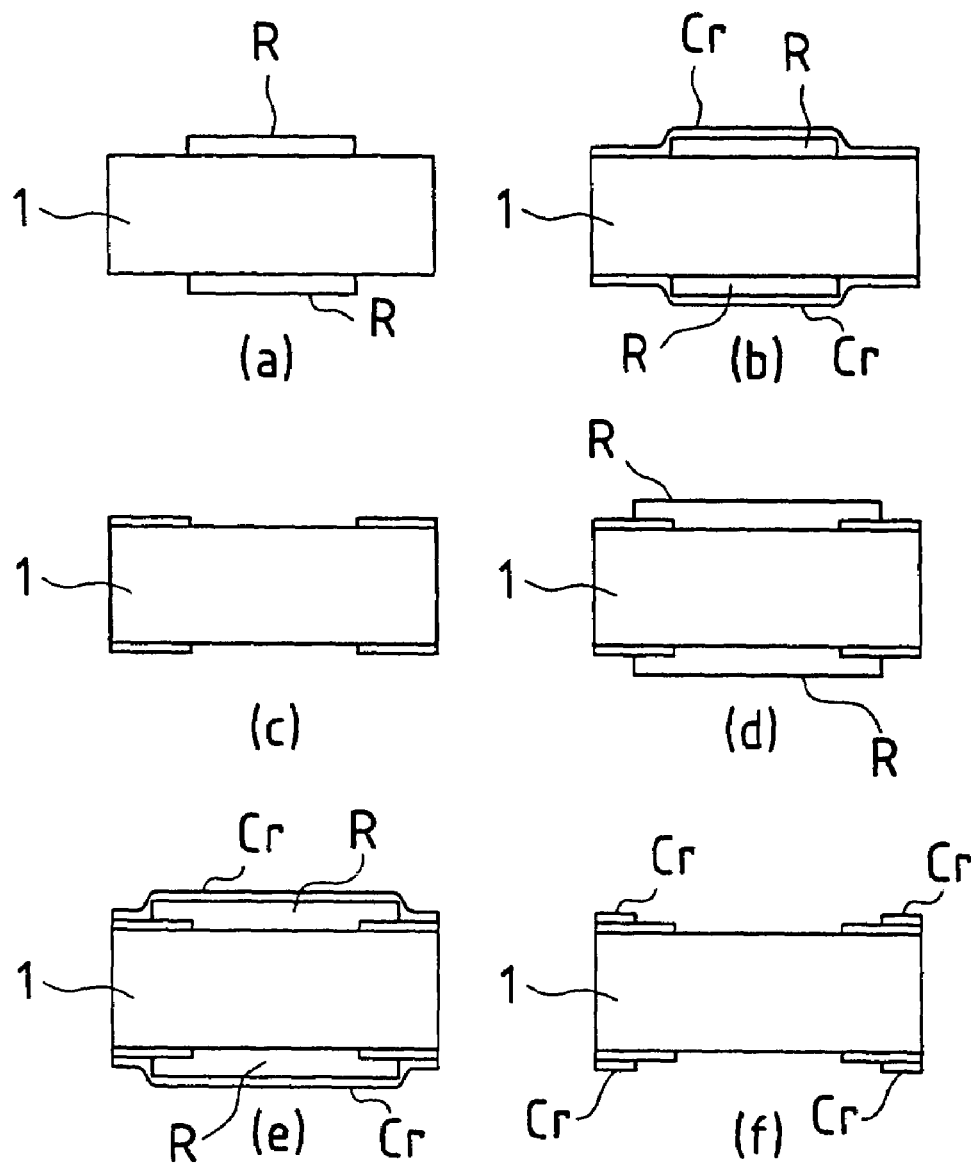
FIGS. 11(a) to 11(f) are drawings that show processes in which a mask layer is formed through lift-off.

With respect to a forming method of mask layers using lift-off, for example, as shown in FIG. 11(a), with a resist member R to be used in lift-off being placed on a predetermined area on a quartz wafer 1, Cr is vapor-deposited in this state (FIG. 11(b)). Thus, Cr layers, each having a predetermined thickness, are film-formed over the respective upper faces of the quartz wafer 1 and the resist member R. Thereafter, one portion of the Cr layer is removed from the quartz wafer 1 together with the resist member R through the lift-off method (FIG. 11(c)). Further, with a lift-off-use resist member R being placed on one portion of the residual Cr layer (FIG. 11(d)), the vapor deposition process of Cr is again carried out (FIG. 11(e)). Thus, Cr layers, each having a predetermined thickness, are film-formed over the respective upper faces of the quartz wafer 1 and the resist member R. Thereafter, one portion of the Cr layer is removed from the quartz wafer 1 together with the resist member R through the lift-off method in the same manner as described above (FIG. 11(f)). Thus, a step-shaped Cr layer, which is constituted by a layer that is formed by only the first Cr layer and a layer that is formed by the first and second Cr layers.

Sixth Embodiment

The following description will discuss a sixth embodiment of the present invention. The quartz wafer 1 of each of the above-mentioned embodiments has a flat-plate shape. The quartz wafer 1 in accordance with the sixth embodiment is constituted by a vibration unit and a frame member that surrounds the vibration unit, where the vibration unit and the frame member are connected by a plurality of bridges. The following description will discuss the structure of the quartz wafer 1 in accordance with the sixth embodiment and an etching method thereof.

Figure 12:
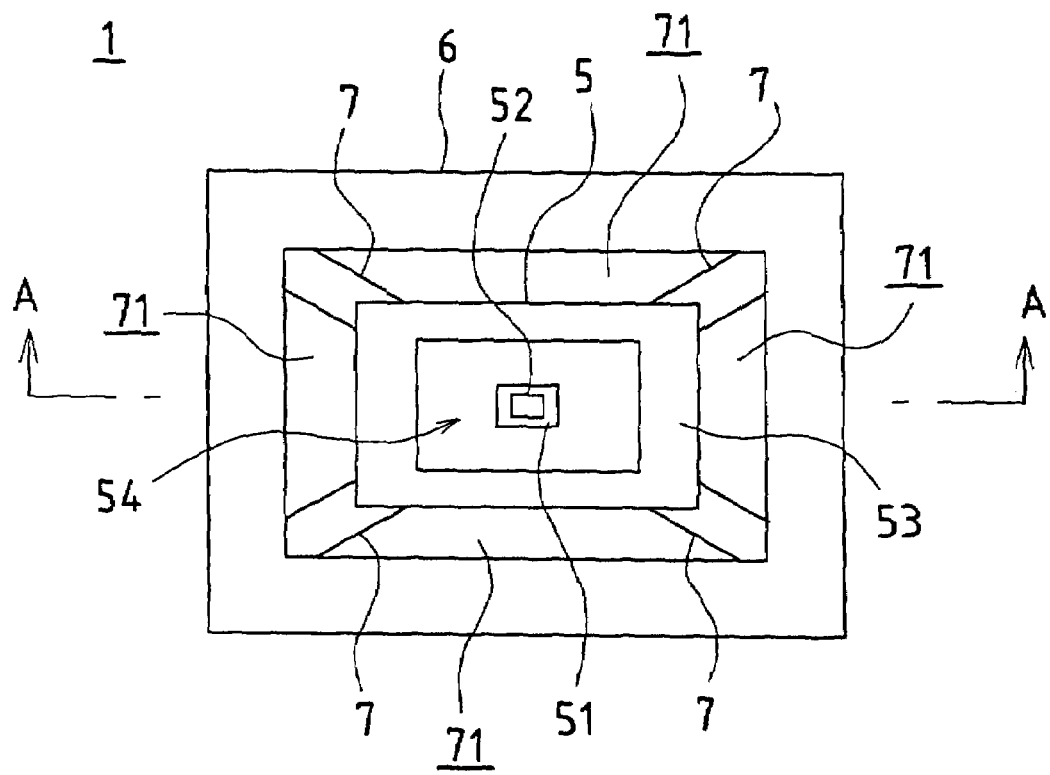
FIG. 12 is a plan view that shows a quartz wafer in accordance with a sixth embodiment of the present invention.
Figure 13:
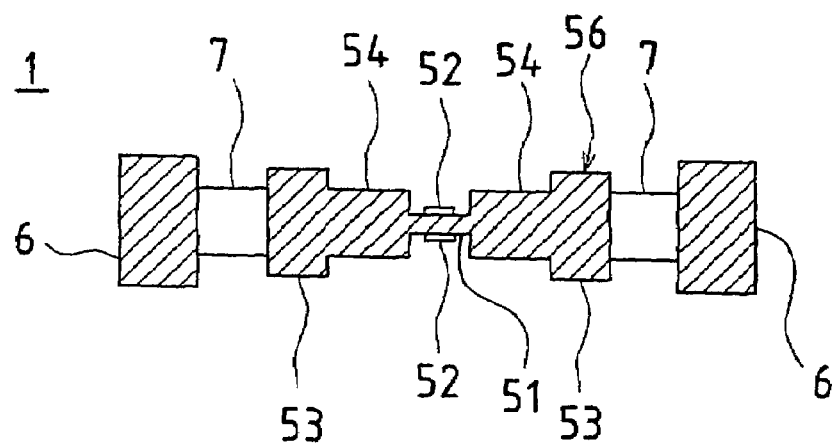
FIG. 13 is a cross-sectional view taken along line A-A of FIG. 12.
Figure 14:
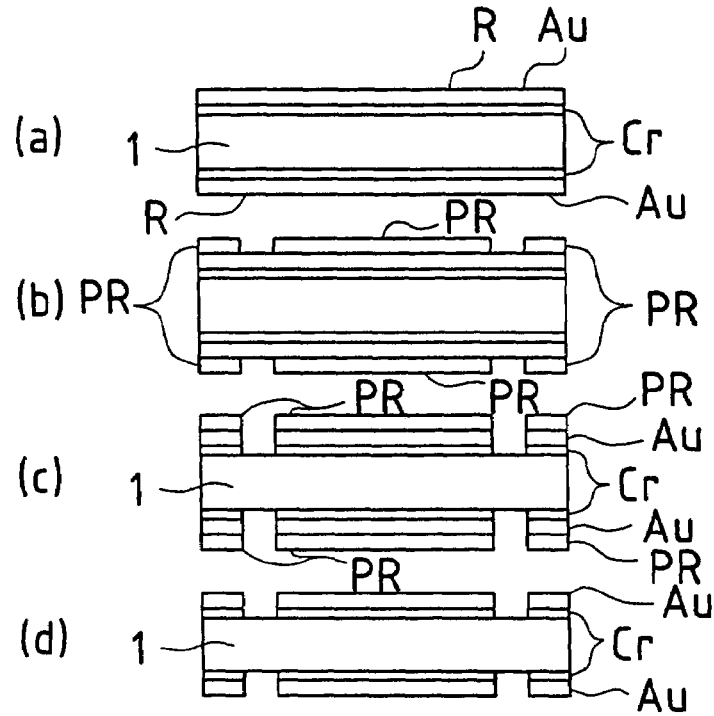
FIGS. 14(a) to 14(d) are drawings that show mask-layer forming processes in accordance with the sixth embodiment.
Figure 15:
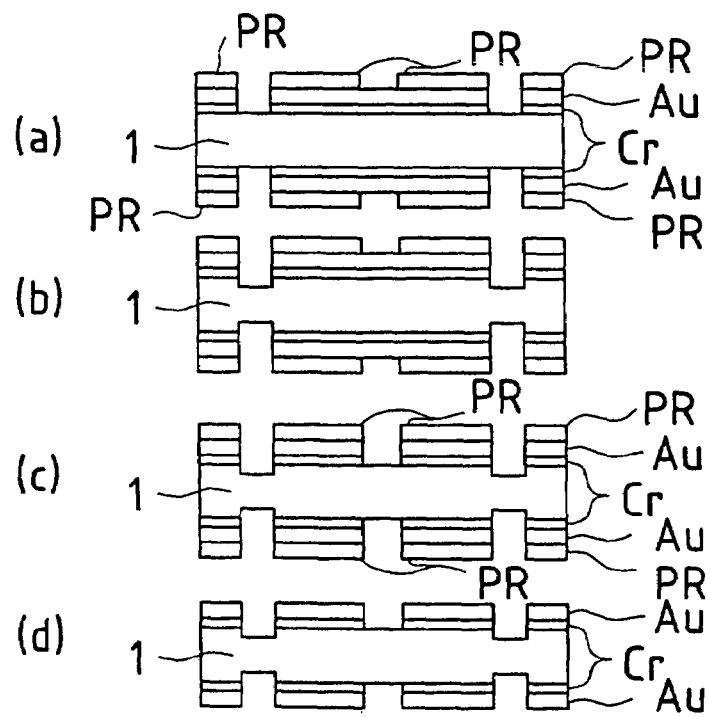
FIGS. 15(a) to 15(d) are drawings that show pre-etching processes in the sixth embodiment.
Figure 16:
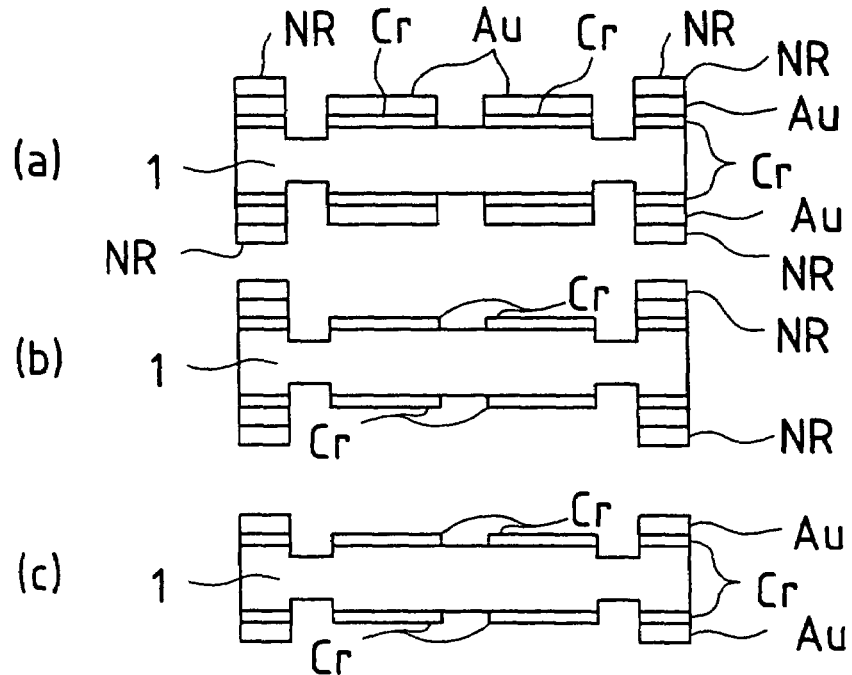
FIGS. 16(a) to 16(c) are drawings that show Au-removing processes in the sixth embodiment.
Figure 17:
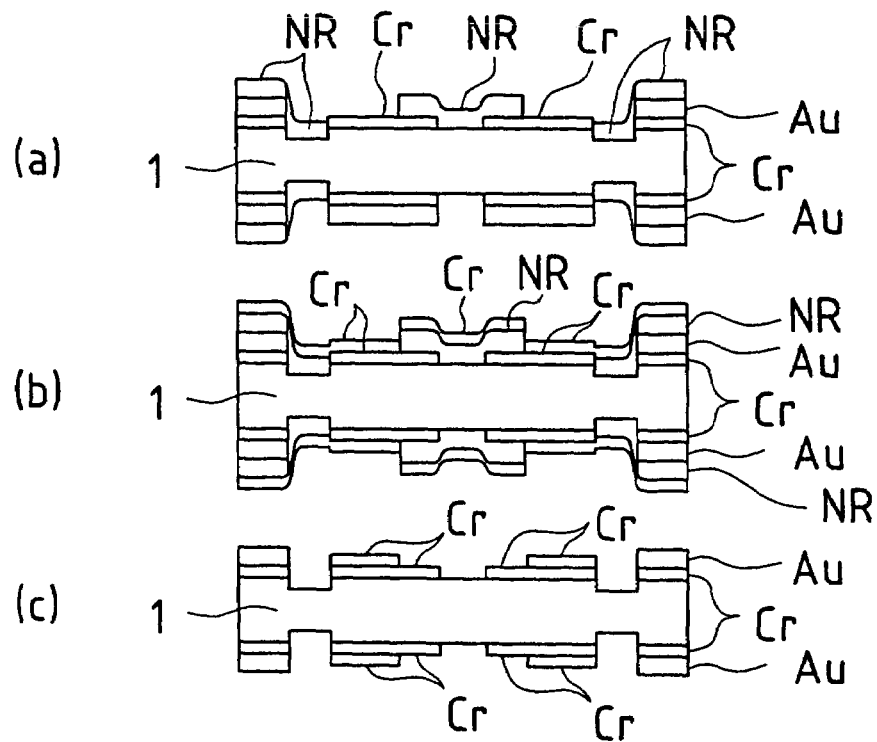
FIGS. 17(a) to 17(c) are drawing that shows lift-off processes in the sixth embodiment.
Figure 18:
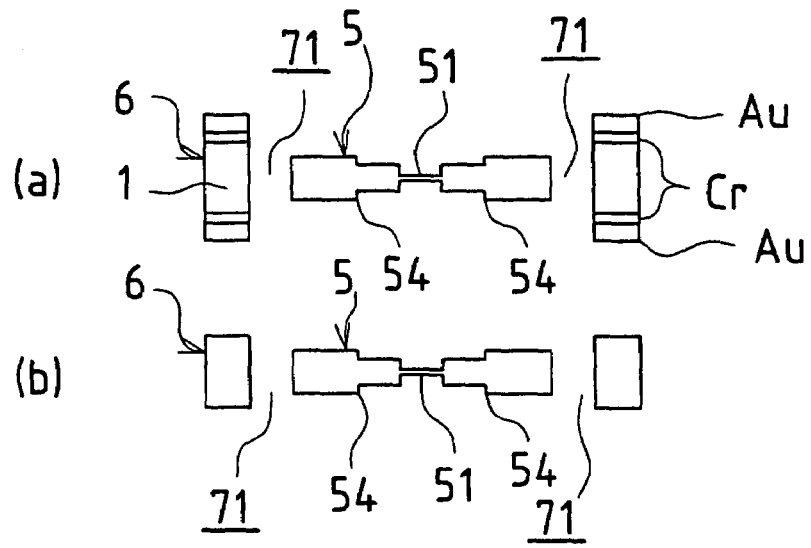
FIGS. 18(a) and 18(b) are drawings that show main etching processes in the sixth embodiment.

FIG. 12 is a plan view that shows a quartz wafer 1 in accordance with the sixth embodiment, and FIG. 13 is a cross-sectional view that is taken along line A-A of FIG. 12. As shown in FIGS. 12 to 13, the vibration unit 5 is formed so as to have a reversed mesa structure in the same manner as the quartz wafer 1 in accordance with the above-mentioned embodiments. More specifically, step portions 54 are placed on the upper and lower faces, and an exciter electrode 52 is attached to a piezoelectric vibration area 51 which is formed in the center thereof.

Here, the outer frame member 6, which is formed in a manner so as to surround the outer circumference of the vibration unit 5, is connected to the vibration unit 5 through four bridges 7. With this arrangement, the piezoelectric vibration area 51, which is located in the center of the vibration unit 5, is supported by not only a reinforcing portion 53 that is an outer edge of the vibration unit 5, but is also supported by the outer frame member 6 through the bridges 7. Thus, it is possible to ensure high mechanical strength. Moreover, the outer frame member 6 is a portion which is supported by the package of the quartz resonator through a bonding agent, and this portion and the vibration unit 53 are connected by only the bridges 7 so that, even in the event of a deformation such as warping due to solidification and shrinkage of the bonding agent, the vibration unit 5 is less susceptible to the influences of the deformation. Moreover, the connecting position between the vibration unit 5 and the outer frame member 6 through the bridges 7 is set to a position having a stress sensitivity of "0", with the stress sensitivity being allowed to have an angle of 30° with respect to the Z-axis (the axis extending laterally in FIG. 12) of the vibration unit 5. For this reason, even if an external force is exerted on the outer frame member 6 and transmitted to the vibration unit 5, hardly any adverse effects are given to the vibration characteristic.

Figure 19:
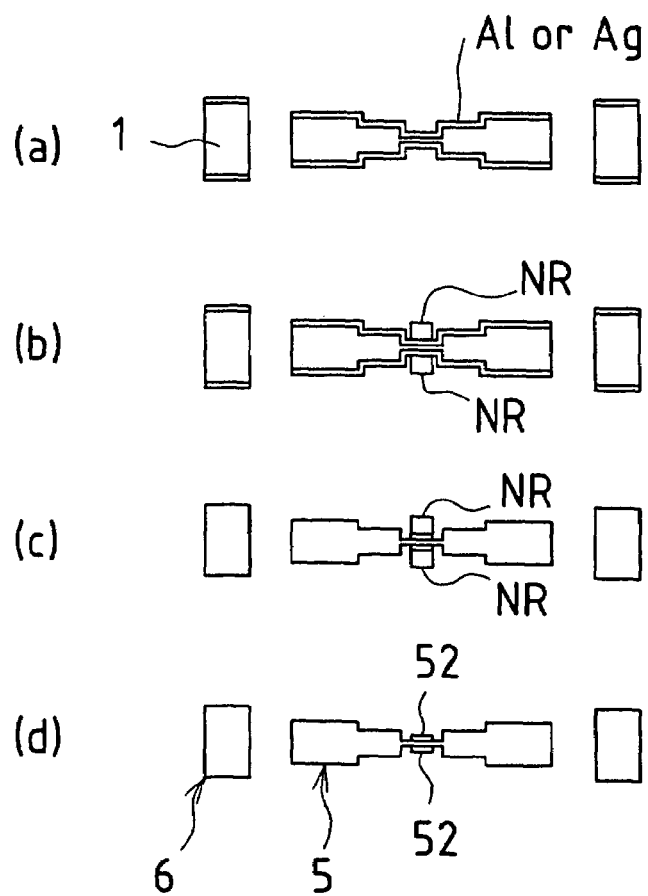
FIGS. 19(a) to 19(d) are drawings that show electrode-forming processes in the sixth embodiment.

The following description will now discuss a manufacturing method of the quartz wafer 1 in accordance with the sixth embodiment. FIGS. 14 to 19 show manufacturing processes of the quartz wafer 1. The manufacturing processes of the present quartz wafer 1 include: a resist film forming process (FIG. 14); a preliminary etching process (FIG. 15); an Au removing process (FIG. 16); a lift-off process (FIG. 17); a main etching process (FIG. 18); and an electrode-forming process (FIG. 19). The respective processes will be described below.

Resist Film Forming Process

In this process, first, a resist film R, which is made of a two-layer structure of Cr and Au, is vapor-deposited over the entire upper and lower faces of the quartz wafer 1 (FIG. 14(a)). Then, a resist film PR of a positive-working type (hereinafter, referred to as a positive resist film) is formed over the entire face except for a portion which is used for forming a through hole 71 that is located between the above-mentioned bridges 7 to be formed (FIG. 14(b)). In this state, respective etching processes are carried out by using an Au etching solution and a Cr etching solution so that the Au layer and the Cr layer at the position having no positive resist film PR are removed (FIG. 14(c)). Thereafter, the positive resist film PR is removed (FIG. 14(d)) so that the present mask layer forming process is completed.

Preliminary Etching Process

In this process, a positive resist film PR is formed over the entire upper and lower faces except for the portion from which Au and Cr have been removed (the portion in which the through hole 71 between the bridges 7 is formed) in the resist film forming process and the center portion of the quartz wafer 1 (the portion forming the piezoelectric vibration area 21) (FIG. 15(a)). Thereafter, this quartz wafer 1 is immersed into a quartz etching solution so as to carry out an etching process. Thus, as shown in FIG. 15(b), only the portion in which the through hole 71 between the bridges 7 is formed is etched by a predetermined amount. Next, respective etching processes are carried out by using an Au etching solution and a Cr etching solution so that Au and Cr at the position having no positive resist film PR are removed (FIG. 15(c)). Thereafter, the positive resist film PR is removed (FIG. 15(d)) so that the present preliminary etching process is completed.

Au Removing Process

In this process, a resist film NR of a negative-working type (hereinafter, referred to as a negative resist film) is formed over the entire upper and lower faces on a portion forming the outer frame member 6 (FIG. 16(a)). Thereafter, an etching process is carried out by using an Au etching solution so that Au at the position having no positive resist film NR is removed (FIG. 16(b)). Thereafter, the negative resist film NR is removed (FIG. 16(c)) so that the present Au removing process is completed.

Lift-Off Process

This process is carried out so as to form a step-shaped Cr layer which is used for forming a step-shaped recessed section in the center of the vibration unit 5. In other words, Cr is vapor-deposited on one portion of the Cr layer remaining on the quartz wafer 1 upon completion of the Au removing process so that a step-shaped Cr layer is formed. For this reason, first, a negative-working resist film NR is formed over the entire area except for this area in which Cr needs to be additionally vapor-deposited (FIG. 17(a)). In this state, Cr is vapor-deposited on the upper and lower faces of the quartz wafer 1 so that only the Cr layer having no negative-working resist film NR is formed as a thick layer (FIG. 17(b)). Then, the negative-working resist film NR is removed by a lift-off method (FIG. 17(c)), thereby completing the present lift-off process Au. Thus, mask layers to be used for etching processes of the present invention are formed.

Main Etching Process

This process is carried out in the same manner as the forming process of the recessed section explained above in the second embodiment. In other words, the etching process on the portion having no Cr layer on the upper and lower faces of the quartz wafer 1 is started earlier, and the etching process on the portion having a thin Cr layer is started with a slight delay. Moreover, the etching process is hardly carried out on the portion having a thick Cr layer. For this reason, in a state where the piezoelectric vibration area 51 has been etched to a predetermined thickness dimension, as shown in FIG. 18(b), only the bridges 7 are left between the vibration unit 5 and the outer frame member 6, and a step portion 54 having a step shape is formed on the vibration unit 5.

Electrode-Forming Process

In the present process, the electrode-forming process is carried out in the same manner as conventional processes. In other words, as shown in FIG. 19(a), after an electrode material (Al or Ag) has been vapor-deposited over the entire upper and lower faces of the quartz wafer 1, the electrode-forming portion and drawing electrode portion (not shown) of the piezoelectric vibration area 51 are coated with a negative resist film NR (FIG. 19(b)). Thereafter, as shown in FIG. 19(c), the electrode material is removed through etching, and by further removing the negative resist film NR as shown in FIG. 19(d), the electrode material is allowed to remain on only the piezoelectric vibration area 51 so that an exciter electrode 52 having a predetermined shape is formed.

As shown in FIGS. 12 and 13, a quartz wafer 1, which has a vibration unit 5 and a outer frame member 6 that is placed in a manner so as to surround the vibration unit 5 and is connected to the vibration unit 5 by the bridges 7, is formed.

As described above, in the present etching process of the quartz wafer 1, mask layers, which are formed on respective portions of the surface of the quartz wafer 1, are allowed to have different etching rates (thickness of Cr layers) so that a quartz wafer 1 having a step portion 54 is formed through an etching process of one time. Thus, it becomes possible to prevent surface roughness of the quartz wafer 1, etching failure and damages to a thin portion and the peripheral portion thereof, and, consequently, it becomes possible to provide a stable, high-quality quartz wafer 1. Here, the etching rates of the respective mask layers may be made different by using mask layers which are made of mutually different materials.

Here, with respect to the adjusting process of the basic frequency of the quartz wafer 1 formed into a predetermined shape, it is carried out by a dry etching process or the like after the above-mentioned etching process. Moreover, in the case when the adjusting operation of the basic frequency is available by carrying out only the above-mentioned etching processes, the quartz wafer 1 is completed simultaneously with the completion of the etching processes.

Here, the quartz wafer 1 of the present invention is formed so as to have a reversed mesa structure in its center portion 56 as described above. For this reason, this center portion 56 is inherently provided with high mechanical strength so that it is possible to suppress influences of external forces, etc., which are applied to the piezoelectric vibration area 51. Moreover, the outer frame member 6 is connected to the peripheral side of the center portion 56 through the bridges 7. Therefore, it is possible to provide a bonding position of the quartz wafer 1 to the package of the quartz resonator as the frame member 6. Thus, even if a stress is exerted by curing shrinkage of the bonding agent, the influences of this stress is stopped by the outer frame member 6 and the influences hardly reach the piezoelectric vibration area 51 of the center portion 56. Moreover, even if the external force is exerted on the outer frame member 6, the external force is hardly transmitted further to the piezoelectric vibration area 51 of the center portion 56. For this reason, it is possible to avoid variations in the resonance frequency of the quartz wafer 1 due to the stress or the like, and consequently, it is possible to maintain desired frequency characteristics. Moreover, this structure provides double frame members constituting the reinforcing portion 53 and the outer frame member 6 that are located outside the piezoelectric vibration area 51, thereby making it possible to provide very high mechanical strength.

Figure 20:
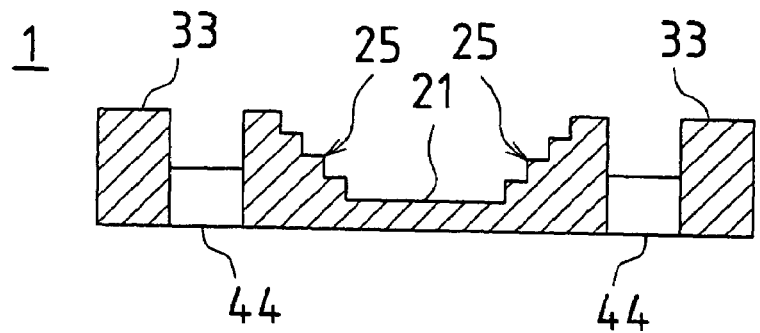
FIG. 20 is a cross-sectional view of a quartz wafer in a modified example of the sixth embodiment.

Moreover, since the step portion 54 is formed between the piezoelectric vibration area 51 and the reinforcing portion 53 so that even when a stress is exerted on the reinforcing portion 53, this is easily alleviated so that it is possible to avoid a local stress concentration. Moreover, for example, as shown in FIG. 20, the number of steps of the step portions 25 is increased with the respective step differences being set to be smaller so that, when the drawing electrode is formed along the surface of each step portion 25, it is possible to make the electrode film thinner while avoiding disconnection (cut in the electrode film) of the drawing electrode.

Seventh Embodiment

The following description will discuss a seventh embodiment of the present invention. The seventh embodiment is a modified example of the shape of the center portion 32, and the other arrangements are the same as those of the above-mentioned sixth embodiment. Therefore, explanations will be given of only the points that are different from the sixth embodiment.

Figure 21:
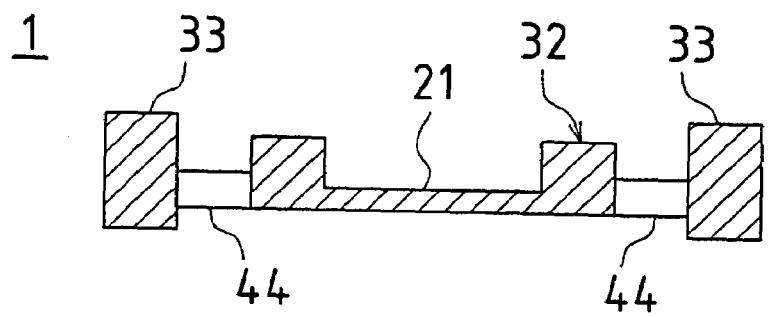
FIG. 21 is a cross-sectional view that shows a quartz wafer in accordance with a seventh embodiment of the present invention.

FIG. 21 is a cross-sectional view of a quartz wafer 1 in accordance with the seventh embodiment. As shown in FIG. 21, the quartz wafer 1 of the seventh embodiment has the thickness dimension of its center portion 32 set to be smaller than the thickness dimension of an outer frame member 33. Moreover, the respective upper and lower faces of the center portion 32 are located on the sides which are closer to the center in the thickness direction from the upper and lower faces of the outer frame member 33. In other words, the respective positions of the upper and lower faces of the center portion 32 are set at positions that retreat from the positions of the respective upper and lower faces of the outer frame member 33.

In accordance with this arrangement, when the quartz wafer 1 is placed inside the package, only the outer frame member 33 is allowed to contact the package inner face with the center portion 32 being in a floating state. For this reason, it is possible to avoid the situation that the vibration of the main vibration unit 21 is intervened by the package, and consequently, it is possible to allow the main vibration unit 21 to vibrate preferably.

Eighth Embodiment

Figure 22:
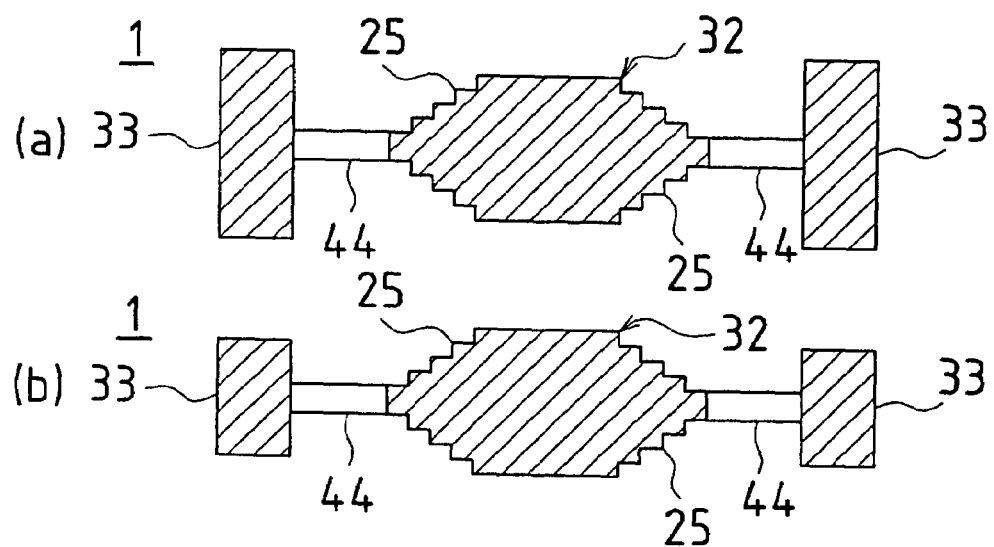
FIGS. 22(a) and 22(b) are cross-sectional views that show a quartz wafer in accordance with an eighth embodiment of the present invention.

The following description will discuss an eighth embodiment of the present invention. In the above-mentioned respective embodiments, the center portion 32 is set so as to have the reversed mesa structure. In the eighth embodiment, the center portion 32 is allowed to have a mesa structure. In other words, as shown in FIG. 22(a), the center portion 32 has an arrangement in which the center portion 32 is designed so as to have a shape with the thickness dimension of the center being greater than the thickness dimension of the outer edge. Moreover, in the eighth embodiment, a step portion 25 having a step shape is formed on the outer circumferential portion of the center portion 32. Thus, even when a stress is exerted on the center portion 32, the step portion 25 makes it possible to easily alleviate the stress, and consequently, it is possible to avoid the local stress concentration. Moreover, according to this arrangement, by setting the step difference of the step portions 25, it is possible to make the electrode film thinner while avoiding disconnection (cut of the electrode film) of the drawing electrode when the drawing electrode is formed along the surface of each step portion 25. Moreover, in an arrangement shown in FIG. 22(a), in the same manner as that of the second embodiment, the thickness dimension of the center portion 32 of the quartz wafer 1 is set to be smaller than the thickness dimension of the outer frame member 33, and the respective upper and lower faces of the center portion 32 are located on the sides which are closer to the center in the thickness direction from the upper and lower faces of the outer frame member 33. In other words, the respective positions of the upper and lower faces of the center portion 32 are set at positions that retreat from the positions of the respective upper and lower faces of the outer frame member 33. Thus, when the quartz wafer 1 is placed inside the package, only the outer frame member 33 is allowed to contact the package inner face.

Moreover, with respect to a quartz wafer 1 shown in FIG. 22(b) serving as a modified example of the eighth embodiment, in an arrangement in which the center portion 32 is set to have a mesa structure with a step portion 25 having a step shape being formed on the outer circumferential portion of the center portion 32, the thickness dimension of the center portion 32 of the quartz wafer 1 is set to be greater than the thickness dimension of the outer frame member 33 of the center portion 32 of the quartz wafer 1. Here, the respective upper and lower faces of the center portion 32 are positioned on outer sides in the thickness direction from the respective upper and lower faces of the outer frame members 33. With this arrangement, for example, when a plurality of quartz wafers 1 are mutually superposed and installed on the package, the adjacent outer frame members 33 are mutually bonded to each other, and by appropriately adjusting the height of this bonding area, the height dimension of the entire quartz wafers 1 is limited to a minimum level which is required (the height dimension is minimized as small as possible, without allowing the center portions 32 to contact each other), thereby making it possible to miniaturize the package.

Ninth Embodiment

The following description will discuss a ninth embodiment of the present invention. In the ninth embodiment, an arrangement, which blocks transmission of vibration wave from the outer frame member 33 to the center portion 32, is adopted, and the other arrangements thereof are the same as those of the sixth embodiment. Therefore, the following description will discuss only points that are different from the sixth embodiment.

Figure 23:
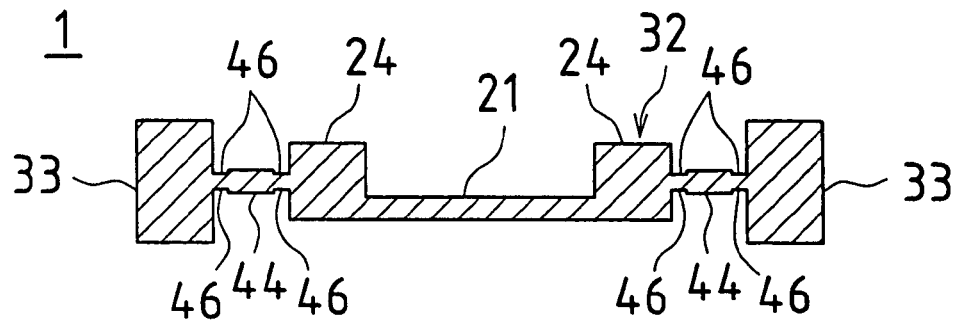
FIG. 23 is a cross-sectional view that shows a quartz wafer in accordance with a ninth embodiment of the present invention.

FIG. 23 shows a cross-sectional view (cross-sectional view at an installation position of the bridge 44). As shown in FIG. 23, in the ninth embodiment, a quartz wafer 1 is provided with recessed sections 46 that serve as discontinuous sections between the surface of the outer frame member 33 and the surface of the bridges 44 as well as between the surface of the center unit 32 and the surface of the bridges 44. In this arrangement, these recessed sections 46 make it possible to block transmission of surface waves, and consequently, make it possible to prevent these surface waves from transmitting from the surface of the outer frame member 33 to the surface of the bridges 44 as well as from the surface of the bridges 44 to the surface of the center portion 32. In other words, it is possible to avoid the situation that these surface waves are transmitted to the main vibration unit 21 through the outer frame member 33 and the bridges 44 to cause adverse effects on the vibration of the main vibration unit 21.

Furthermore, in addition to the above-mentioned respective embodiments, since discontinuous faces (which are made discontinuous by step portions) are placed between the surface of the outer frame member 33 and the surface of the bridge 44 as well as between the surface of the center portion 32 and the surface of the bridge 44, this structure also prevents transmission of the surface wave vibration to a certain degree.

In the structure shown in FIG. 23, the above-mentioned recessed sections 46 are formed in an arrangement in which the height levels between the surface of the outer frame member 33 and the surface of the bridge 44 as well as the height levels between the surface of the center portion 32 and the surface of the bridge 44 are made mutually to be different from each other. The ninth embodiment, however, is limited to this structure, and the above-mentioned recessed sections 46 may be formed in an arrangement in which the height levels between the surface of the outer frame member 33 and the surface of the bridge 44 as well as the height levels between the surface of the center portion 32 and the surface of the bridge 44 are set to the same height level, that is, formed as the continuous faces. This arrangement also makes it possible to prevent transmission of the surface waves.

Moreover, in an arrangement shown in FIG. 23, the thickness dimension of the bridge 44 is set to an extremely small value in comparison with the respective thickness dimensions of the outer frame member 33 and the reinforcing portion 24 of the center portion 32. In accordance with this arrangement, since the cross-sectional area of the bridge 44 is set to a small value, it is possible to narrow the transmission path of bulk waves that are transmitted from the outer frame member 33 to the center portion 32 through the bridge 44. Thus, it becomes possible to suppress the transmission of these bulk waves, and consequently, it becomes possible to eliminate one of the causes that give adverse effects on the vibration of the main vibration unit 21. Moreover, the difference in the height levels of the bridge 44 and the main vibration unit 21 makes it possible to suppress the transmission of bulk waves from the bridge 44 to the main vibration unit 21. Moreover, by setting the width dimension of the bridge 44 to an extremely small value, the transmission path of bulk waves may also be narrowed so that it is possible to eliminate one of the causes that give adverse effects on the vibration of the main vibration unit 21.

Tenth Embodiment

Figure 24:
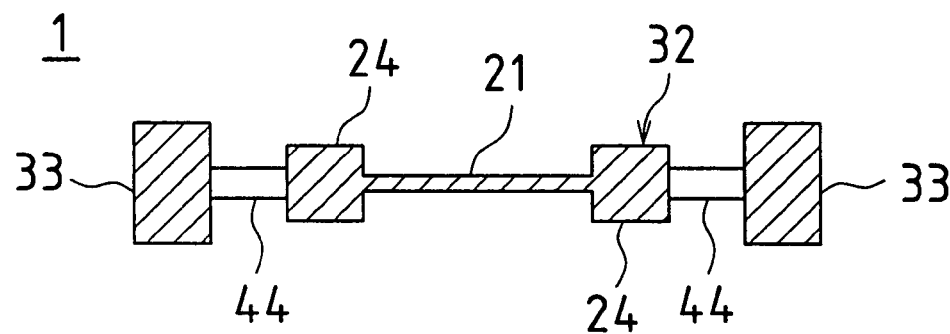
FIG. 24 is a cross-sectional view that shows a quartz wafer in accordance with a tenth embodiment of the present invention.

The following description will discuss a tenth embodiment of the present invention. FIG. 24 is a cross-sectional view of a quartz wafer 1 in accordance with the tenth embodiment. As shown in FIG. 24, the quartz wafer 1 of the tenth embodiment is provided with a center portion 32 having a reversed mesa structure with the main vibration unit 21 being positioned in virtually the center portion of the reinforcing portion 24 in the thickness direction. With this arrangement, the quartz wafer 1 is formed so as to have a symmetrical shape with respect to its surface and rear surface. Therefore, upon placing the quartz wafer 1 into the package, it is possible to eliminate the necessity of carrying out the operation while recognizing the surface and rear surface of the quartz wafer 1, and consequently to improve the workability of the assembling process to the package.

Eleventh Embodiment

Figure 25:
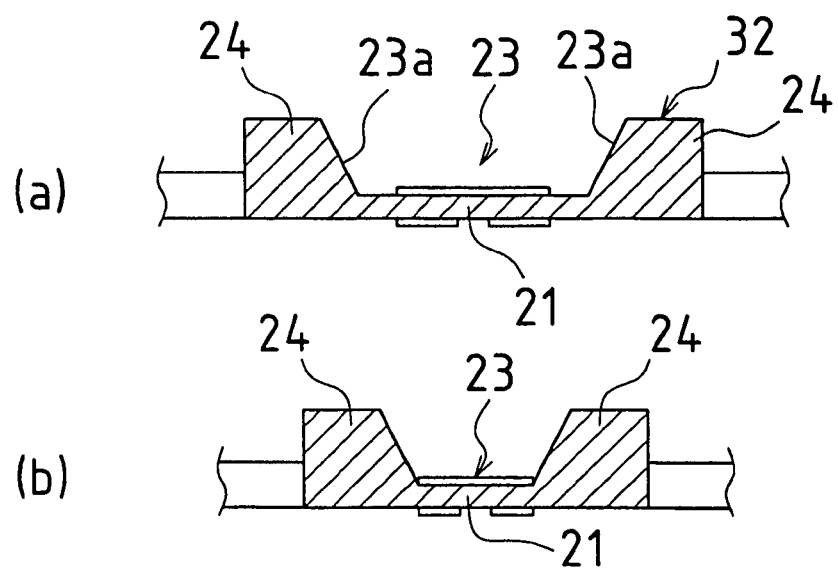
FIGS. 25(a) and 25(b) are cross-sectional views of a quartz wafer that explain a problem to be solved by an eleventh embodiment of the present invention.

The following description will now discuss an eleventh embodiment of the present invention. In the case when, upon forming a quartz wafer 1 of the reversed mesa type through the above-mentioned etching processes, the etching amount is comparatively great, a longitudinal wall 23a of the recessed section 23, which is formed by the etching processes, tends to be formed as a slanting face which slants toward the center of the center portion 32, as shown in FIG. 25(a). For this reason, in an attempt to miniaturize the quartz wafer 1 as shown in FIG. 25(b), it is not possible to maintain a sufficient area for allowing the main vibration unit 21 to vibrate with the result that the main vibration unit 21 is subjected to a holding force of the reinforcing portion 24 and the resulting degradation in resonance characteristics. The eleventh embodiment has been devised to solve this problem.

Figure 26:
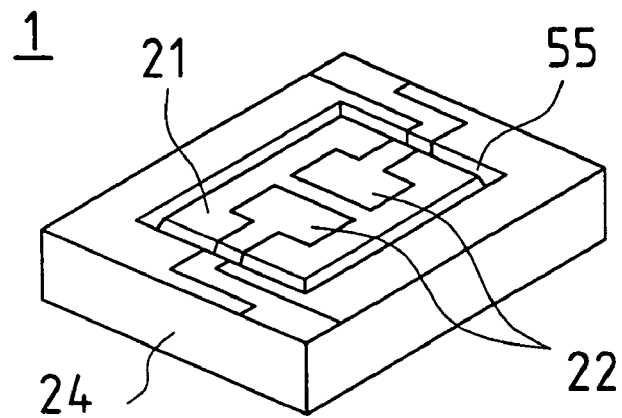
FIG. 26 is a perspective view of the quartz wafer in accordance with the eleventh embodiment when viewed from the lower surface side.
Figure 27:
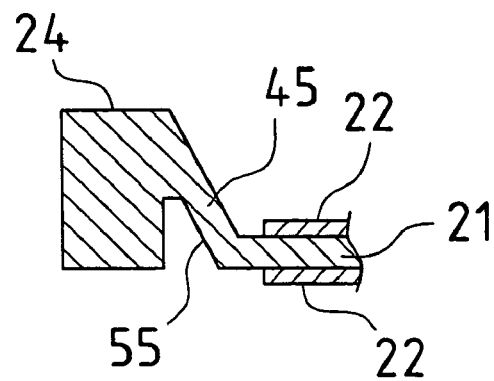
FIG. 27 is a cross-sectional view that shows a connecting portion between a main vibration portion and a reinforcing portion of the quartz wafer in accordance with the eleventh embodiment.

FIG. 26 is a perspective view which is obtained when only the center portion 32 of the quartz wafer 1 in accordance with the eleventh embodiment is viewed from the lower face side. FIG. 27 is a cross-sectional view that shows a connecting portion between the main vibration unit 21 and the reinforcing portion 24. As shown in FIGS. 26 and 27, the quartz wafer 1 of the eleventh embodiment is provided with a buffering portion 45 which is placed between the main vibration unit 21 and the reinforcing portion 24 of the center portion 32 with a thickness dimension that is virtually coincident with the thickness dimension of the main vibration unit 21 so that the buffering portion 45 connects the main vibration unit 21 and the reinforcing portion 24.

More specifically, with respect to the connecting portion between the main vibration unit 21 and the reinforcing portion 24, a groove 55, which is opened on the lower surface side thereof, is formed along all the circumference of the center portion 32, and this arrangement forms the buffering portion 45 that extends diagonally upward from the main vibration unit 21 to the reinforcing portion 24. With this arrangement, the main vibration unit 21 is allowed to vibrate without receiving a holding force from the reinforcing portion 24 so that it is possible to eliminate degradation in the resonance characteristics.

Figure 28:
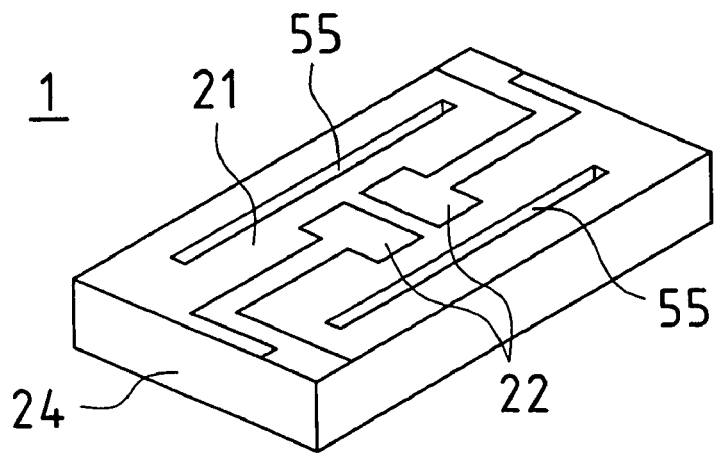
FIG. 28 is a perspective view of the quartz wafer in accordance with a modified example of the eleventh embodiment when viewed from the lower surface side.

Moreover, in a modified example of this embodiment, the groove 55 may be formed only in the length direction of the quartz wafer 1, as shown in FIG. 28.

Figure 29:
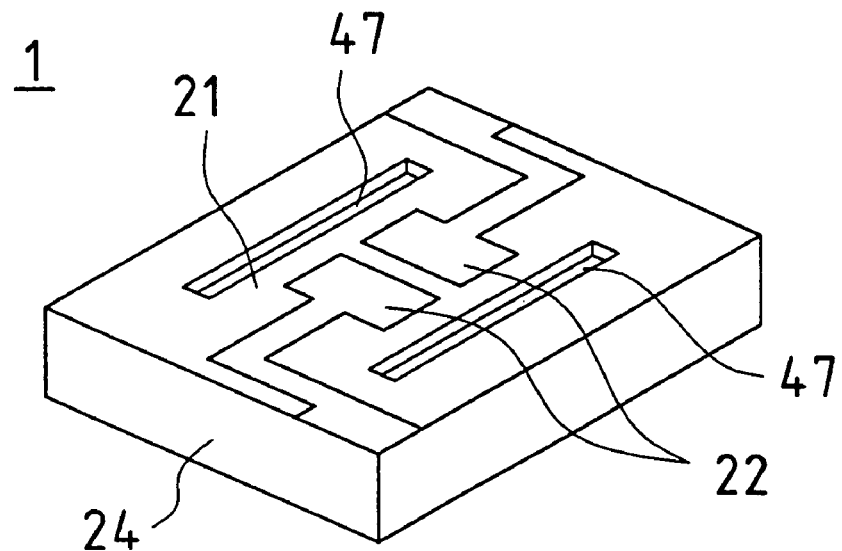
FIG. 29 is a perspective view of the quartz wafer in accordance with another modified example of the eleventh embodiment when viewed from the lower surface side.
Figure 30:
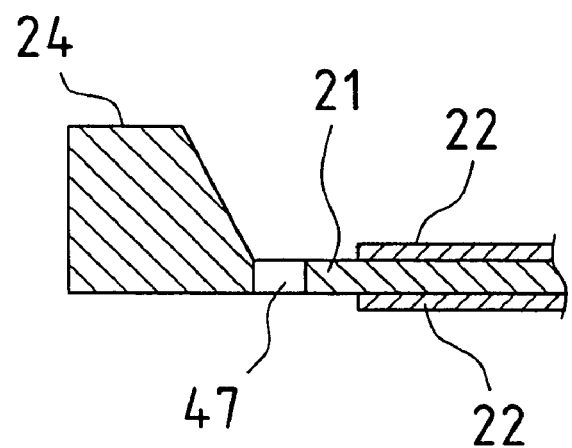
FIG. 30 is a drawing corresponding to FIG. 27 in accordance with another modified example of the eleventh embodiment.

Furthermore, as shown in FIG. 29 (a perspective view which is obtained when the quartz wafer 1 is viewed from the lower surface side) and FIG. 30 (a cross-sectional view of a connecting portion between the main vibration unit 21 and the reinforcing portion 24), in place of the groove 51, a through hole 47 may be formed. In other words, by partially cutting and separating the main vibration unit 21 and the reinforcing portion 24, the main vibration unit 21 is allowed to vibrate without receiving a holding force of the reinforcing portion 24.

Here, the above-mentioned structures may be combined with each other. In other words, one portion of the connecting portion between the main vibration unit 21 and the reinforcing portion 24 is formed as the buffering portion 45, with the other portion being cut and separated.

Twelfth Embodiment

The following description will discuss a twelfth embodiment of the present invention. The twelfth embodiment relates to an applied example of a technique in which the thickness dimensions of the respective portions of the quartz wafer 1 are desirably set by utilizing differences in the etching rate in the mask layers as described in the above-mentioned embodiments.

The following description will exemplify a case in which the technical idea of the present invention is applied to the manufacturing technique of the tuning-fork-type quartz resonator.

Figure 31:
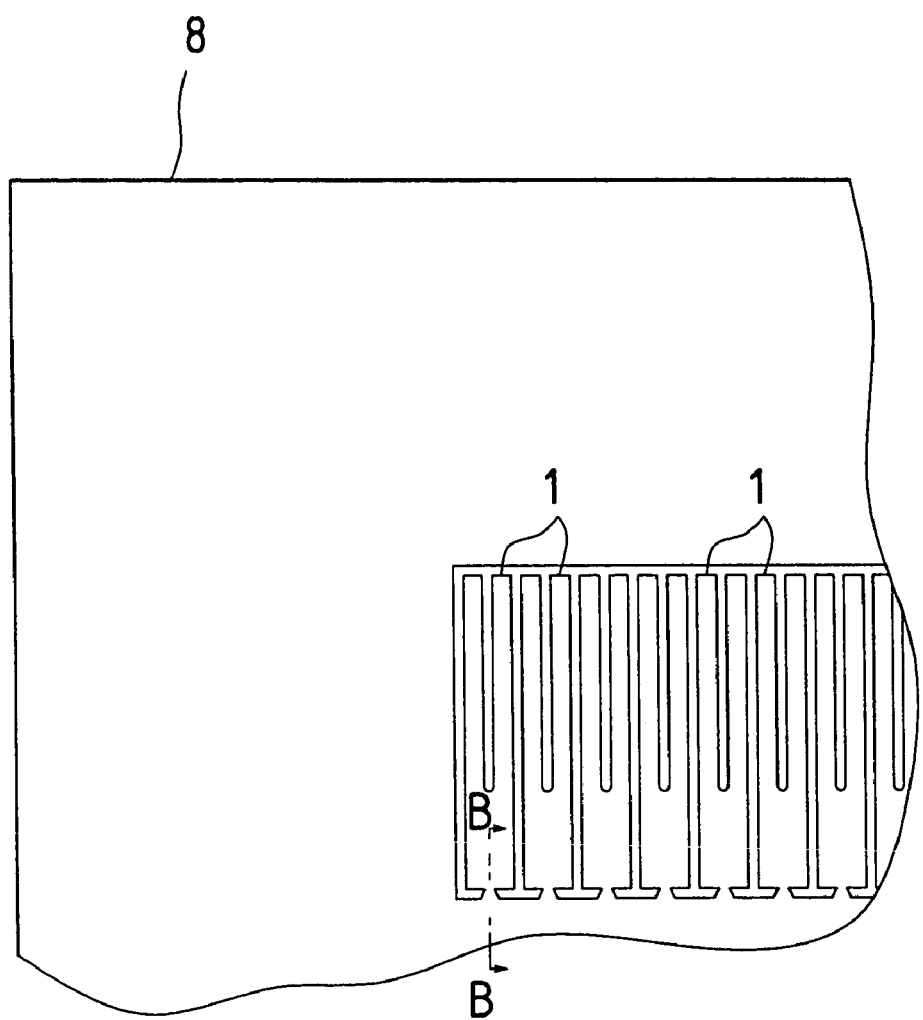
FIG. 31 is a plan view that shows a quartz base plate in accordance with a twelfth embodiment of the present information.
Figure 50:
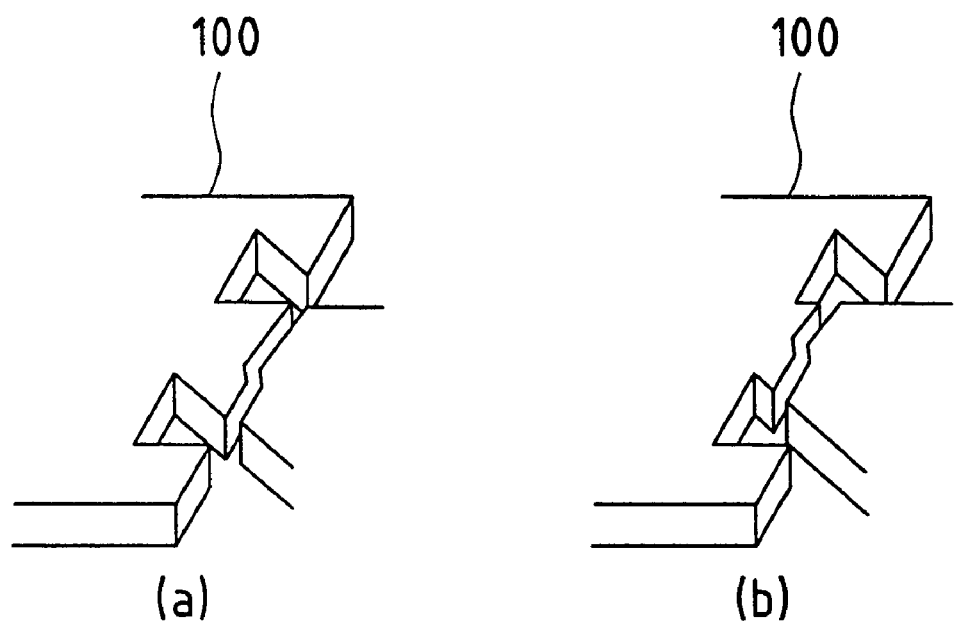
FIGS. 50(a) and 50(b) are drawings that show examples of separated states of a quartz wafer of a tuning-fork-type quartz resonator in accordance with a conventional example.
Figure 51:
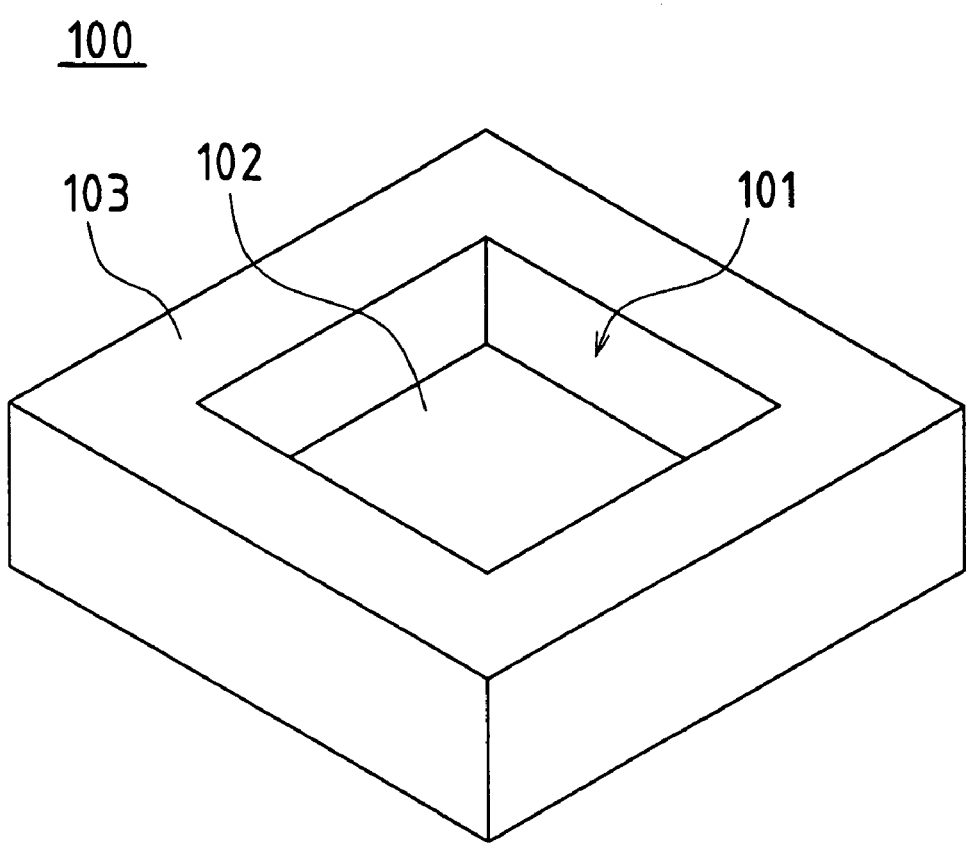
FIG. 51 is a perspective view of the quartz wafer in accordance with the conventional example.
Figure 54:
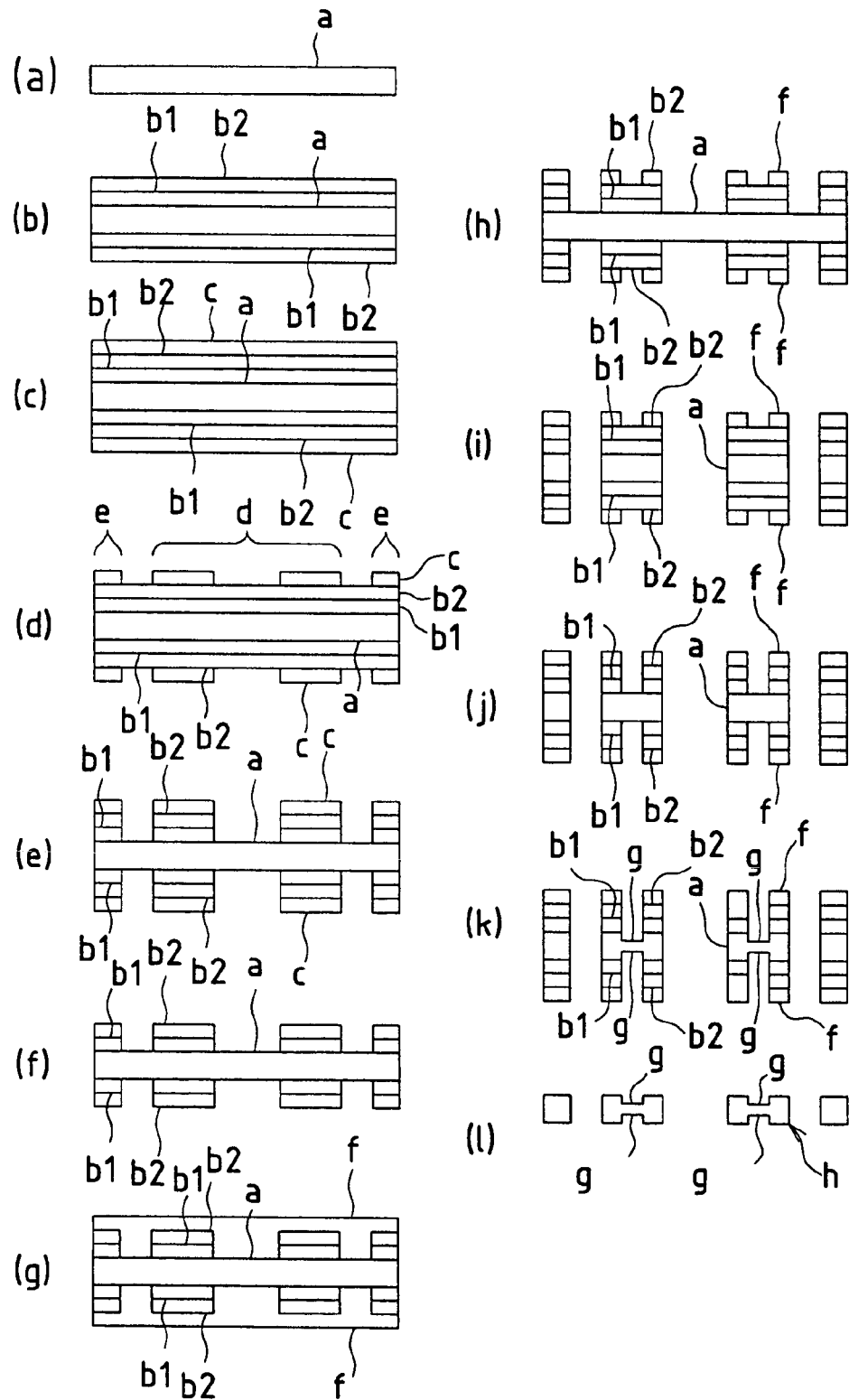
FIGS. 54(a) to 54(l) are drawings that show forming processes of a tuning-fork-type quartz wafer in accordance with a conventional technique.
Figure 56:
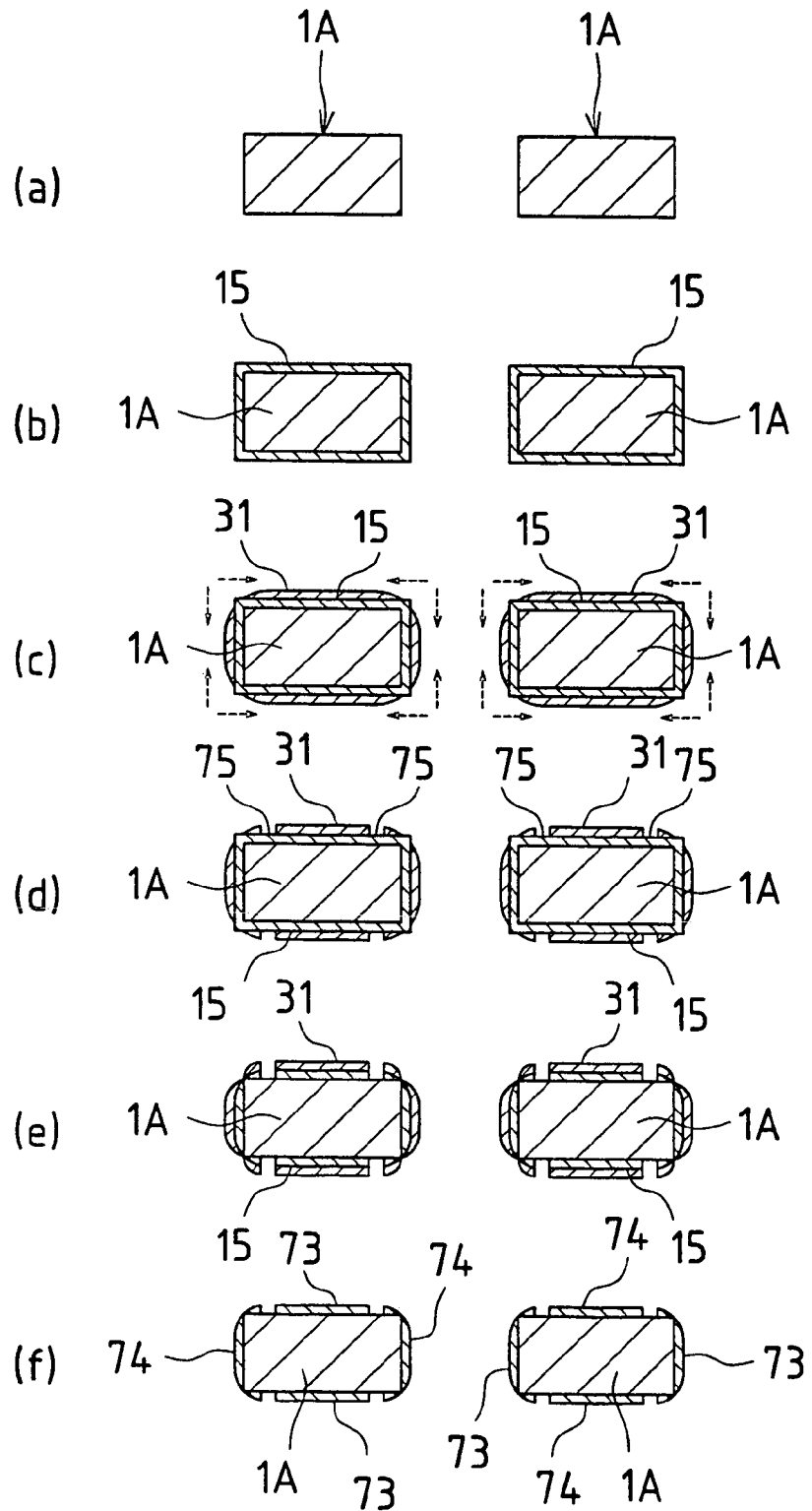
FIGS. 56(a) to 56(f) are drawings that correspond to FIG. 40 in the conventional example.
Figure 57:
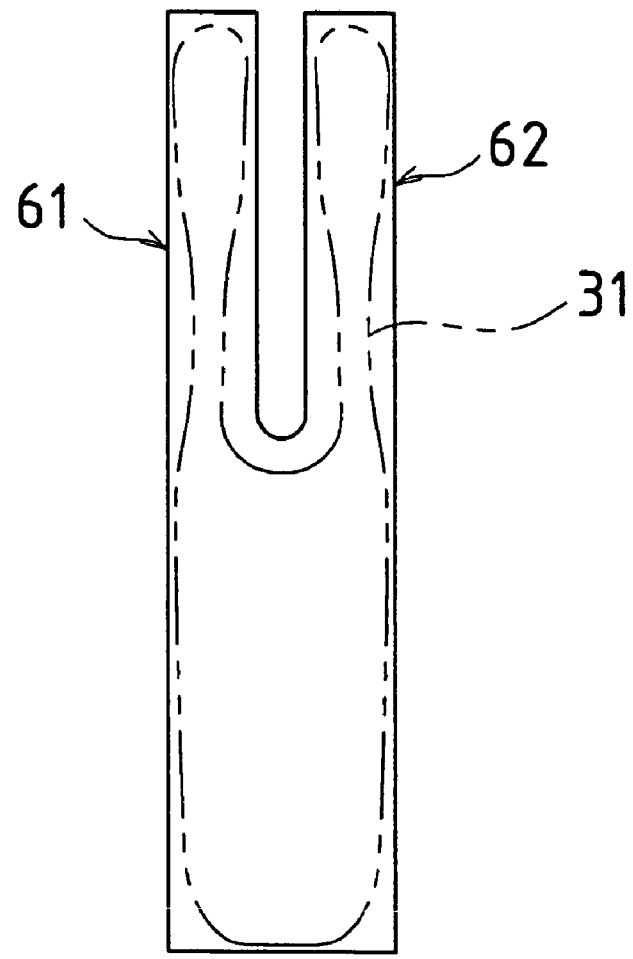
FIG. 57 is a drawing that shows a coated state of resist solution on the quartz wafer of the conventional example.

As shown in FIG. 31, a number of quartz wafers to be used for the tuning-fork-type quartz resonator are simultaneously formed from one sheet of a quartz base plate 8. In this case, when the individual tuning-fork-type quartz wafers 1 are cut and separated from the quartz base plate 8, the base portion of each quartz wafer 1, which is a connecting portion of the two members, is cut off. At this time, as shown in FIGS. 50(a) and 50(b), in the case when there is an offset in the cutting position, the resulting problems are that the corresponding quartz wafer 100 is not housed in the package and that, even when the quartz wafer 100 is housed therein, the quartz wafer 100 is not assembled at a predetermined position. Moreover, in the conventional arrangement, there is a possibility that upon cutting, broken pieces of quartz tend to be generated and such broken pieces tend to adhere to the surface of the quartz wafer 100, which results in adverse effects on the vibration characteristics. In the twelfth embodiment, the technique of the present invention is applied so that, upon cutting the base portion of the quartz wafer 100, the cutting process can be carried out at an appropriate position without causing broken pieces. The following description will discuss the twelfth embodiment in detail.

Figure 32:
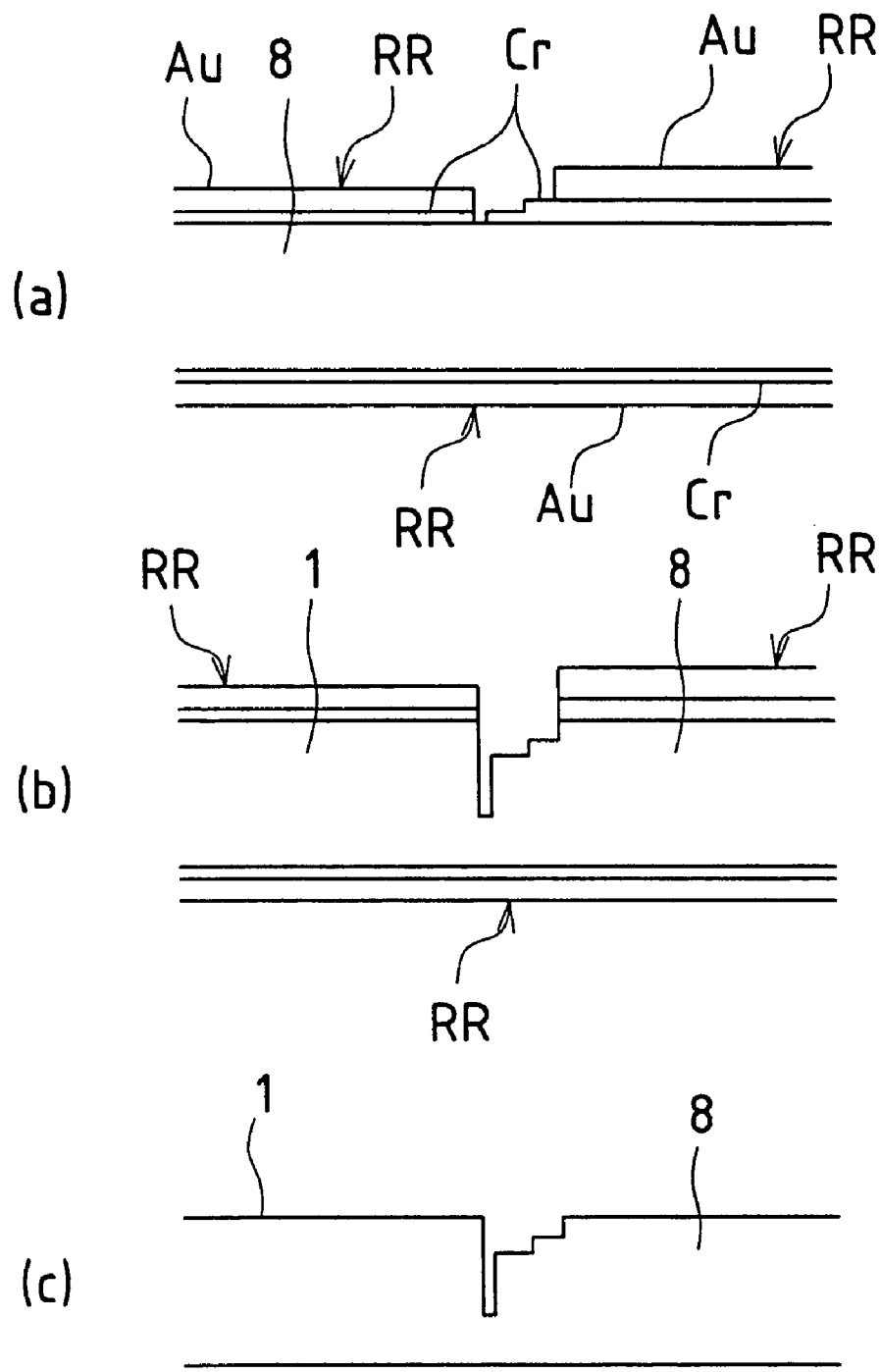
FIGS. 32(a) to 32(c) are drawings that show machining processes of a quartz wafer in the twelfth embodiment.

FIG. 32(a) is a cross-sectional view that shows a preliminary stage of a manufacturing process in which a tuning-fork-type quartz wafer 1 is formed by carrying out etching processes on a quartz base plate 8, and also shows a base portion of the tuning-fork-type quartz wafer 1 (cross-sectional view taken along line B-B of FIG. 31). As shown in FIG. 32(a), a portion without a mask layer RR and a portion having a mask layer RR which is made of a step-shaped Cr layer are preliminarily formed on the base portion of the tuning-fork-type quartz wafer 1. With respect to the other portions, a mask layer (resist film) which is made of two layers of Cr and Au is formed in such an area that a predetermined tuning-fork shape is formed through etching.

Thus, as shown in FIG. 32(b), at the time of an etching process of the quartz base plate 8, etching is allowed to progress at the portion without the mask layer RR so that the thickness dimension of the quartz wafer 1 becomes extremely thinner at the corresponding portion. In contrast, at the portion having the mask layer RR which is made of a step-shaped Cr layer, the thickness dimension of the quartz wafer 1 becomes thicker in the form of steps. For this reason, as shown in FIG. 32(c), upon cutting the individual tuning-fork-type quartz wafers 1 off from the quartz base plate 8 after the removal of the mask layer RR, this thinner portion of the base portion is cut off desirably without causing any broken pieces. Thus, it becomes possible to desirably assemble the quartz wafer 1 into the package, and it also becomes possible to avoid adverse effects that might be given to the vibration characteristics due to the presence of broken quartz pieces.

Figure 33:
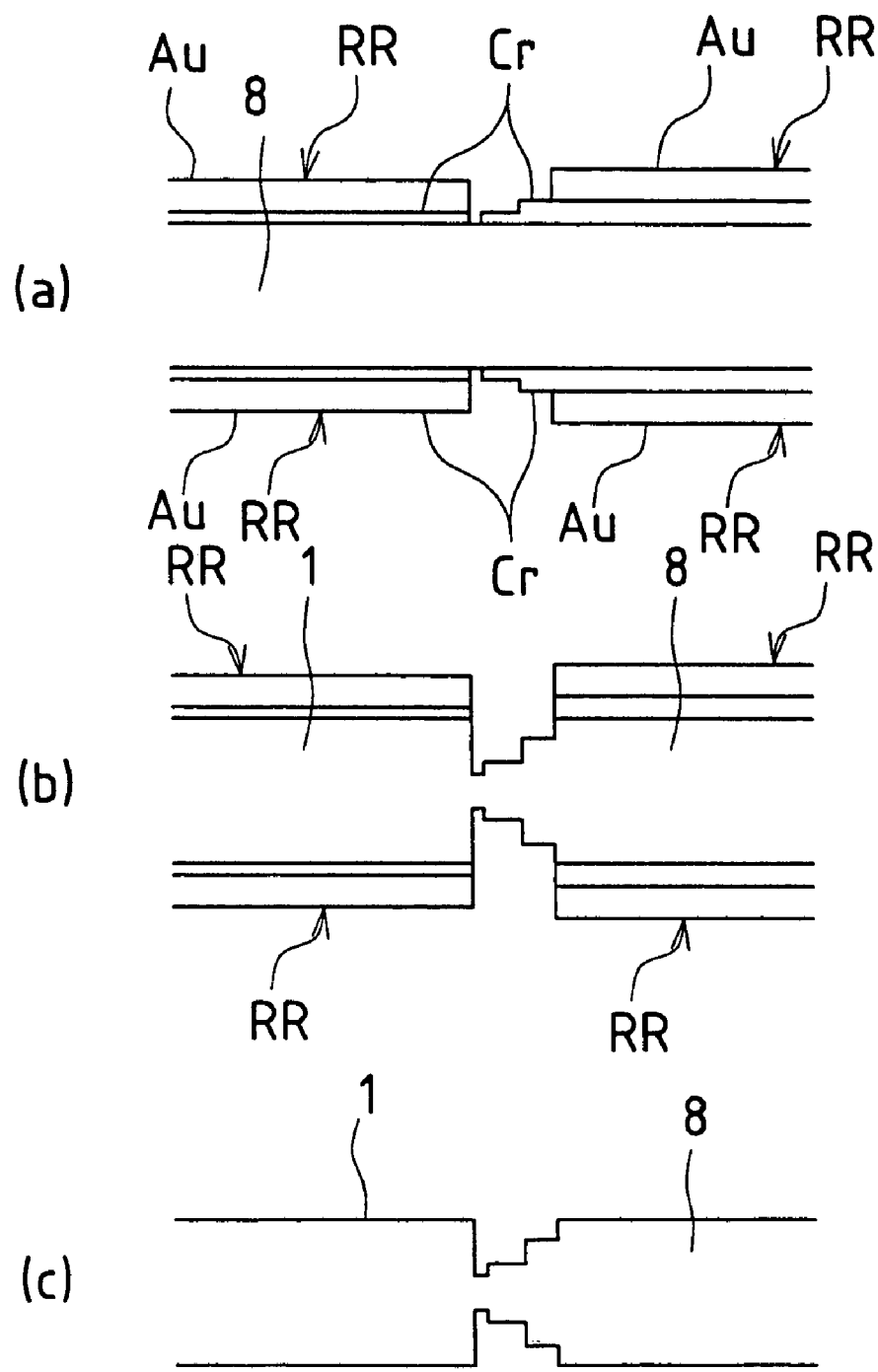
FIGS. 33(a) to 33(c) are drawings that show machining processes of a quartz wafer in a modified example of the twelfth embodiment.

FIG. 33 shows an arrangement in which a step-shaped Cr layer which is formed on the base portion of the tuning-fork-type quartz wafer 1 is formed on each of the upper and lower faces of the quartz base plate 8 so that, in this arrangement, etching is carried out on the base portion on both of the upper and lower sides so as to form a local thinner portion. In this arrangement, it also becomes possible to desirably cut the thinner portion of the base portion without causing broken pieces.

Figure 34:
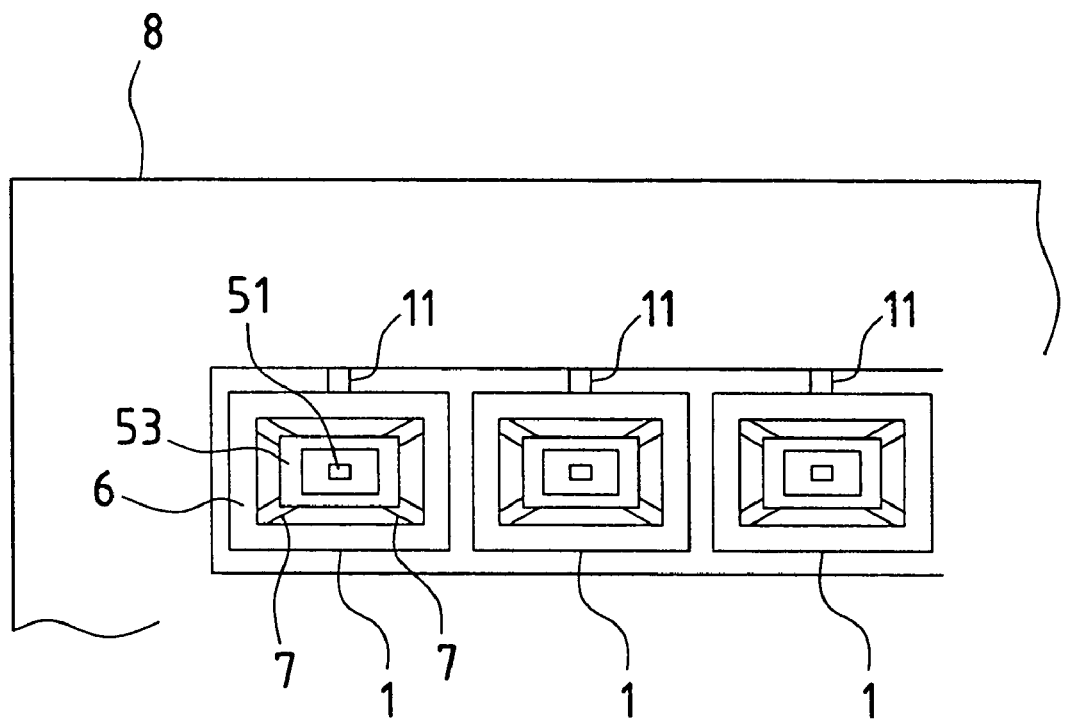
FIG. 34 is a drawing corresponding to FIG. 31 which shows a case in which the machining technique in the twelfth embodiment is applied to the manufacturing process of the quartz wafer in accordance with the sixth embodiment.

The twelfth embodiment has exemplified a case in which the present invention is applied to a technique for cutting each tuning-fork-type quartz wafer 1 from the quartz base plate 8. In the case when this technical idea is applied to, for example, the manufacturing process of the quartz wafer 1 relating to the above-mentioned sixth embodiment, as shown in FIG. 34, the connecting portion 11 for connecting the quartz wafer 1 to the quartz base plate 8 is formed in the same manner as the above-mentioned base portion of the tuning-fork-type quartz wafer 1. In other words, the quartz base plate 8 on the periphery of the quartz wafer 1 is removed with the connecting portion 11 that is formed as a thinner portion so as to be easily cut off being left. In this case, at the same time that the connecting portion 11 is formed as a thinner portion, the thickness dimensions of the respective portions, such as the piezoelectric vibration area 51, the reinforcing portion 53, the bridges 7 and the frame member 6, may be formed to desired dimensions through the same processing method as the sixth embodiment.

Any of the above-mentioned embodiments have exemplified a case in which the quartz wafer 1 is formed into a predetermined shape through wet etching. However, the present invention not limited thereto, and the present invention is also applicable to a case in which the quartz wafer 1 is formed into a predetermined shape through dry etching.

Moreover, any of the above-mentioned embodiments have exemplified a case in which the present invention is applied to a processing method for a quartz wafer of the reversed mesa type. However, the present invention is also applicable to a processing method for a quartz wafer of the mesa type.

Furthermore, any of the above-mentioned embodiments have exemplified a case in which a quartz wafer is adopted as a work piece. However, the present invention is not limited to this arrangement, and the present invention may be applied to another material of various types such as a piezoelectric material, glass, metal and a semiconductor.

In addition, in the case when a number of quartz wafers 1 are simultaneously formed from one quartz base plate 8, that is, in the case of a so-called multiple-pieces obtaining process, by changing the material, film thickness and the like of the mask layers on the respective formation portions of the respective quartz wafers 1 or the like so as to provide respectively different etching rates, it is possible to simultaneously form quartz wafers of a number of kinds having respectively different basic vibration frequencies.

Thirteenth Embodiment

The thirteenth embodiment of the present invention exemplifies a case in which the present invention is applied to a method of forming a tuning-fork-type quartz resonator and a tuning-fork-type quartz wafer constituting the tuning-fork-type quartz resonator by the use of etching.

—Explanation of the Structure of a Tuning-Type Quartz Resonator—

Prior to the explanation of the method of forming a tuning-fork-type quartz wafer, the structure of the tuning-fork-type quartz wafer will first be described.

FIG. 35(a) is a drawing that shows a tuning-fork-type quartz vibration member 10 that is installed in the tuning-fork-type quartz resonator in accordance with the thirteenth embodiment. FIG. 35(b) is a cross-sectional view taken along line B-B of FIG. 35(a).

This tuning-fork-type quartz vibration member 10 is provided with leg portions 61, 62, and exciter electrodes 13, 14 are respectively formed on the leg portions 61, 62. In FIG. 35(a), these exciter electrodes 13, 14 are indicated by slanting lines.

Moreover, with respect to the tuning-fork-type quartz vibration member 10, groove sections 61c, 62c having a rectangular shape are each formed in the center of each of the main faces 61a, 62a that form the surface and rear surface of each of the leg portions 61, 62, respectively. Etching processes for forming these groove sections 61c, 62c will be described later.

In the case when the groove sections 61c, 62c are formed on the surface and rear surface of each of the leg portions 61, 62 in this manner, even if the tuning-fork-type quartz vibration member 10 is miniaturized, the vibration loss in the leg portions is suppressed, and the CI (Crystal Impedance) value is effectively reduced to a low level.

The above-mentioned first exciter electrodes 13 are formed on the inside of the groove section 61c which is formed on the surface and rear surface (main faces) 61a of one of the leg portions 61 and the side face 62b of the other leg portion 62, with these electrodes being connected to each other. In the same manner, the second exciter electrodes 14 are formed on the inside of the groove section 62c which is formed on the surface and rear surface (main faces) 62a and the side face 61b of the other leg portion 61, with these electrodes being connected to each other. These exciter electrodes 13, 14 are thin films which are formed by metal vapor-deposition of chromium (Cr) and gold (Au), and the film thickness is set to, for example, 2000 Å.

Moreover, although not shown in the drawings, the tuning-fork-type quartz vibration member 10 is supported by a base, and a cap is attached to the outer circumferential portion of this base in a manner so as to cover the tuning-fork-type quartz vibration member 10 so that a tuning-fork-type quartz resonator is formed.

Figure 36:
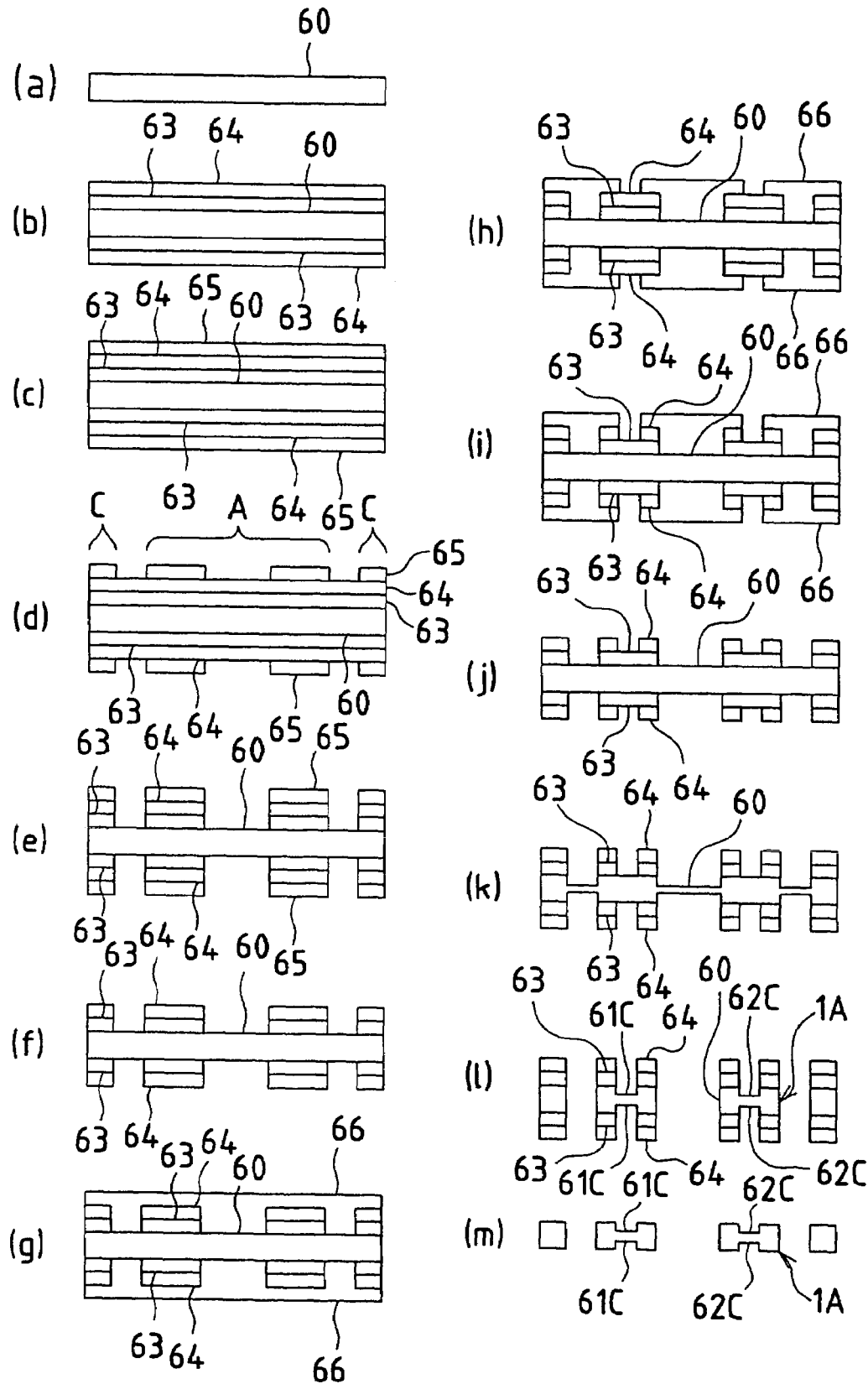
FIGS. 36(a) to 36(m) are drawings that show forming processes of a tuning-fork-type quartz wafer in accordance with the thirteenth embodiment.

Referring to FIG. 36, the following description will discuss a forming method of a tuning-fork-type quartz wafer by the use of etching. FIG. 36 shows a processing state in a cross-section taken along line II-II of FIG. 35.

As shown in FIG. 36(a), a quartz substrate 60 is first formed into a plate shape. In this case, the respective surface and rear surface of the quartz substrate 60 are formed into mirror faces through polishing processes.

Next, Cr films 63 are respectively vapor-deposited on the surface and rear surface of the quartz substrate 60, and an Au film 64 is then vapor-deposited on the surface thereof respectively, by using a sputtering device (not shown). Then, as shown in FIG. 36(c), photoresist layers 65 are formed on the metal films 63, 64 thus formed.

Next, as shown in FIG. 36(d), one portion of the photoresist layer 65 is removed so that the photoresist layers 65 are left on a vibration member forming area A that matches the shape (tuning-fork shape) of a tuning-fork-type quartz wafer to be manufactured and a frame member C that forms an outer edge of the quartz substrate 60. Thus, an outer-shape patterning process is carried out.

Next, as shown in FIG. 36(e), the portions of the respective metal films 63, 64 having no photoresist layer 65 formed thereon are removed by an Au etching solution and a Cr etching solution, as shown in FIG. 36(d). Thus, the quartz substrate 60 is exposed to the portions from which the metal films 63, 64 have been removed.

Thereafter, as shown in FIG. 36(f), all of the photoresist layer 65 that has been left as shown in FIG. 36(e) is removed.

Then, as shown in FIG. 36(g), a photoresist layer 66 is formed on the entire surface and rear surface of the quartz substrate 60.

Moreover, as shown in FIG. 36(h), one portion of the photoresist layer 66 is removed. More specifically, a groove-section patterning process is carried out so as to remove portions of the photoresist layer 66 corresponding to the groove sections 61c, 62c.

Next, as shown in FIG. 36(i), only the portion of the Au film 64 having no photoresist layer 66 formed thereon in the above-mentioned FIG. 36(h) is removed by an Au etching solution. Thus, at the portions corresponding to the groove sections 61c, 62c, only the Cr film 63 is allowed to remain as a metal film.

Thereafter, as shown in FIG. 36(j), all of the photoresist layer 66 that has been left in FIG. 36(i) is removed. Thus, at the portions corresponding to the groove sections 61c, 62c, only the Cr film 63 that functions as a metal film, that is, an etching delay film as defined in the present invention, is allowed to remain so that two layers of Cr film 63 and Au film 64 exist in the areas other than the portions corresponding to the groove sections 61c, 62c.

When Cr and Au are compared with each other, Cr has a higher etching rate. In other words, Cr is a material that is easily dissolved in an etching solution (in the case of the thirteenth embodiment, a solution of hydrofluoric acid+ammonium fluoride). In contrast, Au is a material that is hardly dissolved by any etching solution.

Successively, an outer-shape etching process is carried out by using a quartz etching solution. In other words, portions having no metal films 63, 64 with exposed quartz substrate 60 are subjected to the etching process. In this case, since only the Cr film 63 exists as the metal film on the portions corresponding to the groove sections 61c, 62c, the corresponding Cr film 63 is also etched (dissolved and removed) by the quartz etching solution. FIG. 36(k) shows a state in which the Cr film 63 corresponding to the groove sections 61c, 62c have been completely removed in the middle of this outer-shape etching process. At this time, the outer-shape etching process has not been completed yet with the quartz substrate 60 partially remaining as a thin plate.

When the etching process by the quartz etching solution has progressed further after passing through this state, the etching process of the quartz substrate 60 is also started at portions corresponding to the groove sections 61c, 62c from which the Cr film 63 has been completely removed. In other words, the outer-shape etching process of the quartz wafer 60 and the groove-section etching process are carried out in parallel with each other.

At the time when, after this etching process was continuously carried out for a predetermined time, the amount of etching of the groove sections 61c, 62c has reached a predetermined amount, the etching process is completed. Thus, as shown in FIG. 36(l), groove sections 61c, 62c are formed on both of the faces of the leg portion so that the leg portion is allowed to have a virtually H-letter shape in its cross-sectional view. In this manner, a quartz wafer 1A, which has a predetermined outer shape with the groove sections 61c, 62c being formed on the main faces, is formed, and the respective residual metal films 63, 64 are removed by the Au etching solution and the Cr etching solution so that, as shown in FIG. 36(m), a tuning-fork-type quartz wafer 1A, which has the leg portion having a virtually H-letter shape in its cross-section, is completed.

Here, the metal films 63, 64, which remain on the quartz wafer 1A in a state shown in FIG. 36(l), may be utilized as one portion of a wiring pattern at the time of the electrode formation that is carried out in the succeeding process, or the metal films 63, 64 may be utilized as a weighting electrode that is partially removed at the time of adjusting the frequency of the tuning-fork-type quartz resonator (used for a milling process so as to adjust the frequency, for example).

The above-mentioned first and second exciter electrodes 13, 14 are formed on the respective leg portions 61, 62 of the tuning-fork-type quartz wafer 1A thus formed so that a tuning-fork-type quartz vibration member 10 is manufactured, and this is supported by the base with a cap being attached to the outer circumferential portion of this base so that a tuning-fork-type quartz resonator is manufactured. With respect to the resonance frequency of the tuning-fork-type quartz resonator thus manufactured, for example, 20 kHz, 64 kHz, 40 kHz, 60 kHz, 75 kHz, 77.5 kHz and the like may be used. Moreover, it is possible to manufacture tuning-fork-type quartz resonators having frequencies other than the aforementioned examples of the resonance frequency. Furthermore, these may be formed as tuning-fork-type quartz resonators and the like of the surface packaging type.

As described above, in the thirteenth embodiment, it is possible to form the outer shape of the tuning-fork-type quartz wafer 1A into a predetermined tuning-fork shape by carrying out an etching process of one time on the quartz substrate 60, and it is also possible to form groove sections 61c, 62c on its main faces. In other words, since it is not necessary to carry out etching processes of a plurality of times on the quartz substrate 60, it is possible to avoid problems of complex processing operations and prolonged processing time, and it is also possible to provide a high-quality tuning-fork-type quartz wafer 1A without causing problems such as surface roughness on the surface of the quartz wafer 1A.

In the above-mentioned embodiments, only the Cr film 63 is placed on the portions corresponding to the groove sections 61c, 62c, with the two layers of the Cr film 63 and Au film 64 being placed on the areas other than the portions corresponding to the groove sections 61c, 62c. However, the present invention is not limited to this arrangement, and the present invention may have an arrangement in which a Cr film is placed on the portions corresponding to the groove sections 61c, 62c, with an oxidized Cr film being placed on the area other than the portions corresponding to the groove sections 61c, 62c. In general, an oxidized Cr film has a lower etching rate (is easily dissolved in an etching solution) in comparison with a Cr (non-oxidized) film, and by utilizing these differences in the etching rate, it is possible to etch only the portions corresponding to the groove sections 61c, 62c, and consequently, it is possible to form the groove sections 61c, 62c.

With respect to the method for partially oxidizing this Cr film, excimer UV irradiation, UV-$O_3$ dry washing, $O_2$ plasma or the like may be used.

Moreover, with respect to the method for providing differences in the etching rate to the respective films that are formed on areas corresponding to the groove sections 61c, 62c and the areas other than these areas, a method may be proposed in which a film of the same material (for example, Cr film) is formed on the respective areas, while the film thickness of the film formed on the latter areas is set to be thicker than the film thickness of the film that is formed on the former areas.

The above-mentioned embodiments have exemplified a case in which the present invention is applied to a method of forming a tuning-fork-type quartz wafer by the use of etching. However, the present invention is not intended to be limited by this method, and may be applied to a case in which a groove section is formed on the other quartz wafers (such as an AT cut quartz wafer).

Moreover, the present invention is not limited to quartz wafers, and the present invention may be applied to a piezoelectric vibration member using a material, such as lithium niobate and lithium tantalate, and a manufacturing method of other various electronic parts. Moreover, with respect to the work piece, the present invention is not limited to a piezoelectric material, and the present invention may be applied to various materials, such as glass, metal and semiconductors.

Furthermore, with respect to the constituent material of the etching delay film, the present invention is not limited to Cr, since materials of various types may be used as long as they have a comparatively high etching rate. Here, in place of the above-mentioned Au film, a Ni film may be used.

Fourteenth Embodiment

The fourteenth embodiment of the present invention exemplifies a case in which the present invention is applied to another method of forming a tuning-fork-type quartz resonator and a tuning-fork-type quartz wafer constituting the tuning-fork-type quartz resonator by the use of etching.

The following description will discuss the fourteenth embodiment of the present invention. The forming method of a tuning-fork-type quartz wafer of the fourteenth embodiment includes a first forming process for forming a quartz substrate serving as a work piece into a predetermined shape (tuning-fork shape) except for the groove sections 61c, 62c, and a second forming process, which is carried out after the first forming process, for forming the groove sections 61c, 62c.

Figure 37:
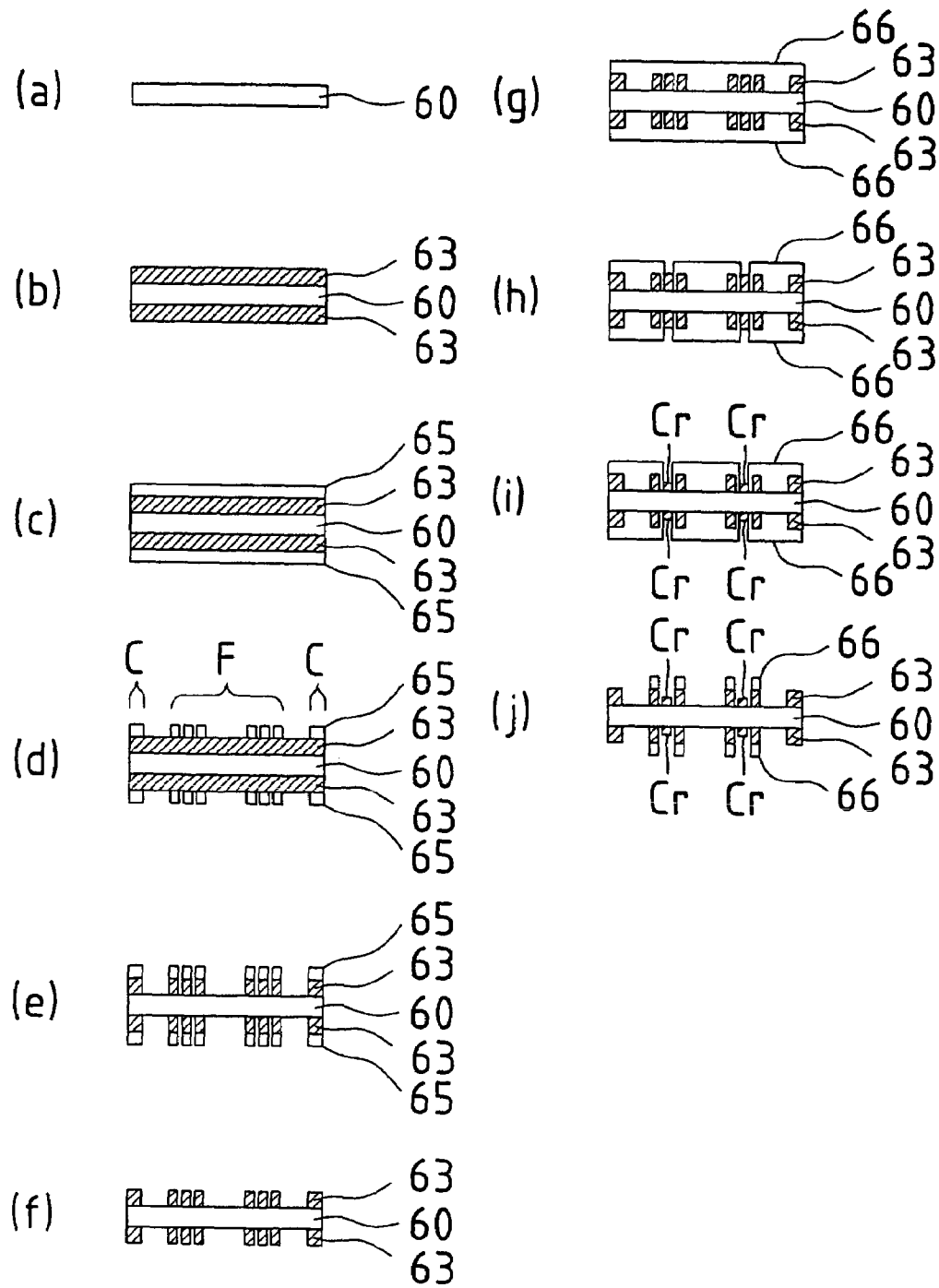
FIGS. 37(a) to 37(j) are drawings that show a former half of the sequence of forming processes of a tuning-fork-type quartz wafer in accordance with a fourteenth embodiment of the present invention.

In this first forming process, as shown in FIG. 37(a), a quartz substrate 60 is first formed into a plate shape. In this case, the respective surface and rear surface of the quartz substrate 60 are formed into mirror faces through polishing processes.

Next, metal films 63 of Cr and Au are respectively vapor-deposited on the surface and rear surface of the quartz substrate 60 by using a sputtering device (not shown). Then, as shown in FIG. 37(c), photoresist layers 65 are formed on the metal films 63 thus formed.

Next, as shown in FIG. 37(d), one portion of the photoresist layer 65 is removed so that the photoresist layers 65 are left on a vibration member forming area F that matches the shape of a tuning-fork-type quartz wafer to be manufactured and a frame member C that forms an outer edge of the quartz substrate 60. Thus, an outer-shape patterning process is carried out.

With respect to the photoresist layers 65 that are left at one portion of the formation areas of the groove sections 61c, 62c, photoresist layers 65 are removed from portions corresponding the groove sections 61c, 62c, which are both of the sides of the groove sections 61c, 61c in the same manner as the groove-section side patterning as shown in FIG. 3(a) in the above-mentioned first embodiment, that is, only the right and left side edge portions of the groove sections 61c, 62c, as shown in FIG. 37(d).

Next, as shown in FIG. 37(e), only the portion of the metal film 63 having no photoresist layer 65 formed thereon in FIG. 37(d) is removed by an Au etching solution and a Cr etching solution. Thus, at the portions corresponding to the portions from which the metal film 63 has been removed, the quartz substrate 60 is exposed.

Thereafter, as shown in FIG. 37(f), all of the photoresist layer 65 that has been left in FIG. 37(e) is removed.

Then, as shown in FIG. 37(g), a photoresist layer 66 is formed over the entire surface of the quartz substrate 60. In this case, since the side groove sections 61d, 62d have not been formed on the quartz substrate 60 yet, the photoresist layer 66 may be formed on the entire face of the quartz substrate 60 uniformly by a spin-coat method. For this reason, it is possible to obtain high patterning precision.

Thereafter, as shown in FIG. 37(h), one portion of the photoresist layer 66 is removed. More specifically, a patterning process is carried out so that only the area of the photoresist layer 66 to be etched in the center etching process of portions (hereinafter, referred to as a groove center area) corresponding to the groove sections 61c, 62c is removed.

Next, as shown in FIG. 37(i), only Au of the portion of the metal film 63 having no photoresist layer 66 formed thereon in FIG. 37(h) is removed by an Au etching solution. Thus, at the portion corresponding to the groove center area, only the Cr film, which functions as an etching delay film as defined in this invention, is allowed to remain.

Then, as shown in FIG. 37(j), one portion of the photoresist layer 66 is removed. More specifically, only the photoresist layer 66, which covers the metal film 63 that is located at both of the sides of the groove sections 61c, 62c, is allowed to remain, and the photoresist layer 66 of the other portions is removed.

Figure 38:
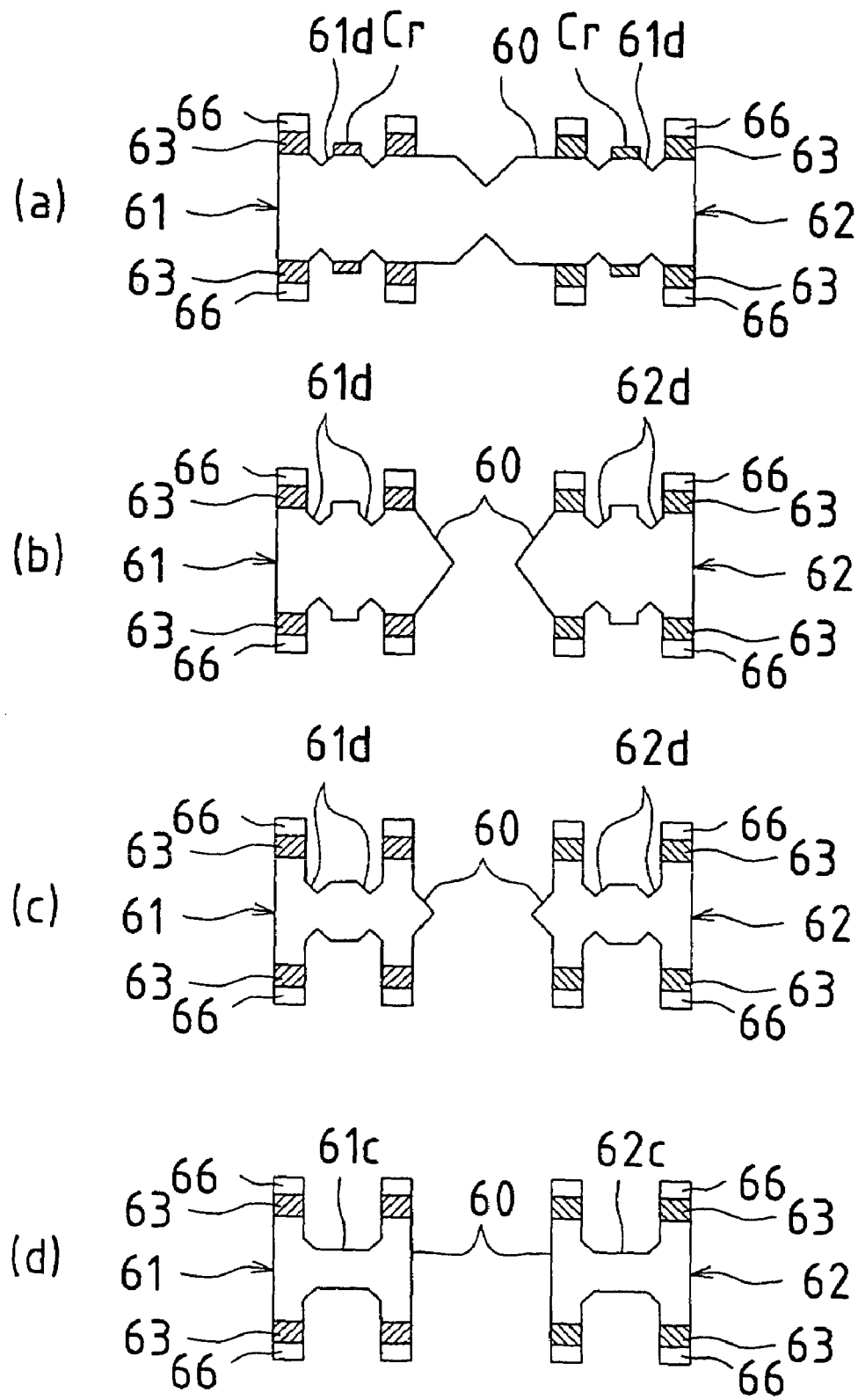
FIGS. 38(a) to 38(d) are drawings that show a latter half of the sequence of forming processes of the tuning-fork-type quartz wafer in accordance with the fourteenth embodiment.

Next, as shown in FIG. 38(a), which shows the respective leg portions 61, 62 in an enlarged manner, an outer-shape etching process is carried out by a quartz etching solution. In other words, the outer-shape etching process is carried out with only the vibration member forming area F and the frame member C being left. In this case, both of the sides of the groove sections 61c, 62c are also etched, and side groove sections 61d, 62d start to be formed. In this case, the portion corresponding to the groove center area is only allowed to have the Cr film as the metal film 63, with the result that the Cr film is also etched (dissolved and removed) by the quartz etching solution. FIG. 38(b) shows a state in which the Cr film corresponding to the groove center area has been completely removed in the middle of this outer-shape etching process. At this time, the outer-shape etching process and the etching process of the side groove sections 61d, 62d (outer-edge etching process) have not been completed yet.

When the etching process by the quartz etching solution has progressed further after passing through this state, the etching process of the quartz substrate 60 is also started at the portion corresponding to the groove center area from which the Cr film has been completely removed, as shown in FIG. 38(c). In other words, the outer-shape etching process of the quartz wafer and the groove-section etching process are carried out in parallel with each other.

When this etching process is continued for a predetermined time, the quartz substrate 60 is formed into a predetermined tuning-fork shape. With respect to the formation of the groove sections 61c, 62c, the outer-edge etching process is first completed by the above-mentioned etching stop function. Thus, the side groove sections 61d, 62d are formed. Thereafter, at the time when the etching amount of the center etching process has reached the depth of the above-mentioned side groove sections 61d, 62d, the etching process is no longer allowed to progress so that the groove sections 61c, 62c having a predetermined depth are formed (FIG. 38(d)).

In the fourteenth embodiment, in the same manner as the above-mentioned respective embodiments, it also becomes possible to improve the processing precision of the groove sections 61c, 62c, and consequently, it becomes possible to reduce the CI value and deviations in the vibration frequency. Moreover, by using the etching stop technique, it is possible to simplify the controlling process. Furthermore, in the fourteenth embodiment, since the quartz wafer outer-shape etching process, the outer-edge etching process and the center etching process are carried out in parallel with each other, the number of etching processes to the quartz substrate 60 is reduced to one time, thereby making it possible to positively prevent problems such as surface roughness on the surface of the quartz wafer. Moreover, it is possible to avoid problems of complex processing operations and prolonged processing time.

Here, in the fourteenth embodiment, the area having only the Cr film 63 and the area having two layers of the Cr film 63 and the Au film 32 are provided, and at the area having only the Cr film 63, there is a delay in the start of the etching operation. However, the present invention is not limited to this arrangement. The present invention may have an arrangement in which an area having a Cr film and an area having an oxidized Cr film are prepared, and the start of the etching process may be delayed at only the area having the Cr (non-oxidized) film. With respect to the method for partially oxidizing this Cr film, excimer UV irradiation, UV-$O_3$ dry washing, $O_2$ plasma or the like may be used.

Fifteenth Embodiment

The fifteenth embodiment of the present invention will discuss a case in which the present invention is applied to a tuning-fork-type quartz resonator.

Figure 39:
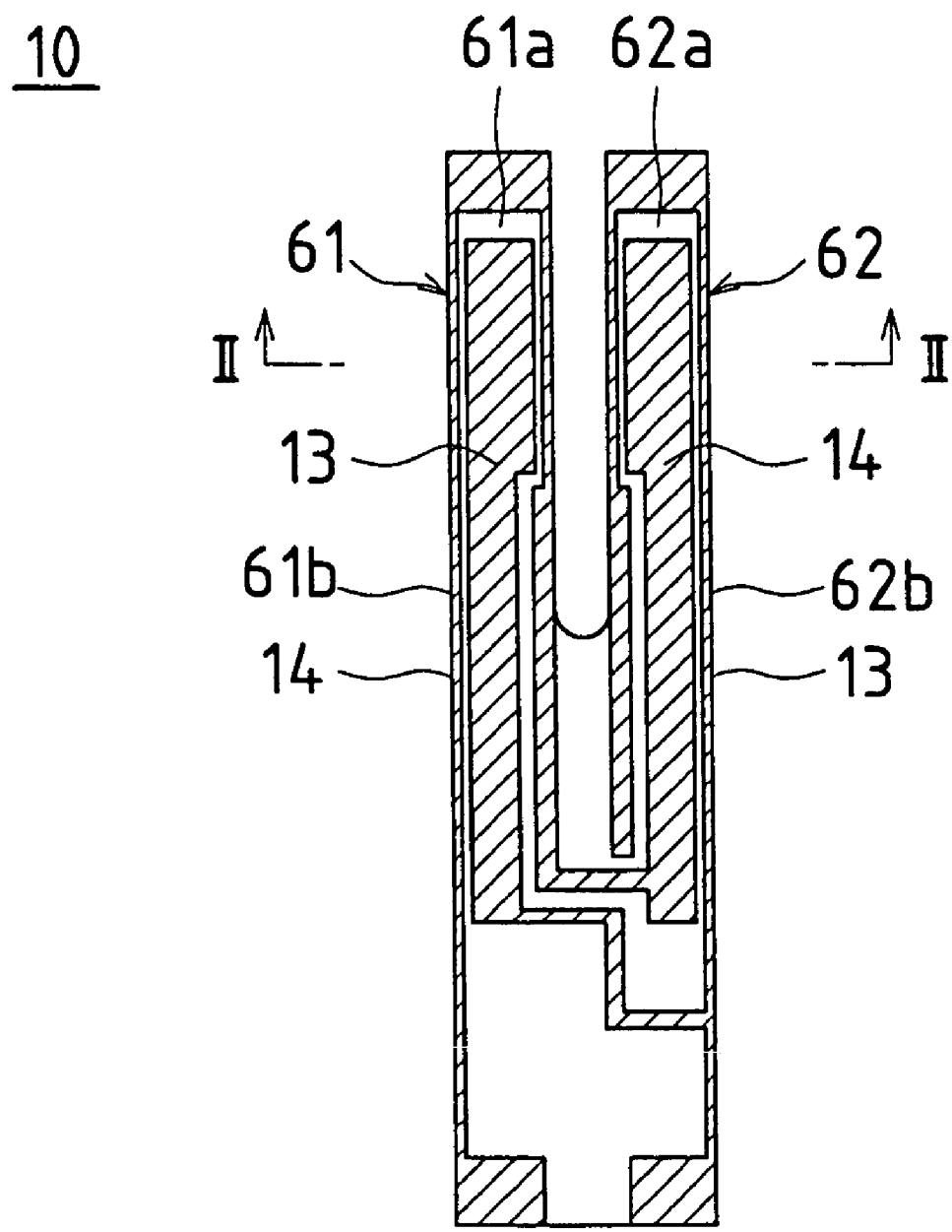
FIG. 39 is a drawing that shows a generally-used tuning-fork-type quartz vibration member.

FIG. 39 shows a tuning-fork-type quartz vibration member 10 that is installed in a tuning-fork-type quartz resonator in accordance with the fifteenth embodiment. This tuning-fork-type quartz vibration member 10 is provided with two leg portions 61, 62, and the leg portions 61, 62 have exciter electrodes 13, 14 which are formed thereon, respectively. In FIG. 39, the forming portions of these exciter electrodes 13, 14 are indicated by slanting lines.

The exciter electrodes 13 are formed on the surface and rear surface (main faces) 61a of one of the leg portions 61 and the side face 62b of the other leg portion 62, with these electrodes being connected to each other. In the same manner, the exciter electrodes 14 are formed on the surface and rear surface (main faces) 62a of the other leg portion 62 and the side face 61b of the one of the leg portion 61, with these electrodes being connected to each other (electrodes on the respective side faces 61b, 62b are not shown). These exciter electrodes 13, 14 are thin films which are formed by metal vapor-deposition of chromium (Cr) and gold (Au), and the film thickness is set to, for example, 2000 Å. The forming process of these exciter electrodes 13, 14 will be described later.

Moreover, although not shown in the drawings, the tuning-fork-type quartz vibration member 10 is supported by a base, and a cap is attached to the outer circumferential portion of this base in a manner so as to cover the tuning-fork-type quartz vibration member 10 so that a tuning-fork-type quartz resonator is formed.

The tuning-fork-type quartz vibration member 10 of the fifteenth embodiment is characterized in that, as shown in FIG. 41, pin holes 82, which serve as a tension reducing means, are formed at predetermined areas on both of the surface and rear surface sides of the main faces 61a, 62a of the quartz wafer 1A. More specifically, a number of pin holes 82 are formed along the edges A on both of the sides in the width direction of each of the leg portions 61, 62 and the edges A on both of the sides in the width direction of the base portion 16 of the quartz wafer 1A. FIG. 41(b) is a cross-sectional view taken along line III-III of FIG. 41(a).

The formation of these pin holes 82 eliminates the continuity of the respective surface and rear surface 61a, 62a in the edges A of the respective leg portions 61, 62 and the base portion 16 so that, during the process for forming the exciter electrodes 13, 14 on the quartz wafer 1A, the surface tension, which is exerted in the resist solution that is applied to the surface and rear surface 61a, 62a of the quartz wafer 1A, is reduced. In other words, it becomes possible to sufficiently ensure the amount of coat of the resist solution on the respective edges A.

The forming process of these pin holes 82 (referred to as a substrate surface pre-treatment process in the present invention) is carried out at the same time as when the quartz base plate is formed into a tuning-fork shape through an etching process or the like. In other words, upon formation of a tuning-fork-shaped metal pattern on the quartz base plate, resist is not placed at a position on which these pin holes 82 are formed, with the result being that, upon the etching process of the quartz base plate, the pin holes 82 are formed at a predetermined area of the quartz wafer 1A simultaneously as the tuning-fork-type quartz wafer 1A is formed.

Moreover, these pin holes 82 may be formed by applying a laser beam onto a predetermined position of the quartz wafer 1A, after the quartz base plate has been formed into a tuning-fork shape through the etching process to obtain the quartz wafer 1A.

Figure 40:
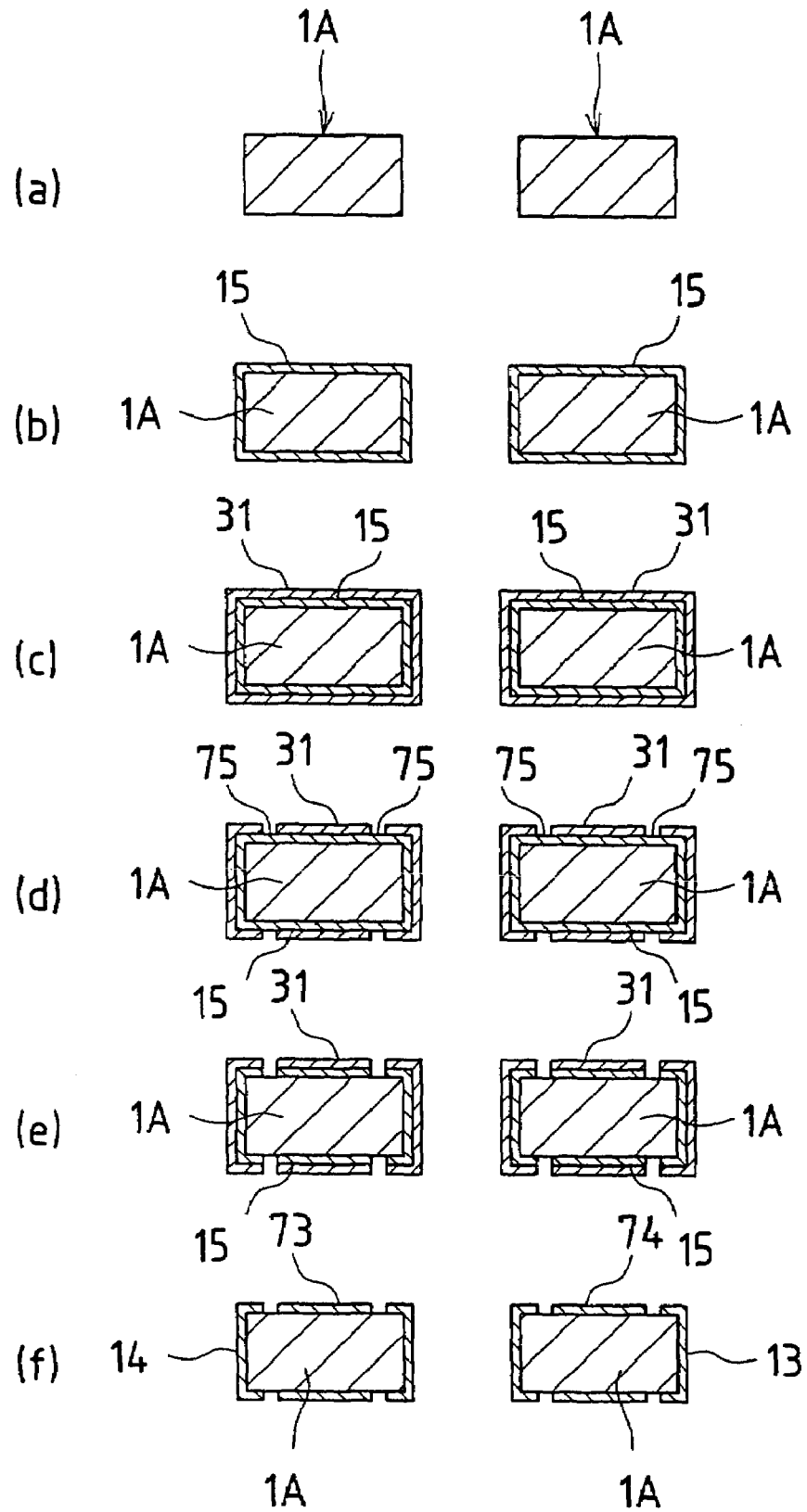
FIGS. 40(a) to 40(f) are drawings that show forming processes of an electrode on a quartz wafer.

Referring to FIG. 40 (a drawing that indicates a cross-section taken along line II-II of FIG. 39), the following description will discuss processes for forming exciter electrodes 13, 14 on the quartz wafer 1A having the above-mentioned pin holes 82.

First, in the same manner as the conventional forming process of the electrodes, an electrode film 15 that is made from a material such as chromium and gold is formed on the entire surface of the quartz wafer 1A (FIG. 40(a)) which is formed in the above-mentioned tuning-fork shape by using a vacuum vapor deposition method or the like (FIG. 40(b)). Thereafter, the entire surface of the quartz wafer 1A is coated with a resist film 31 that is composed of a photoresist solution of a positive-working type (FIG. 40(c)). This coating process using the resist film 31 is carried out by immersing the quartz wafer 1A in a resist solution vessel or spraying the resist solution onto the quartz wafer 1A. In the case of the conventional quartz wafer 1A, a great surface tension is exerted in the resist solution that is applied to the main faces 61a, 62a, which causes an insufficient amount of application of the resist solution at the edge portions, thereby resulting in no resist solution on the periphery of the edges in some cases. In contrast, in the fifteenth embodiment, since pin holes 82 (not shown in FIG. 40) are formed on the edges A, the continuity of the main surfaces 61a, 62a in the quartz wafer 1A is eliminated so that the surface tension which is exerted in the resist solution that is applied to the main faces 61a, 62a of the quartz wafer 1A is reduced. For this reason, it is possible to obtain a sufficient amount of application of the resist solution at the edges A.

Thereafter, predetermined exposing and developing processes are carried out on the resist film 31 that is formed by the photoresist solution so that an opening section 75 is formed in the resist film 31 on an area at which the electrode film 15 is etched (FIG. 40(d)). Then, the electrode film 15 which is exposed to this opening section 75 is subjected to an etching process so that after the electrode film 15 has been partially removed (FIG. 40(e)), the above-mentioned resist film 31 is removed (FIG. 40(f)). Thus, a tuning-fork-type quartz vibration member 10, which has exciter electrodes 13, 14 formed on only the predetermined areas of the quartz wafer 1A, is obtained.

As described above, in the fifteenth embodiment, since the pin holes 82 are formed on the periphery of the edge A on the quartz wafer 1A, it is possible to eliminate the continuity of the main faces 61a, 62a on the periphery thereof. Thus, it becomes possible to reduce the surface tension that is generated in the resist solution that is applied to the quartz wafer 1A. For this reason, it is possible to obtain a sufficient amount of application of the resist solution on the edge A, and consequently, it is possible to provide accurate formation positions of the exciter electrodes 13, 14. Thus, it becomes possible to greatly reduce the rate of occurrence of defective products.

Sixteenth Embodiment

The following description will discuss a sixteenth embodiment of the present invention. The sixteenth embodiment also exemplifies a case in which the present invention is applied to a tuning-fork-type quartz resonator.

FIG. 42(a) is a drawing that shows a tuning-fork-type quartz vibration member 10 in accordance with the sixteenth embodiment. As shown in FIG. 42(a), in the present tuning-fork-type quartz vibration member 10, three pin holes are formed at positions with predetermined gaps along an arc shape of an edge B of the base connecting portion of each of the leg portions 61, 62. FIG. 42(b) is a cross-sectional view showing the forming portion of these pin holes 82, and is a cross-sectional view taken along line IV-IV of FIG. 41(a). In this manner, the pin holes 82 are formed at positions that face each other on the main faces 61a, 62a forming the surface and rear surface.

The formation of these pin holes 82 at such positions eliminates the continuity of the surfaces on the periphery of the edge B of the base end connecting portion of each of the leg portions 61, 62 so that the surface tension, which is exerted in the resist solution that is applied to the surface and rear surface 61a, 62a of the quartz wafer 1A, is reduced. Thus, it becomes possible to sufficiently ensure the amount of coat of the resist solution on the edge B. In particular, the arrangement in which the pin holes 82 are formed on the edge B of the base connecting portion of each of the leg portions 61, 62 is used in the case when the quartz wafer 1A is resist-coated with a resist film that is composed of a photoresist solution of a negative-working type. In other words, by sufficiently obtaining the amount of coat of the resist solution on the edge B, it becomes possible to sufficiently provide resist films (protective films) that are formed through exposing and developing processes on the base end connecting portions of the respective leg portions 61, 62. Thus, it is possible to prevent unnecessary vapor-deposition film from adhering to this portion.

Suppose that no resist film exists on the base end connecting portion of each of the leg portions 61, 62 due to the influences of the above-mentioned surface tension. It is therefore not possible to place a resist film at this portion upon vapor-depositing the electrodes, with the result being that the exciter electrode 13 and the exciter electrode 14 are formed in a manner which is highly susceptible to short-circuiting. The sixteenth embodiment makes it possible to avoid such a situation.

Modified Example of the Sixteenth Embodiment

The following description will discuss a modified example of a tension reducing means in accordance with the sixteenth embodiment.

FIG. 43(*a*) is a plan view that shows a quartz wafer 1A in accordance with a first modified example. As shown in FIG. 43(*a*), the quartz wafer 1A of the first modified example has an arrangement in which, in place of the pin holes of the sixteenth embodiment, a plurality of grooves 74 (three in the arrangement of FIG. 43), which each open to the edge B and have a rectangular shape, are formed on the edge portion B of the base end connecting portion of each of the leg portions 61, 62. FIG. 43(*b*) is a cross-sectional view taken along line V-V of FIG. 43(*a*).

FIG. 44(*a*) is a plan view that shows a quartz wafer 1A in accordance with a second modified example of the sixteenth embodiment. As shown in FIG. 44(*a*), the quartz wafer 1A of the second modified example has an arrangement in which a recessed section 5, which has an arc shape and extends along the edge B, is formed in the vicinity of the edge B of the base end connecting portion of each of the leg portions 61, 62. FIG. 44(*b*) is a cross-sectional view taken along line VI-VI of FIG. 44(*a*).

Figure 45:
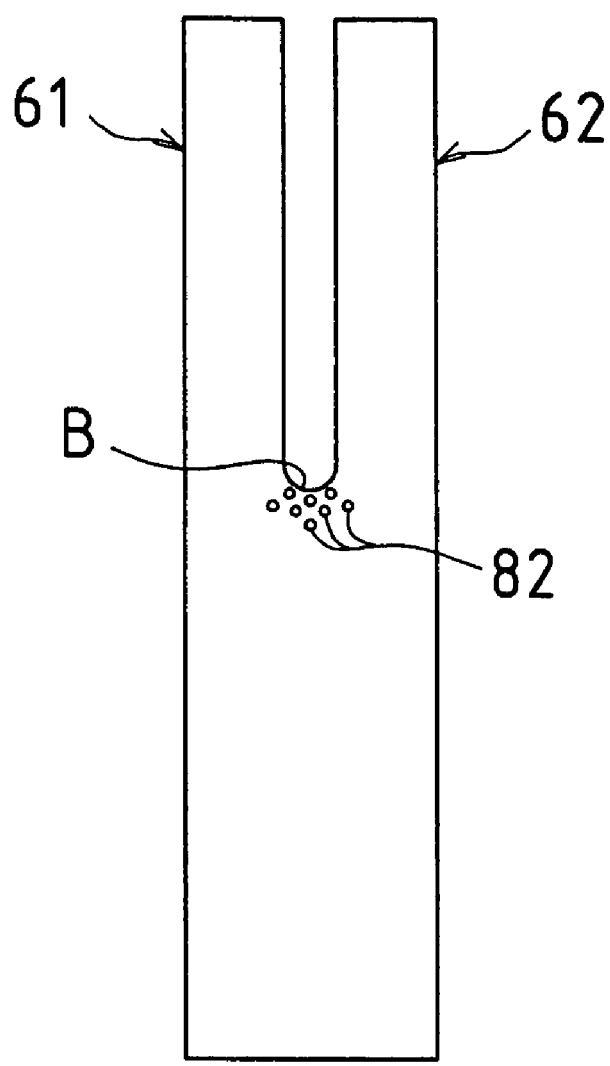
FIG. 45 is a plan view that shows a quartz wafer in accordance with a third modified embodiment of the sixteenth embodiment.

FIG. 45 is a plan view that shows a quartz wafer 1A in accordance with a third modified example of the sixteenth embodiment. As shown in FIG. 45, the quartz wafer 1A of the third modified example has an arrangement in which the formation positions of pin holes 82*a* are altered. In other words, the pin holes 82 are arranged in a staggered manner in an arc shape along the edge B.

Figure 46:
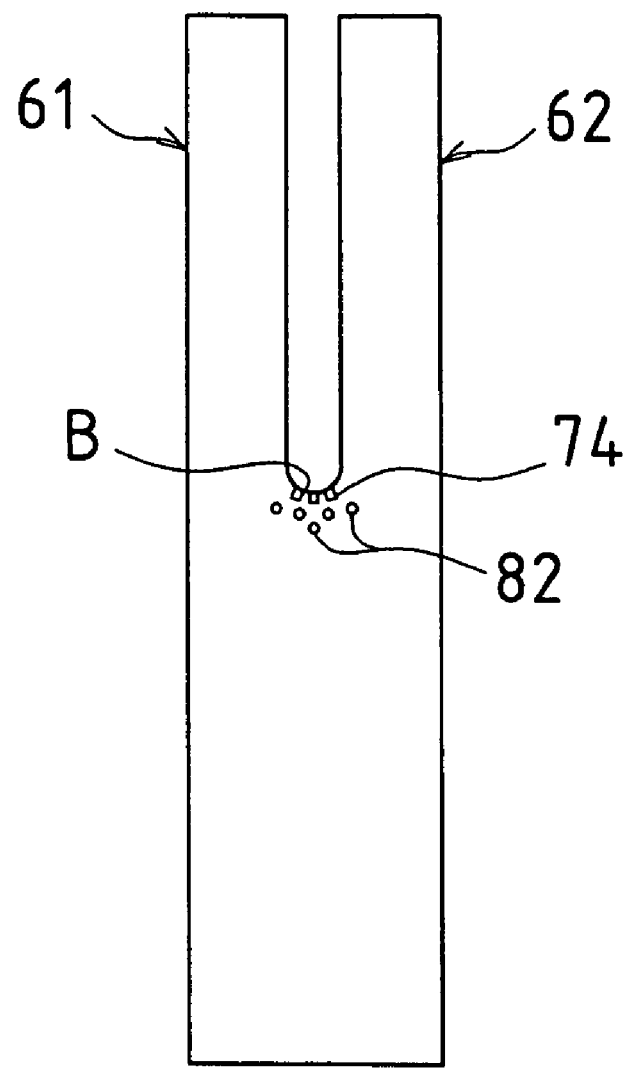
FIG. 46 is a plan view that shows a quartz wafer in accordance with a fourth modified embodiment of the sixteenth embodiment.

FIG. 46 is a plan view that shows a quartz wafer 1A in accordance with a fourth modified example of the sixteenth embodiment. As shown in FIG. 46, the quartz wafer 1A of the present modified example has an arrangement in which the grooves 74 shown in the above-mentioned FIG. 43 and the pin holes 82 that are arranged in a staggered manner as shown in FIG. 45 are combined with each other.

Figure 47:
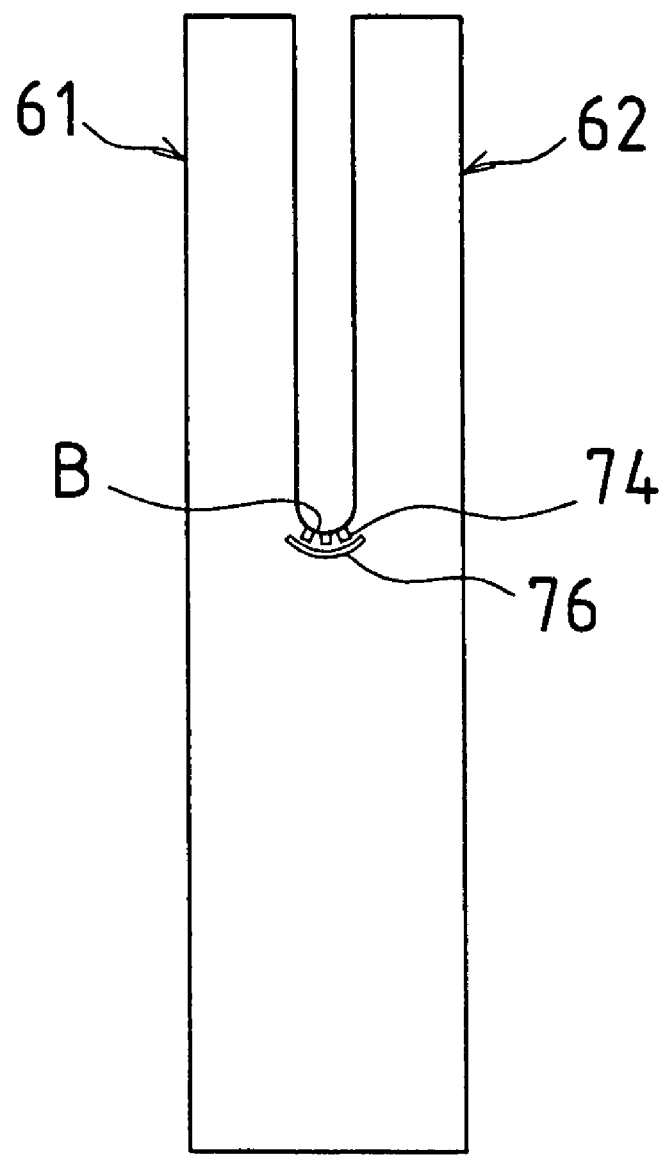
FIG. 47 is a plan view that shows a quartz wafer in accordance with a fifth modified embodiment of the sixteenth embodiment.

FIG. 47 is a plan view that shows a quartz wafer 1A in accordance with a fifth modified example of the sixteenth embodiment. As shown in FIG. 47, the quartz wafer 1A of the present modified example has an arrangement in which the grooves 74 shown in the above-mentioned FIG. 43 and the recessed section 76 shown in FIG. 44 are combined with each other.

By using the tension-reducing means as shown in FIGS. 43 to 47 as described above, it is also possible to eliminate the continuity of the main faces 61*a*, 62*a* of the quartz wafer 1A, and consequently, it is possible to reduce the surface tension that is exerted in the resist solution which is applied to the main faces 61*a*, 62*a* of the quartz wafer 1A. Therefore, it is possible to maintain a sufficient amount of application in the resist solution at the edge B, to provide forming positions of the exciter electrodes 13, 14 accurately, and, consequently, to greatly reduce the rate of occurrence of defective products.

Seventeenth Embodiment

The following description will discuss a seventeenth embodiment of the present invention. The seventeenth embodiment exemplifies a case in which the present invention is applied to a thickness-sliding-type quartz resonator.

Figure 48:
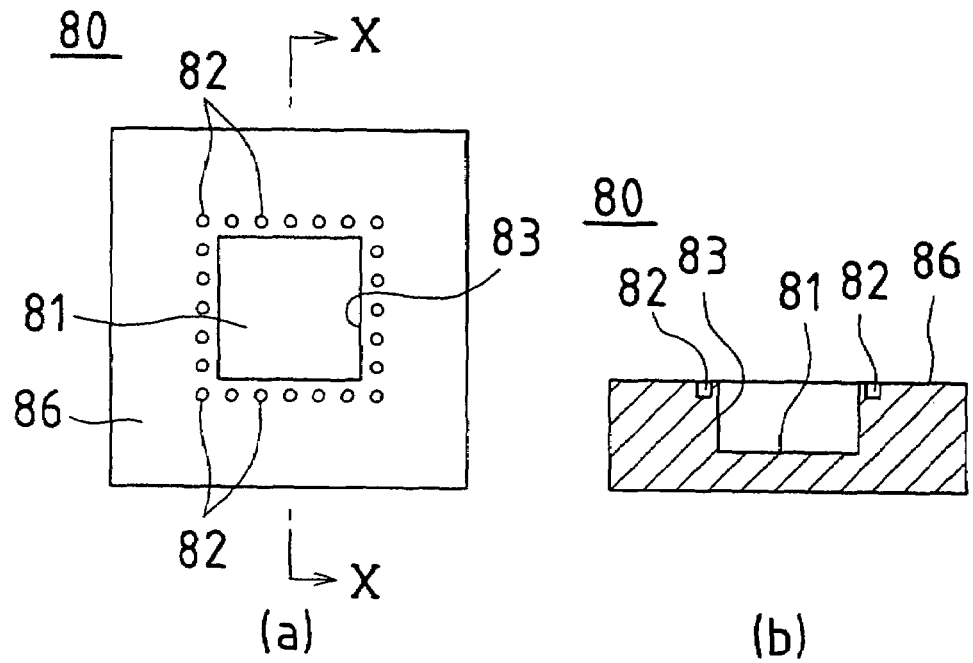
FIG. 48(a) is a plan view that shows a tuning-fork-type quartz vibration member in accordance with a seventeenth embodiment of the present invention.
FIG. 48(b) is a cross-sectional view taken along line X-X of FIG. 48(a).

FIG. 48(*a*) is a plan view that shows a quartz vibration member 80 in accordance with the seventeenth embodiment. FIG. 48(*b*) is a cross-sectional view taken along line X-X of FIG. 48(*a*). As shown in FIGS. 48(*a*) to 48(*b*), the quartz vibration member 80 of the seventeenth embodiment has a reversed mesa structure, and is provided with a bottom face 81, an upper surface 86 and a wall 83 that separates the bottom face 81 and the upper surface 86 from each other.

Here, in the present quartz vibration member 80, pin holes 82 are formed in the vicinity of the inner side edge of the upper surface 86 along the entire circumference thereof.

The formation of these pin holes 82 makes it possible to eliminate the continuity of the faces in the vicinity of the inside edge of the upper surface 86 so that the surface tension, which is exerted in the resist solution that is applied thereto, is reduced. Consequently, an electrode to be formed from the wall 83 to the upper surface 86 is placed at an accurate position. Here, it is not necessary to form these pin holes 82 along the entire circumference of the inside edge of the upper face 86 in the vicinity thereof. For example, in the case when a drawing electrode is formed from the wall 83 to the upper surface 86, the pin holes 82 may be formed only on the formation area of the drawing electrode.

Eighteenth Embodiment

The following description will discuss an eighteenth embodiment of the present invention. The eighteenth embodiment also exemplifies a case in which the present invention is applied to a thickness-sliding-type quartz resonator with the structure of the tension-reducing means being different from that of the seventeenth embodiment. Therefore, in the eighteenth embodiment, explanations will be given of only the structure of the tension-reducing means.

Figure 49:
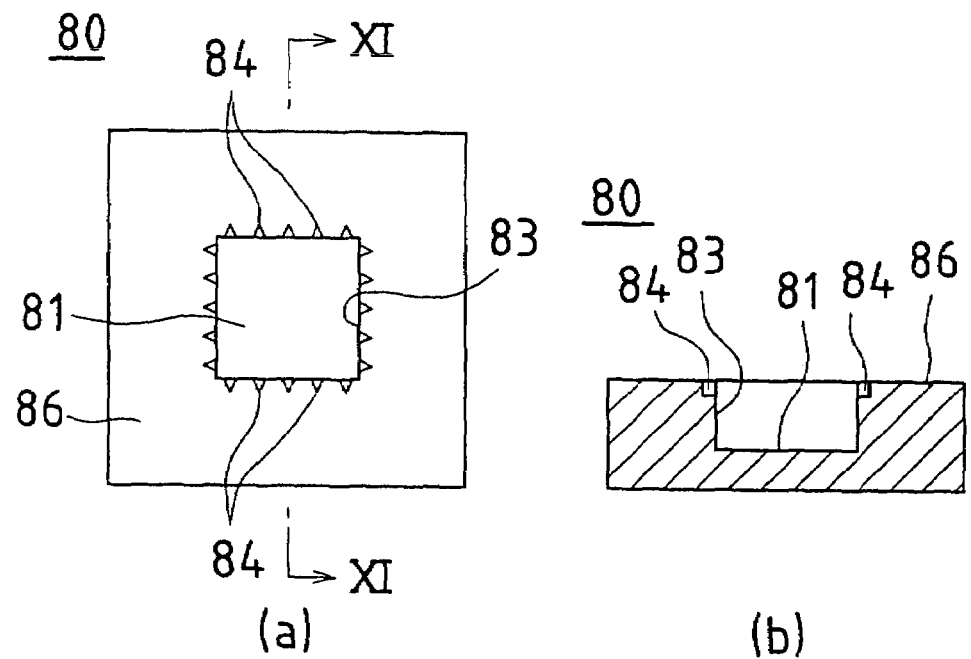
FIG. 49(a) is a plan view that shows a tuning-fork-type quartz vibration member in accordance with an eighteenth embodiment of the present invention.
FIG. 49(b) is a cross-sectional view taken along line XI-XI of FIG. 49(a).

FIG. 49(*a*) is a plan view that shows a quartz vibration member in accordance with the eighteenth embodiment. FIG. 49(*b*) is a cross-sectional view taken along line XI-XI of FIG. 49(*a*). As shown in FIGS. 49(*a*) to 49(*b*), in the quartz vibration member 80 of the eighteenth embodiment, a groove 84, which is opened toward the wall 83, is formed along the inside edge of the upper surface 86. This groove 84 has a triangular shape in its plan view. With the eighteenth embodiment, it is also possible to eliminate the continuity of the faces in the vicinity of the inside edge of the upper surface 86, to reduce the surface tension which is exerted in the resist solution that is applied thereto, and, consequently, to form an electrode that is to be formed from the wall 83 to the upper surface 86 at an accurate position.

In the fifteenth embodiment, the pin holes 82 are formed on only the main faces 61*a*, 62*a* of the quartz wafer 1A. The present invention, however, is not limited to this structure, and the pin holes 82 may be formed on the side faces 61*a*, 62*b* of the quartz wafer 1A. Moreover, the size and the depth of the above-mentioned pin holes 82 may be preferably set to great values within the range that would cause neither a great reduction in the strength of the quartz wafer 1A nor degradation in the electric characteristics. These properties are provided because, when the amount of application of the resist solution to the quartz wafer 1A is too much, the excessive resist solution is recovered through the pin holes 82 so that the surface tension which is exerted in the resist solution is reduced.

Moreover, in the structure of the fifteenth embodiment, recessed sections of a plurality of kinds may also be used combinedly in the same manner as the modified examples (FIGS. 46, 47) of the sixteenth embodiment.

Furthermore, the fifteenth embodiment has exemplified a case in which the electrode is formed by a photolithographic technique using a positive-working-type photoresist solution with a tension-reducing means (pin holes) being formed at positions corresponding to the electrode formation portion. However, the present invention is not limited to this structure, and the tension-reducing means may be formed at positions corresponding to the non-electrode formation portion in the case in which the electrode is formed by a photolithographic technique using a positive-working-type photoresist solution. With this arrangement, since no machining process for pin holes or the like is carried out at the electrode formation portion, it is possible to prevent adverse effects which are caused by the formation of the tension-reducing means from reaching the electrode formation portion.

In the sixteenth embodiment, three pin holes 82, which serve as a tension-reducing means, are formed along the arc shape of the edge B. However, the shape and the number of these pin holes 82 are not limited by these. Moreover, these pin holes 82 may be formed in such positions that one portion thereof is opened to the edge B.

Moreover, in the structure of the seventeenth embodiment, in the same manner as the modified examples (FIGS. 43 to 47) of the sixteenth embodiment, grooves may also be formed, pin holes which are arranged in a staggered manner may also be formed, or recessed sections of a plurality of kinds may also be formed in combination.

Furthermore, the present invention is not limited to quartz resonators, and the present invention may be applied to a piezoelectric resonator using lithium niobate, lithium tantalate or the like and manufacturing processes of various other electronic parts.

What is claimed is:

1. An etching method for etching away different surfaces of a work piece to etch the work piece into a predetermined shape, the etching method comprising:
   thinning one portion of at least one surface of the work piece;
   applying only a single mask layer to each different surface of the work piece to be etched away without applying a mask layer to any thinned portion thinned by said thinning such that the thinned portion is formed as a through hole,
      wherein each applied mask layer is made from the same material, and
      wherein a thickness of the applied mask layer is smaller on a surface of the work piece which requires a greater etching amount than a thickness of each mask layer applied to each other surface of the work piece determined to require a smaller etching amount; and
   etching away each applied mask layer using different etching amounts based on respective degrees of etching amounts of the applied mask layers and etching away the different surfaces of the work piece to form the work piece into a predetermined thickness,
   wherein after carrying out said etching away of each applied mask layer using different etching amounts based on respective degrees of etching amounts of the applied mask layers, uniformly etching virtually an entire portion of the work piece without the applied mask layers so as to make the entire portion of the work piece thinner.

2. The etching method according to claim 1, wherein when the different surfaces of the work piece are masked with mask layers having respectively different etching rates, said etching method further comprises subjecting the work piece to an etching process so that the etching amount on one surface of the work piece is made mutually different from the etching amount on another surface of the work piece in accordance with the degrees of the respective etching rates of the respective mask layers.

* * * * *